(12) United States Patent
Masumoto et al.

(10) Patent No.: US 9,812,058 B2
(45) Date of Patent: Nov. 7, 2017

(54) METHOD FOR MANUFACTURING LUMINESCENT PANEL, AGING DEVICE, AND DISPLAY DEVICE PROVIDED WITH LUMINESCENT PANEL

(71) Applicant: JOLED INC., Tokyo (JP)

(72) Inventors: Kenichi Masumoto, Hyogo (JP); Hiroyuki Yamakita, Osaka (JP); Hiroki Yamamoto, Kyoto (JP)

(73) Assignee: JOLED INC., Tokyo (JP)

( * ) Notice: Subject to any disclaimer, the term of this patent is extended or adjusted under 35 U.S.C. 154(b) by 296 days.

(21) Appl. No.: 14/387,325

(22) PCT Filed: Apr. 17, 2013

(86) PCT No.: PCT/JP2013/002608
§ 371 (c)(1),
(2) Date: Sep. 23, 2014

(87) PCT Pub. No.: WO2013/157262
PCT Pub. Date: Oct. 24, 2013

(65) Prior Publication Data
US 2015/0049127 A1    Feb. 19, 2015

(30) Foreign Application Priority Data

Apr. 20, 2012 (JP) ................. 2012-096776

(51) Int. Cl.
*G09G 3/32* (2016.01)
*H05B 33/10* (2006.01)
(Continued)

(52) U.S. Cl.
CPC ............. *G09G 3/32* (2013.01); *G09G 3/3225* (2013.01); *G09G 3/3233* (2013.01); *H01L 51/56* (2013.01);
(Continued)

(58) Field of Classification Search
CPC ..... G09G 2320/0233; G09G 2320/041; G09G 2320/045; G09G 2320/0626;
(Continued)

(56) References Cited

U.S. PATENT DOCUMENTS

2013/0051078 A1   2/2013   Kotera et al.
2014/0320042 A1  10/2014   Yamamoto et al.

FOREIGN PATENT DOCUMENTS

JP    60-244992    12/1985
JP    62-143395     6/1987
(Continued)

OTHER PUBLICATIONS

International Search Report (ISR) in International Patent Application No. PCT/JP2013/002608, dated Jul. 30, 2013.
(Continued)

*Primary Examiner* — Kenneth Bukowski
(74) *Attorney, Agent, or Firm* — Greenblum & Bernstein, P.L.C.

(57) ABSTRACT

The application discloses a method for manufacturing a luminescent panel including a luminescent area provided with emission pixels arranged in row and column directions. The manufacturing method includes a first step of dividing the luminescent area into segment areas so that each of the segment areas includes at least one of the emission pixels; a second step of selecting a part of the segment areas as a first area, and the segment areas adjacent to the first area in the row and column directions as second areas; and a third step of aging the emission pixel in the first area by energization to generate an aging area.

18 Claims, 38 Drawing Sheets

(51) Int. Cl.
  *H01L 51/56* (2006.01)
  *G09G 3/3225* (2016.01)
  *G09G 3/3233* (2016.01)
  *H01L 27/32* (2006.01)

(52) U.S. Cl.
  CPC ..... *H05B 33/10* (2013.01); *G09G 2320/0233* (2013.01); *G09G 2320/041* (2013.01); *G09G 2320/045* (2013.01); *G09G 2320/0626* (2013.01); *G09G 2330/028* (2013.01); *H01L 27/32* (2013.01); *H01L 2251/562* (2013.01)

(58) Field of Classification Search
  CPC .. G09G 2330/028; G09G 3/32; G09G 3/3225; G09G 3/3233; H01L 2251/562; H01L 27/32; H01L 51/56; H05B 33/10
  See application file for complete search history.

(56) References Cited

FOREIGN PATENT DOCUMENTS

| | | |
|---|---|---|
| JP | 2003-323979 | 11/2003 |
| JP | 2005-352147 | 12/2005 |
| JP | 2008-041297 | 2/2008 |
| JP | 2009-187860 | 8/2009 |
| JP | 2009-251028 | 10/2009 |
| JP | 2012-048934 | 3/2012 |

OTHER PUBLICATIONS

Office Action from Japan Patent Office (JPO) in Japanese Patent Appl. No. 2014-511110, dated Jan. 10, 2017.

(RANDOM SELECTION FOR FIRST AREAS)

FIG. 22

| D1 FIRST AREA | D2 SECOND AREA | D3 | D4 | D5 | D6 | D7 | D8 | D9 | D10 |
|---|---|---|---|---|---|---|---|---|---|
| D11 SECOND AREA | D12 FIRST AREA | D13 SECOND AREA | D14 | D15 | D16 | D17 | D18 | D19 | D20 |
| D21 | D22 SECOND AREA | D23 FIRST AREA | D24 SECOND AREA | D25 | D26 | D27 | D28 | D29 | D30 |
| D31 | D32 | D33 SECOND AREA | D34 FIRST AREA | D35 SECOND AREA | D36 | D37 | D38 | D39 | D40 |
| D41 | D42 | D43 | D44 SECOND AREA | D45 FIRST AREA | D46 SECOND AREA | D47 | D48 | D49 | D50 |
| D51 | D52 | D53 | D54 | D55 SECOND AREA | D56 FIRST AREA | D57 SECOND AREA | D58 | D59 | D60 |
| D61 | D62 | D63 | D64 | D65 | D66 SECOND AREA | D67 FIRST AREA | D68 SECOND AREA | D69 | D70 |
| D71 | D72 | D73 | D74 | D75 | D76 | D77 SECOND AREA | D78 FIRST AREA | D79 SECOND AREA | D80 |
| D81 | D82 | D83 | D84 | D85 | D86 | D87 | D88 SECOND AREA | D89 FIRST AREA | D90 SECOND AREA |
| D91 | D92 | D93 | D94 | D95 | D96 | D97 | D98 | D99 SECOND AREA | D100 FIRST AREA |

FIG. 35

| | | | | | | |
|---|---|---|---|---|---|---|
| (D11) TD11 AR11 | (D12) TD12 AR12 | (D13) TD13 AR13 | (D14) TD14 AR14 | (D15) TD15 AR15 | (D16) TD16 AR16 | |
| (D21) TD21 AR21 | (D22) TD22 AR22 | (D23) TD23 AR23 | (D24) TD24 AR24 | (D25) TD25 AR25 | (D26) TD26 AR26 | |
| (D31) TD31 AR31 | (D32) TD32 AR32 | (D33) TD33 AR33 | (D34) TD34 AR34 | (D35) TD35 AR35 | (D36) TD36 AR36 | |
| (D41) TD41 AR41 | (D42) TD42 AR42 | (D43) TD43 AR43 | (D44) TD44 AR44 | (D45) TD45 AR45 | (D46) TD46 AR46 | |
| (D51) TD51 AR51 | (D52) TD52 AR52 | (D53) TD53 AR53 | (D54) TD54 AR54 | (D55) TD55 AR55 | (D56) TD56 AR56 | |
| (D61) TD61 AR61 | (D62) TD62 AR62 | (D63) TD63 AR63 | (D64) TD64 AR64 | (D65) TD65 AR65 | (D66) TD66 AR66 | |
| (D71) TD71 AR71 | (D72) TD72 AR72 | (D73) TD73 AR73 | (D74) TD74 AR74 | (D75) TD75 AR75 | (D76) TD76 AR76 | |

| PANEL SURFACE TEMPERATURE | AGING RATE |
|---|---|
| 25°C (REFERENCE) | NOT APPLICABLE |
| 35°C (+10°C) | 5% |
| 50°C (+25°C) | 14% |
| 70°C (+50°C) | 32% |

# METHOD FOR MANUFACTURING LUMINESCENT PANEL, AGING DEVICE, AND DISPLAY DEVICE PROVIDED WITH LUMINESCENT PANEL

TECHNICAL FIELD

The present invention relates to a method for manufacturing a luminescent panel, an aging device and a display device provided with the luminescent panel.

BACKGROUND ART

Various devices provided with a luminescent panel configured to emit image light have been developed. Luminance of emission elements provided in the luminescent panel decreases with time under a temperature rise of the luminescent panel. The decrease in the luminance of the emission elements is noticeable at the beginning of usage of the luminescent panel. It is known that an aging process for aging emission elements in advance prevents the decrease in the luminance of the emission elements.

Light emission over the entire surface of a luminescent panel is performed at once during the aging process. However, a temperature variation in the plane of the luminescent panel is caused by the aging process with the light emission over the entire surface at once. Emission elements are likely to be susceptible to heat. The temperature variation may cause a life variation among the emission elements. Consequently, a luminance variation may appear on the luminescent panel. An aging process without processing the entire surface at once is proposed (c.f. Patent Documents 1 to 3).

The aforementioned aging process does not sufficiently suppress a temperature variation on a luminescent panel. A luminance variation is likely to happen to a resultant luminescent panel, which may not display images with uniform quality for a long period of time. In short, the luminescent panel has low reliability.

Patent Document 1: JP 2009-187860 A
Patent Document 2: JP S62-143395 A
Patent Document 3: JP S60-244992 A

SUMMARY OF INVENTION

An object of the invention is to provide techniques for suppressing a temperature variation on a luminescent panel during an aging process.

A method for manufacturing a luminescent panel according to one aspect of the invention is used for manufacturing a luminescent panel including a luminescent area provided with emission pixels arranged in the row and column directions. The method for manufacturing a luminescent panel includes a first step of dividing the luminescent area into segment areas so that each of the segment areas includes at least one of the emission pixels; a second step of selecting a part of the segment areas as a first area, and the segment areas adjacent to the first area in the row and column directions as second areas; and a third step of aging the emission pixel in the first area by energization to generate an aging area.

An aging device according to another aspect of the invention is used for aging a luminescent panel including a luminescent area provided with emission pixels arranged in the row and column directions. The aging device includes: a storage portion which stores emission pattern data including segmentation data for dividing the luminescent area into segment areas and the area designation data for designating a part of the segment areas as a first area, and the segment areas adjacent to the first area in the row and column directions as second areas; and a signal generator which generates a control signal for the emission pixels based on the emission pattern data.

A display device according to yet another aspect of the invention includes the luminescent panel obtained by the aforementioned manufacturing method. The display device includes an emission element; a power supply which supplies electric power to the emission element; a pixel circuit provided on a power supply path between the emission element and the power supply for flowing current to the emission element in response to a received luminance signal; and a controller which outputs the luminance signal to the pixel circuit to selectively operate the emission element in an aging mode for aging the emission element or an image display mode for displaying an image with use of the emission element. A power supply voltage to be output from the power supply is identical between the aging mode and the image display mode. The controller sets luminance of the emission element indicated by the luminance signal in the aging mode so that the luminance of the emission element in the aging mode is larger than a maximum luminance in the image display mode.

The aforementioned techniques may suppress a temperature variation on the luminescent panel due to the aging process. With the aforementioned techniques, performance of emission elements is less likely to degrade. In short, a luminance variation is less likely to appear on the luminescent panel. Therefore, the luminescent panel and the display device may maintain uniform image quality for a long period of time. Accordingly, the luminescent panel and the display device become very reliable.

These and other objects, features and advantages of the present invention will become more apparent upon reading the following detailed description along with the accompanying drawings.

BRIEF DESCRIPTION OF DRAWINGS

FIG. 22 is a schematic plan view of a luminescent area, in which first areas and second areas designated by area designation data are shown;

FIG. 35 is a schematic view of a luminescent area including the segment areas shown in FIG. 33;

FIG. 36 is a schematic table of an aging condition to be used in the aging condition setting step shown in FIG. 34;

DESCRIPTION OF EMBODIMENTS

Figure 1:
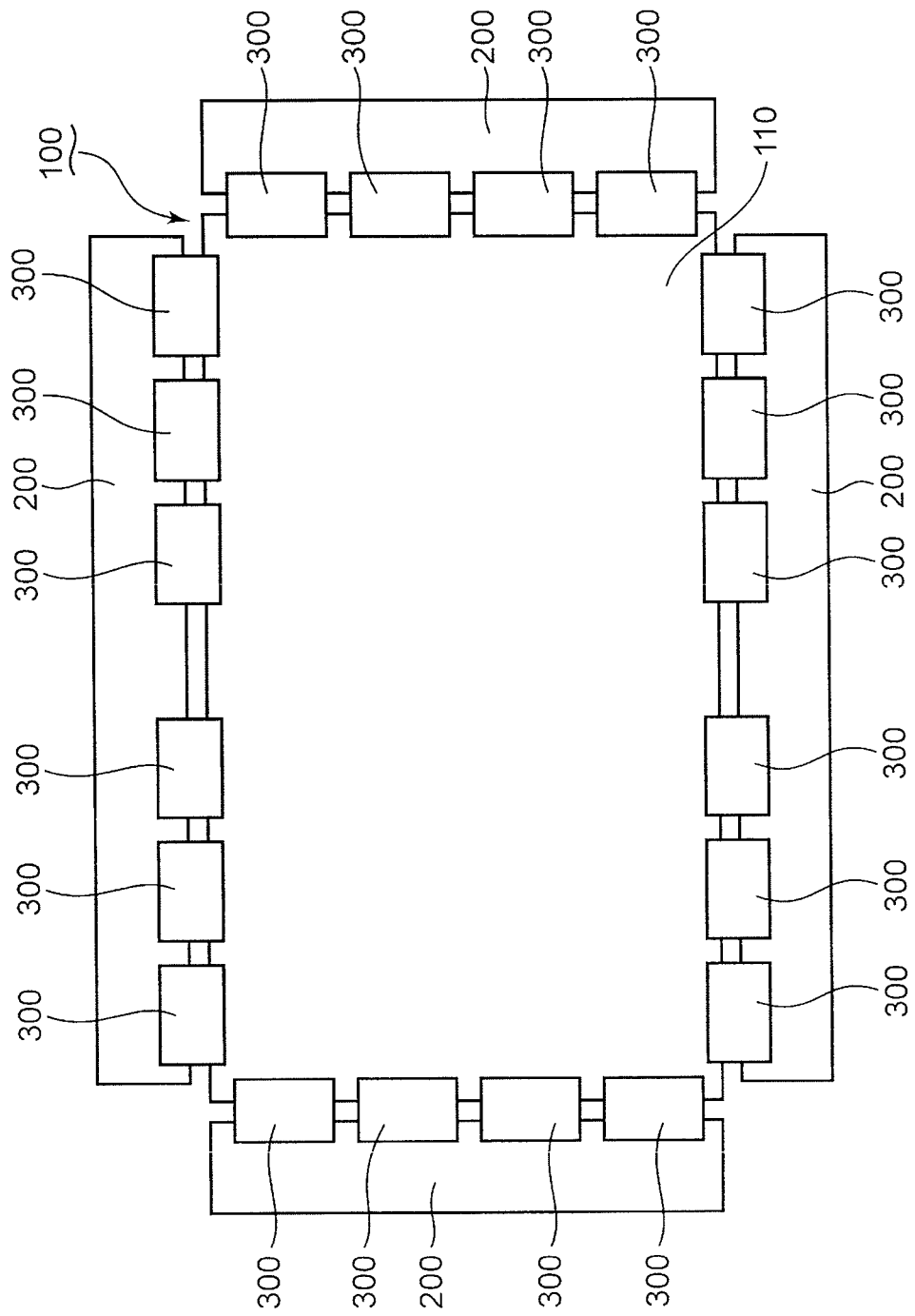
FIG. 1 is a schematic plan view of a luminescent panel connected to circuit boards.

Various aging techniques for a luminescent panel are described with reference to the drawings. The following exemplary aging techniques contribute to a reduction in a temperature variation which may appear on a luminescent panel. In the following embodiments, similar or identical components are indicated with the same reference signs. To clarify the description, repetitive descriptions on the same components are omitted, as appropriate. Configurations, arrangements or shapes shown in the drawings, and descriptions about the drawings are provided for making principles of the aging techniques easily understood. The principles of the aging technique are not limited to them.

<First Embodiment>

(Problems Involved in Aging Process)

Figure 2:
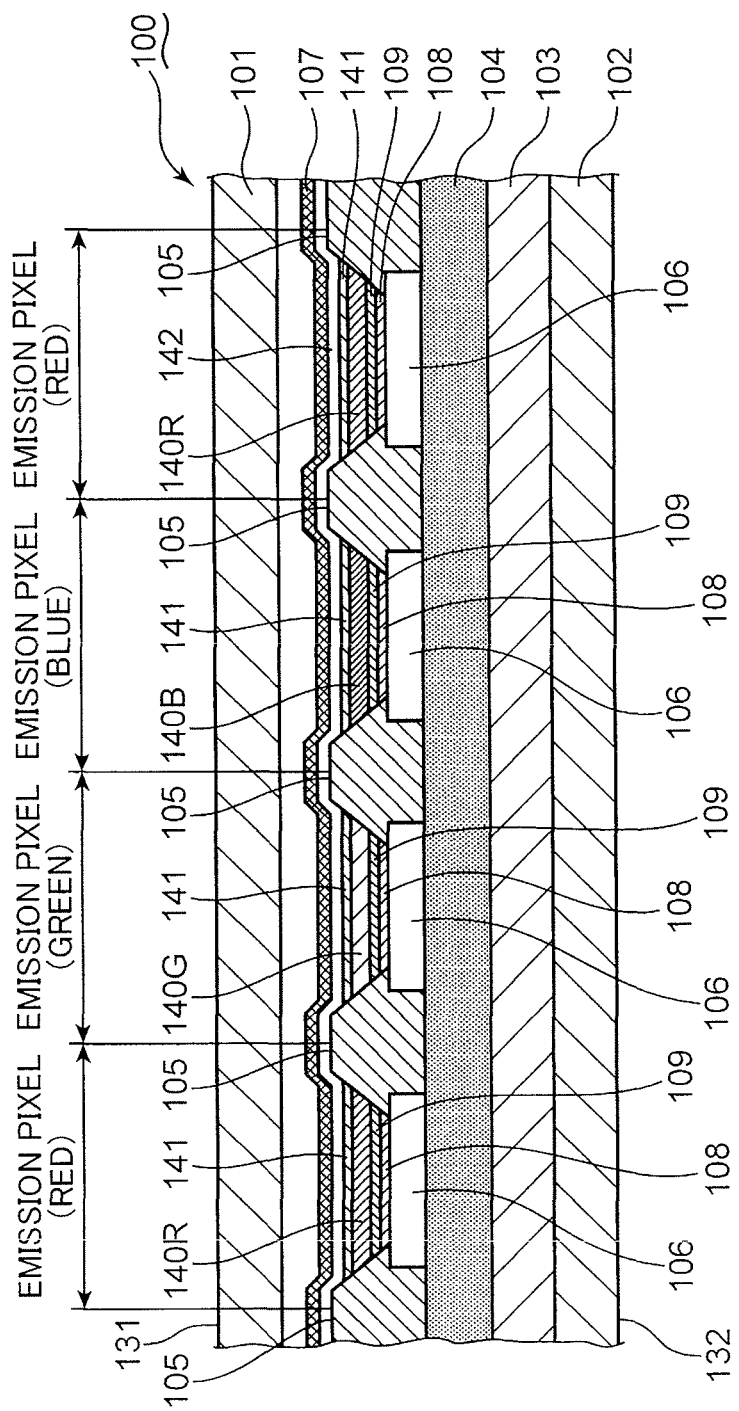
FIG. 2 is a schematic partial sectional view of the luminescent panel.

FIG. 1 is a schematic plan view of a luminescent panel 100 connected to circuit boards 200. FIG. 2 is a schematic partial sectional view of the luminescent panel 100. The luminescent panel 100 is described with reference to FIGS. 1 and 2.

As shown in FIG. 1, the substantially rectangular luminescent panel 100 is electrically connected to the circuit boards 200 situated along the four edges of the luminescent panel 100 by flexile substrates 300. The luminescent panel 100 includes emission pixels arranged in a matrix pattern to define a substantially rectangular luminescent area 110.

As shown in FIG. 2, the luminescent panel 100 includes a first substrate 101, which defines a display surface 131 to display images, and a second substrate 102 facing the first substrate 101. The second substrate 102 defines a back surface 132 opposite to the display surface 131. Various elements (to be described later) for displaying images are situated between the first and second substrates 101, 102.

The luminescent panel 100 includes a TFT substrate 103 formed on the second substrate 102, a flattening layer 104 for flattening the TFT substrate 103, and banks 105 formed on the flattening layer 104. The banks 105 define contours of emission pixels to emit light with a red hue (in FIG. 2, indicated as "emission pixel (RED)"), emission pixels to emit light with a green hue (in FIG. 2, indicated as "emission pixel (GREEN)"), and emission pixels to emit light with a blue hue (in FIG. 2, indicated as "emission pixel (BLUE)").

The luminescent panel 100 further includes reflective anodes 106, each of which is arranged in correspondence to each of the emission pixels, and a transparent cathode 107 extending in a direction substantially orthogonal to the reflective anodes 106. The reflective anodes 106 between the banks 105 are formed on the flattening layer 104. The transparent substrate 107 is formed between the first substrate 101 and the banks 105. When a drive signal is output from the circuit board 200, a voltage is applied between the reflective anode 106 and the transparent cathode 107.

The luminescent panel 100 further includes a positive hole injection layer 108 laminated on the reflective anodes 106, and a positive hole carrier layer 109 laminated on the positive hole injection layer 108. The luminescent panel 100 further includes emission layers 140R formed in correspondence to the emission pixels which emit light with a red hue, emission layers 140G formed in correspondence to the emission pixels which emit light with a green hue, and emission layers 140B formed in correspondence to the emission pixels which emit light with a blue hue. Each of the emission layers 140R, 140G, 140B is formed on the positive hole carrier layer 109.

Current flows through the emission layer 140R, 140G, 140B under a voltage application between the reflective anode 106 and the transparent cathode 107. Each of the emission layers 140R, 140G, 140B is formed of emission elements which emit light in response to the current flow. For example, the emission elements may be organic EL elements. The emission layers 140R emit light with a red hue in response to the current flow. The emission layers 140G emit light with a green hue in response to the current flow. The emission layers 140B emit light with a blue hue in response to the current flow. In the embodiment, the emission layers 140R, 140G, 140B are exemplified as the emission elements which emit light with hues different from each other.

In the embodiment, the term "energize" means that current flows through the emission layer 140R, 140G, 140B under a voltage application between the reflective anode 106 and the transparent cathode 107. When an emission pixel is energized, an emission element corresponding to the emission pixel emits light.

The luminescent panel 100 includes an electron carrier layer 141 laminated on the emission layers 140R, 140G, 140B, and an electron injection layer 142 formed between the electron carrier layer 141 and the transparent cathode 107. The detailed structure of the luminescent panel 100 described with reference to FIG. 2 does not limit the principle of the embodiment. The principle of the embodiment may be appropriately applied to other luminescent panels which are subjected to an aging process.

The circuit board 200 generates drive signals for controlling light emission from the luminescent panel 100. The drive signals are input to the luminescent panel 100 through the flexible substrates 300. An emission pixel is energized in response to the drive signals. Consequently, the emission element emits light. As a result of the light emission, the emission element is aged. Alternatively, the circuit boards 200 may be three or less circuit boards arranged along at least one of the four edges of the luminescent panel 100. The circuit boards 200 may be situated on the back surface of the luminescent panel 100. The circuit boards 200 may be used dedicatedly for the aging process. Alternatively, the circuit boards 200 may be used for driving the luminescent panel 100 in response to image signals to display images, in addition to the aging process.

The circuit boards 200 may generate drive signals which cause light emission from all the emission pixels included in the luminescent area 110 so that light is emitted from the entire surface of the luminescent panel 100 during an aging process. Since light is emitted from the entire surface of the luminescent panel 100 due to the generation of the drive signals, the emission elements are heated.

Figure 3:
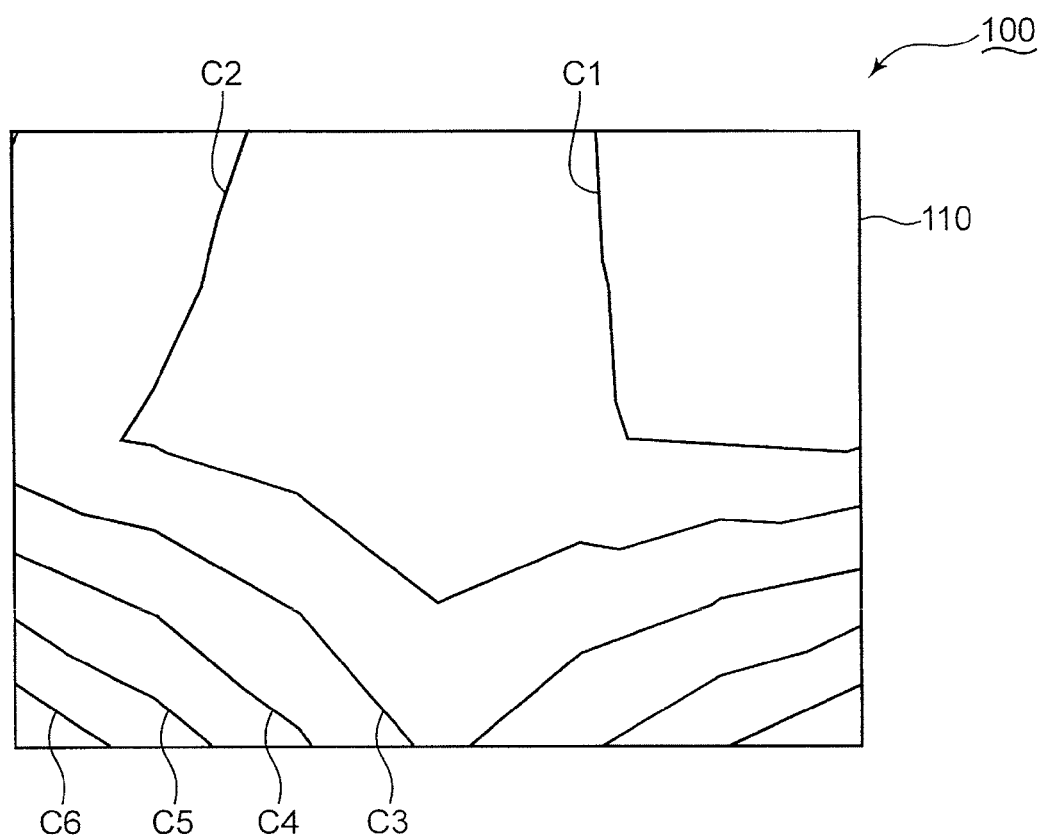
FIG. 3 is a schematic isothermal diagram showing a temperature distribution under light emission from the entire surface of the luminescent panel.

FIG. 3 is a schematic isothermal diagram showing a temperature distribution under light emission over the entire surface of the luminescent panel 100. The temperature distribution in the plane of the luminescent panel 100 under the light emission over the entire surface of the luminescent panel 100 is described with reference to FIG. 3.

As shown in FIG. 3, the emission elements are heated under uniform light emission with predetermined luminance (e.g. 60 cd/m$^2$) so that there are different regions in temperature within the plane of the luminescent panel 100. In the luminescent area 110 shown in FIG. 3, the different regions in temperature are distinguished from each other by isothermal lines C1 to C6.

The upper right region in the luminance area 110 isolated by the isothermal line C1 has the highest temperature in the luminescent area 110. The emission elements situated in the upper right region of the luminescent area 110 isolated by the isothermal line C1 are greatly degraded. On the other hand, the region defined by the isothermal lines C5. C6 or the lower left region in the luminescent area 110 isolated by the isothermal line C6 has a relatively low temperature in the luminescent area 110. Degradation of the emission elements in the region defined by the isothermal lines C5, C6 or in the lower left region of the luminescent area 110 isolated by the isothermal line C6 is small. In short, a temperature variation in the plane of the luminescent panel 100 causes a regional variation about a life of the emission elements.

(Findings about Aging Process)

Figure 4:
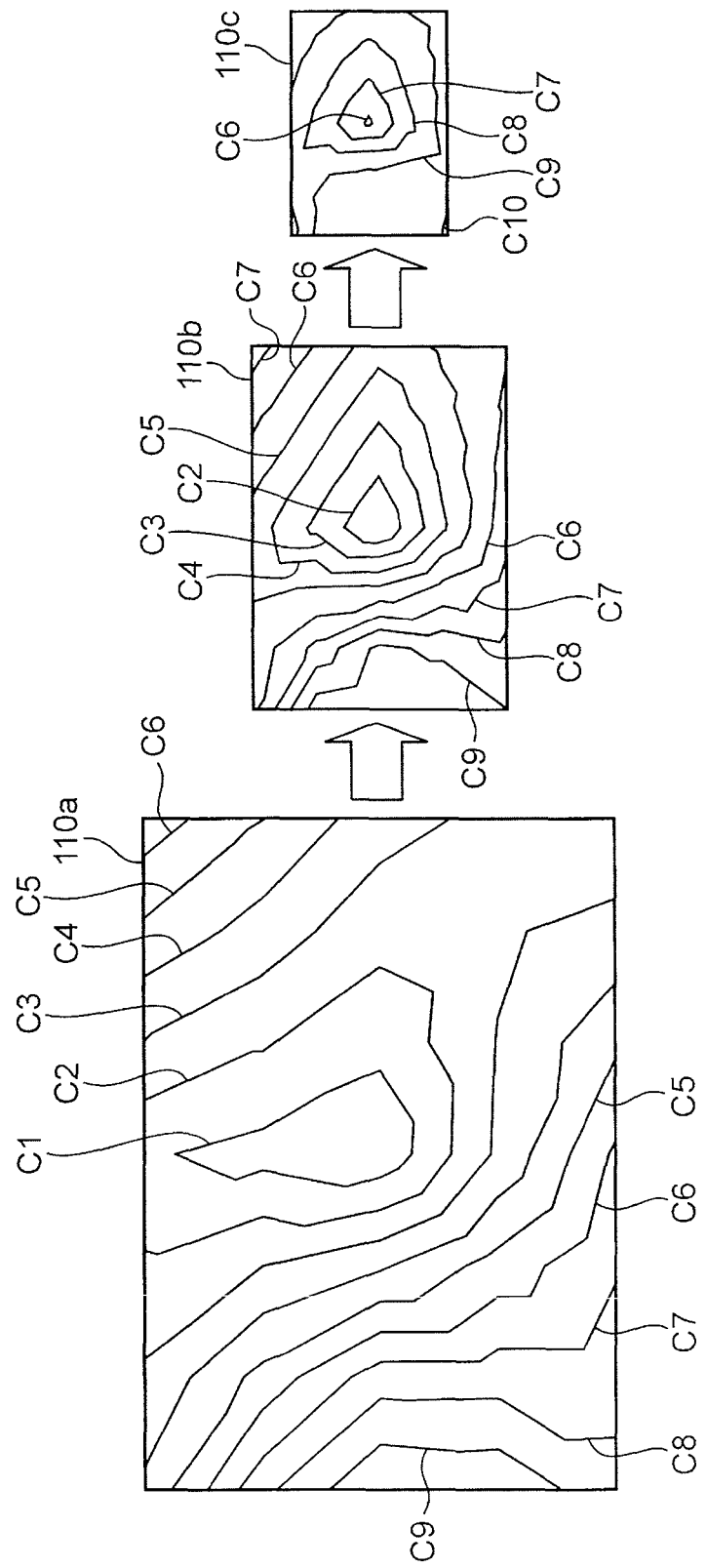
FIG. 4 is a schematic isothermal diagram showing a temperature distribution under light emission from a luminescent area with a change in an area size of the luminescent area.

FIG. 4 is a schematic isothermal diagram showing a temperature distribution under light emission from luminescent areas which are different in area size from each other. The findings about an aging process by the inventors are described with reference to FIG. 4.

FIG. 4 shows luminescent areas of which diagonal inch sizes are reduced step by step from the luminescent area 110 described with reference to FIG. 3. The leftmost luminescent area 110a in FIG. 4 has a diagonal inch size which is 0.7 times as long as a diagonal inch size of the luminescent area 110 described with reference to FIG. 3. The middle luminescent area 110b in FIG. 4 has a diagonal inch size which is 0.4 times as long as the diagonal inch size of the luminescent area 110 described with reference to FIG. 3. The rightmost luminescent area 110c in FIG. 4 has a diagonal inch size which is 0.1 times as long as the diagonal inch size of the luminescent area 110 described with reference to FIG. 3.

As shown in FIG. 4, if emission elements are heated under uniform light emission from the luminescent areas (the luminescent areas 110a, 110b, 110c) at the same luminance (e.g. 60 cd/m$^2$) as the luminescent panel 100 described with reference to FIG. 3, there are different regions in temperature within each of the luminescent areas (the luminescent areas 110a, 110b, 110c).

In the luminescent area 110a, there are different regions in temperature, which are distinguished from each other by the isothermal lines C1 to C6 described with reference to FIG. 3 and isothermal lines C7 to C9. The region surrounded by the isothermal line C1 has the highest temperature in the luminescent area 110a. The left end region in the luminescent area 110a, which is isolated by the isothermal line C9, has the lowest temperature in the luminescent area 110a. A area ratio of the region surrounded by the isothermal line C1 is small, as compared with the luminescent area 110 described with reference to FIG. 3. In short, in the luminescent area 110a, there is a small area ratio of a region including emission elements which may be greatly degraded. On the other hand, as described with reference to FIG. 3, the region defined by the isothermal lines C5, C6, and the lower left region and the upper right region in the luminescent area 110a isolated by the isothermal line C6 have a relatively low temperature in the luminescent area 110a. There is small degradation of emission elements in the region defined by the isothermal lines C5, C6, and in the lower left region and the upper right region in the luminescent area 110*a* isolated by the isothermal line C6. As compared with the luminescent area 110 described with reference to FIG. 3, there are a large area ratio of the region defined by the isothermal lines C5, C6 in the luminescent area 110*a* and a large area ratio of the lower left region and the upper right region in the luminescent area 110*a* isolated by the isothermal line C6. In short, with respect to a region in which degradation is less likely to happen to emission elements, the luminescent area 110*a* has a larger area ratio than the luminescent area 110 described with reference to FIG. 3. Since the luminescent area 110*a* has a smaller temperature variation than the luminescent area 110 described with reference to FIG. 3 does, there is a small life variation among the emission elements.

In the luminescent area 110*b*, there are different regions in temperature which are distinguished from each other by the isothermal lines C2 to C9. The region surrounded by the isothermal line C2 has a relatively high temperature in the luminescent area 110*b*. The left end region in the luminescent area 110*b* isolated by the isothermal line C9 has the lowest temperature in the luminescent area 110*b*. In the luminescent area 110*b*, there is no region surrounded by the isothermal line C1. In short, in the luminescent area 110*b*, there is no region in which emission elements are severely degraded. In comparison between the luminescent area 110 described with reference to FIG. 3 and the luminescent area 110*a* described with reference to FIG. 4, there are large area ratios of the region defined by the isothermal lines C5, C6 and the left end region in the luminescent area 110 isolated by the isothermal line C6. Since there is a small temperature variation in the plane of the luminescent area 110*b* in comparison between the luminescent area 110 described with reference to FIG. 3 and the luminescent area 110*a* described with reference to FIG. 4, a life variation among the emission elements is effectively reduced.

In the luminescent area 110*c*, there are different regions in temperature which are distinguished from each other by the isothermal lines C6 to C9, and another isothermal line C10. The region surrounded by the isothermal line C6 has a relatively high temperature in the luminescent area 110*c*. The lower left region in the luminescent area 110*c* isolated by the isothermal line C10 has the lowest temperature in the luminescent area 110*c*. In the luminescent area 110*c*, there is no region surrounded by the isothermal line C5. In short, the luminescent area 110*c* is constituted of the region surrounded by the isothermal line C6, and the region outside the isothermal line C6. Accordingly, little degradation happens to the emission elements. In comparison among the luminescent area 110 described with reference to FIG. 3, the luminescent areas 110*a*, 110*b*, 110*c* described with reference to FIG. 4, there is the smallest temperature variation in the plane of the luminescent area 110*c*. Accordingly, a life variation among the emission elements in the luminescent area 110*c* is effectively reduced.

Figure 5:
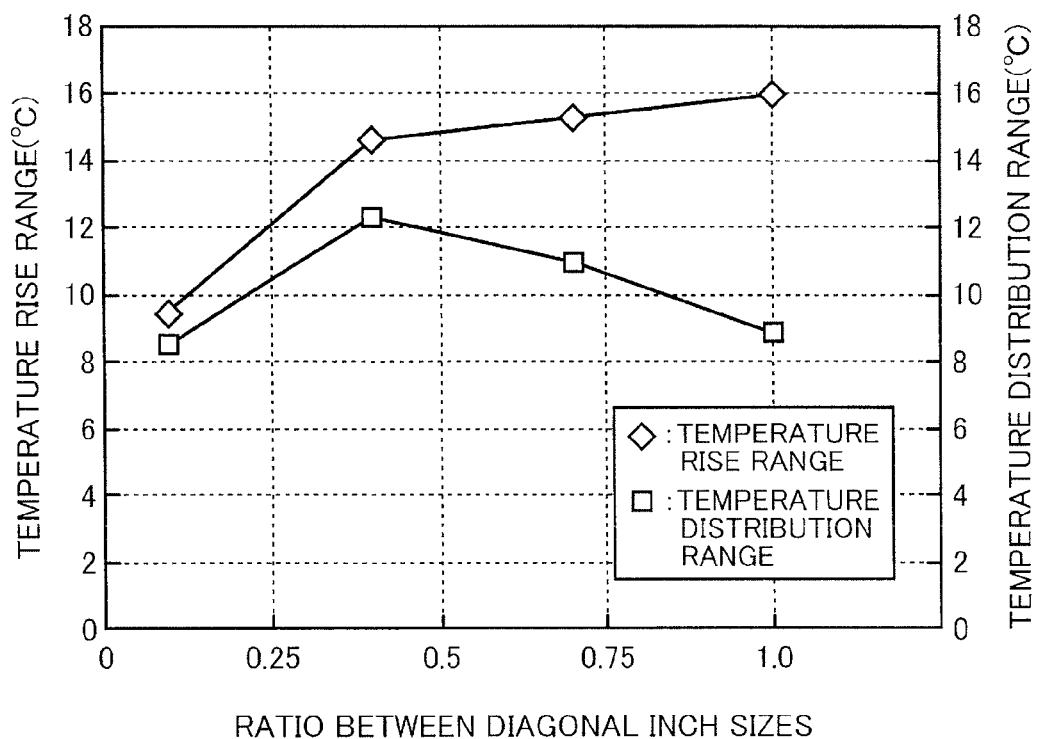
FIG. 5 is a schematic graph showing a relationship among a ratio of a diagonal inch size of a luminescent area, a temperature rise range and a temperature distribution range.

FIG. 5 is a schematic graph showing a relationship among a ratio between the diagonal inch sizes of the luminescent areas, a temperature rise range and a temperature distribution range. The relationship among area sizes of the luminescent areas in FIGS. 3 and 4 (the luminescent areas 110, 110*a*, 110*b*, 110*c*), a temperature rise range and a temperature distribution range under light emission from each of the luminescent areas is described with reference to FIG. 5. In FIG. 5, the area size of the luminescent area is indicated by a ratio between diagonal inch sizes of the luminescent areas. Alternatively, the area size of the luminescent area may be indicated by an area ratio between the luminescent areas or by a ratio between the side lengths of the luminescent areas.

In FIG. 5, the horizontal axis indicates the ratio between diagonal inch sizes of the luminescent areas. The vertical axis indicates the temperature rise range (° C.) and the temperature distribution range (° C.). The temperature rise range is indicated as a value obtained by subtracting a reference temperature (e.g. 24.5° C.) from the highest temperature in the luminescent area during the light emission. The temperature distribution range is indicated as a value obtained by subtracting the lowest temperature from the highest temperature in the luminescent area during the light emission. The aforementioned indications about the temperature rise range and the temperature distribution range do not limit the principle of the embodiment.

As shown in FIGS. 4 and 5, as the diagonal inch size of the luminescent area decreases step by step, both of the highest and lowest temperatures of the luminescent area during the light emission go down. Consequently, both of the temperature rise range and the temperature distribution range of the luminescent area are narrowed. As shown by the luminescent area 110*c* described with reference to FIG. 4, if the diagonal inch size of the luminescent area is set to be 0.1 times as long as the diagonal inch size of the luminescent panel (i.e. the surface area of the luminescent area is one-hundredth of the surface area of the luminescent panel), the highest temperature in the luminescent area during the light emission is very decreased. Accordingly, little degradation happens to the emission elements. If a small luminescent area is set in the luminescent panel, both of heat generation from the emission elements and a temperature variation in the plane of the luminescent panel become small during an aging process. Consequently, the resultant luminescent panel is less likely to cause a luminescent variation so that uniform image quality may be maintained for a long period of time. Therefore, the luminescent panel becomes very reliable.

A method for manufacturing the luminescent panel 100 and an aging device 400 according to the following embodiments appropriately solve the problems about generation of a luminance variation on a luminescent panel on the basis of the aforementioned findings.

(Method for Manufacturing Luminescent Panel)

Figure 6:
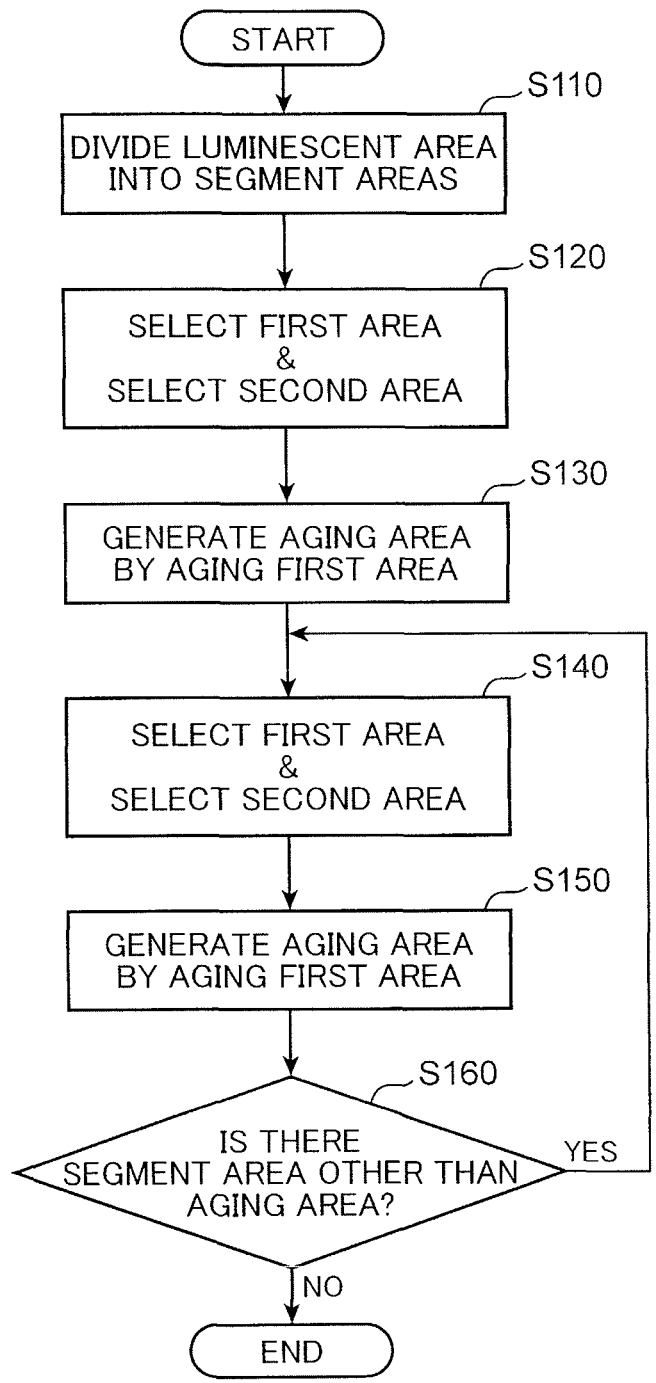
FIG. 6 is a schematic flowchart of a method for manufacturing the luminescent panel.

FIG. 6 is a schematic flowchart of a method for manufacturing the luminescent panel 100 according to the present embodiment. The method for manufacturing the luminescent panel 100 is described with reference to FIG. 6.

(Step S110)

In Step S110, the luminescent area of the luminescent panel is divided into segment areas. The luminescent area is divided so that each of the segment areas includes at least one emission element. The method for dividing the luminescent area is described later. After the luminescent area is divided into segment areas, Step S120 is performed. In the embodiment, Step S110 is exemplified as the first step of dividing a luminescent area into segment areas.

(Step S120)

In Step S120, a part of segment areas is selected as a first area. Segment areas adjacent to the first area in the row and column directions are selected as second areas. A method for selecting the first and second areas is described later. After the first and second areas are appropriately selected. Step S130 is performed. In the embodiment, Step S120 is exemplified as the second step of selecting a part of the segment areas as a first area and the segment areas adjacent to the first area in the row and column directions as the second areas.

(Step S130)

In Step S130, the emission pixel included in the first area is energized. Consequently, the energized emission pixel is subjected to an aging process. In the following description, an area of the emission pixel subjected to the aging process is called as "aging area". The aging process is described later. After the aging area is formed by the aging process for the first area, Step S140 is performed. In the embodiment, Step S130 is exemplified as the third step of aging the emission pixel in the first area by energization to generate an aging area.

(Step S140)

In Step S140, at least a part of the segment areas other than the aging area is selected as the first area. In addition, segment areas adjacent to the first area in the row and column directions are selected as the second areas. A method for selecting the first and second areas is described later. After the first area is appropriately selected, Step S150 is performed. In the embodiment, Step S140 is exemplified as the fourth step of selecting a part of the segment areas other than the aging area as the first area, and segment areas adjacent to the first area in the row and column directions as second areas.

(Step S150)

In Step S150, the emission pixel included in the first area is energized. Consequently, a new aging area is generated. The aging process is performed under the aging condition described in the context of Step S130. After the first area is appropriately aged to newly generate an aging area, Step S160 is performed. In the embodiment, Step S150 is exemplified as the fifth step of aging the emission pixel included in the first area by energization to newly generate an aging area.

(Step S160)

In Step S160, it is determined whether there is a segment area other than the aging area. If it is determined that there is no segment area which has not been subjected to the aging process in the luminescent area, the aging process is finished. If it is determined that there is a segment area which has not been subjected to an aging process in the luminescent area, Step S140 is performed again. In Step S140 to be performed again, new first and second areas are selected. A method for selecting the new first and second areas is described later. After the newly selected first area is appropriately aged, Step S160 is performed again. Since Step S160 defines absence of segment areas other than the aging area as the ending condition, Step S140 to Step S160 are repeatedly performed until there is no segment area which has not been subjected to the aging process in the luminescent area.

(Method for Dividing Luminescent Area)

Figure 7:
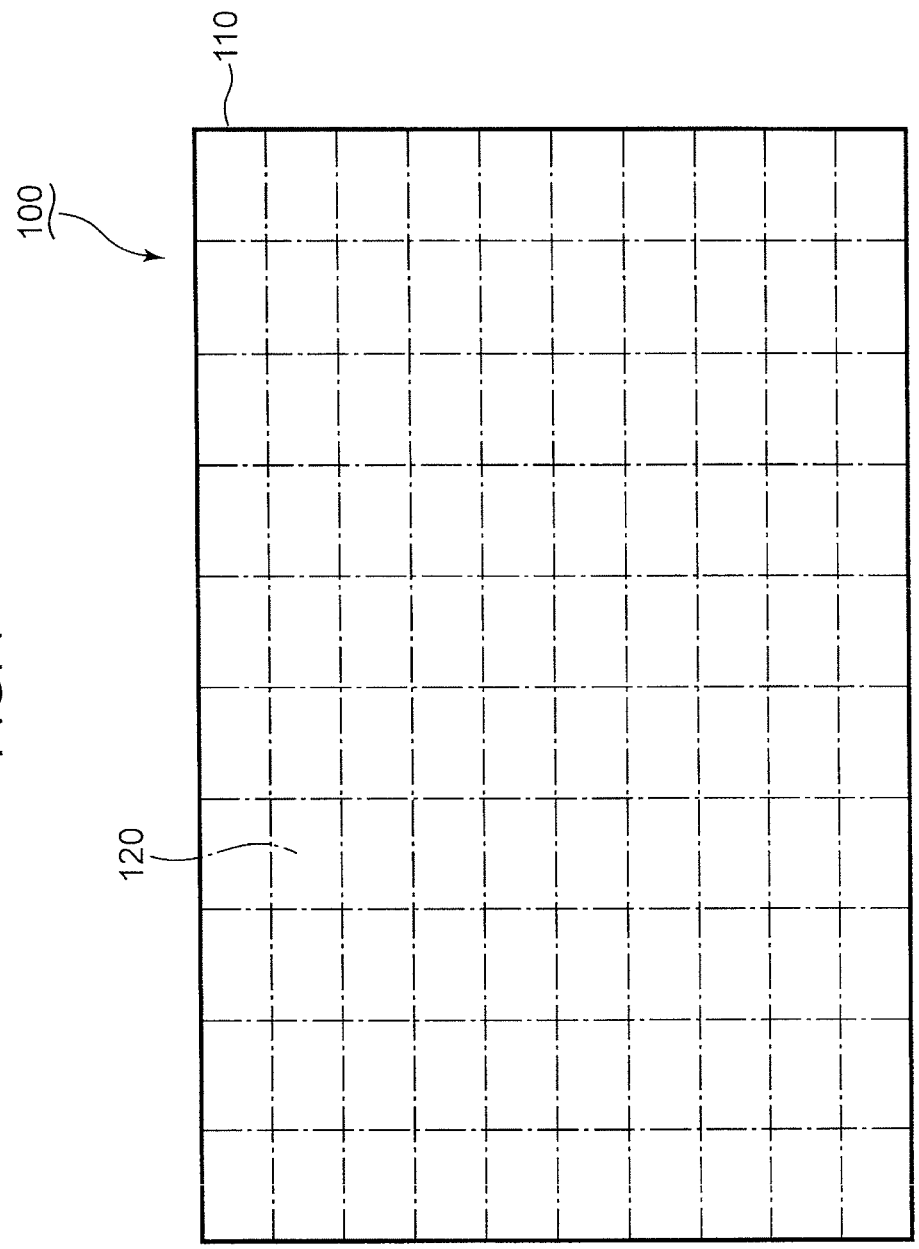
FIG. 7 is a schematic plan view of the luminescent panel including a luminescent area provided with segment areas.

FIG. 7 is a schematic plan view of the luminescent panel 100 including the luminescent area 110 provided with the segment areas 120. An exemplary method for dividing the luminescent area 110, and the exemplary luminescent panel 100 including the luminescent area 110 divided into the segment areas 120 are described with reference to FIG. 7.

As shown in FIG. 7, the substantially rectangular luminescent area 110 is divided into the rectangular segment areas 120 so that ten segment areas 120 are aligned in the row direction, and ten segment areas 120 are aligned in the column direction. Each segment area is indicated as a rectangle of one-dotted chain line. Alternatively, the number of segment areas 120 in the row and column directions may not be smaller than two but smaller than ten, or may be larger than ten. The segment areas 120 may be geometrically identical to each other.

In the embodiment, the segmentation of the luminescent area 110 into the segment areas 120 depends on the number of emission pixels included in the luminescent area 110. The luminescent area 110 is divided so that each of the segment areas 120 includes at least one emission pixel. If each of the segment areas 120 includes at least one emission pixel, the at least one emission pixel is aged by energization toward the at least one emission pixel in the segment area subjected to the aging process. Alternatively, if the luminescent area 110 includes M rows and N columns (where M, N is a positive integer of 2 or larger) of emission pixels arranged in a matrix pattern, the luminescent area 110 may be divided into the segment areas 120, each of which includes m rows and n columns (where m is a divisor of M, and n is a divisor of N) of emission pixels. Thus, each of the segment areas 120 includes m×n emission pixels. In this case, the segment areas 120 may be geometrically identical to each other. If the luminescent area 110 is divided into the segment areas 120 having the identical shape, all the segment areas 120 in the luminescent area 110 are substantially uniformly aged under a predetermined aging condition. Accordingly, a life variation among the emission elements is reduced.

If M, N, m and n satisfy the condition expressed by the following formula, each of the segment areas 120 has a similar shape to the luminescent area 110.

$$M/m = N/n \qquad \text{[Formula 1]}$$

When the segment area 120 has a similar shape to the luminescent area 110, the number of the segment areas 120 aligned in the row direction is identical to the number of the segment areas 120 aligned in the column direction. When the segment areas 120 in the row direction are as many as the segment areas 120 in the column direction, it becomes easy to create an emission pattern under a predetermined rule in the aging process. Therefore, the aging process becomes efficient. As compared with the result about the temperature variation in the luminescent area 110 under light emission from the entire surface of the luminescent area 110, it becomes easy to predict a tendency of a temperature variation on a segment area 120 if the segment area 120 is geometrically similar to the luminescent area 110. This makes it easy to create an efficient aging pattern.

If the condition expressed by the aforementioned formula is satisfied and if M, N, m and n satisfy the condition expressed by the following formulas 2 and 3, each of the segment areas 120 is 0.01 times (one-hundredth) as large as the luminescent area 110. In addition, each of the segment areas 120 has a similar shape to the luminescent area 110.

$$m = M/10 \qquad \text{[Formula 2]}$$

$$n = N/10 \qquad \text{[Formula 3]}$$

If the segment area 120 has a similar shape to the luminescent area 110 and if each of the segment areas 120 is one-hundredth as large as the luminescent area 110, both of the temperature rise range and the temperature distribution range of each of the segment areas 120 during the aging process are very narrowed, as described with reference to FIGS. 3 to 5. Accordingly, a life variation among the emission elements is greatly reduced.

Figure 8:
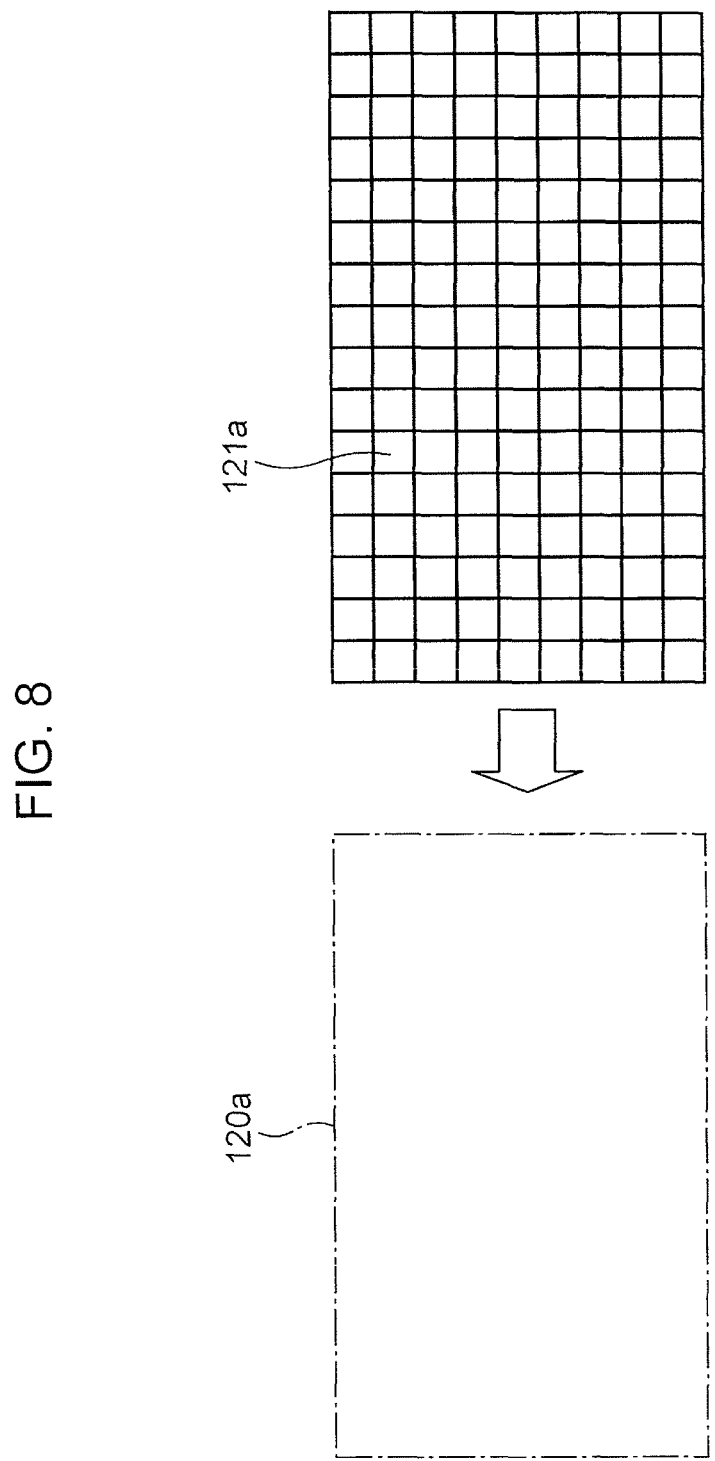
FIG. 8 is a schematic plan view showing one of the segment areas depicted in FIG. 7 and emission pixels included in the one of the segment areas.

FIG. 8 is a schematic plan view showing one segment area 120a among the segment areas 120 depicted in FIG. 7 and emission pixels 121a included in the one segment area 120a. The exemplary luminescent panel 100 provided with the luminescent area 110 configured so that each of the segment areas 120 includes the emission pixels 121a is described with reference to FIGS. 7 and 8.

As shown in FIG. 8, the rectangular emission pixels 121*a* are arranged in a matrix pattern in each of the segment areas 120, so that sixteen emission pixels 121*a* are arranged in the row direction whereas nine emission pixels 121*a* are arranged in the column direction. Each of the emission pixels 121*a* is indicated as a rectangle of solid line. Alternatively, the segment area 120 may include no less than two but no more than sixteen of the emission pixels 121 or more than sixteen of the emission pixels 121 in the row direction. The segment area 120 may include no less than two but no more than nine of the emission pixels 121*a* or more than nine of the emission pixels 121*a* in the column direction.

Figure 9:
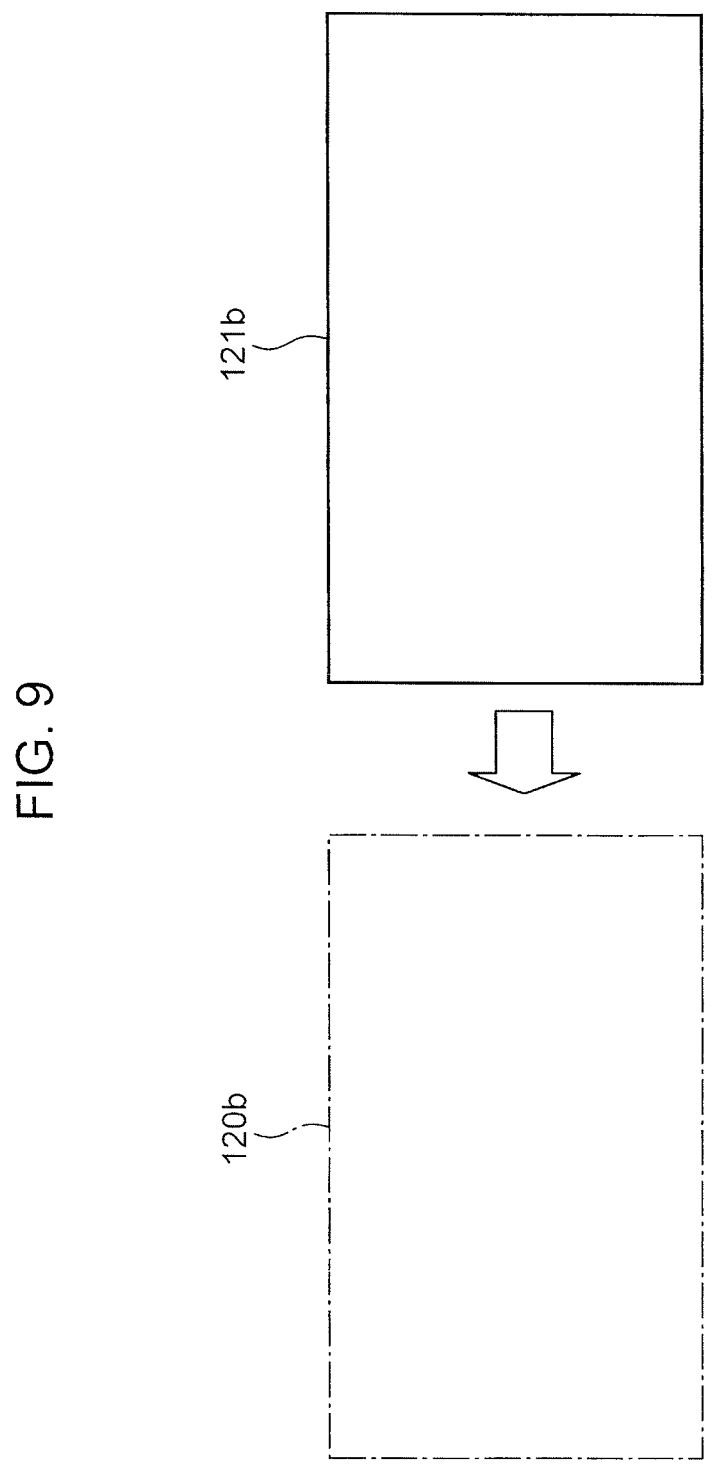
FIG. 9 is a schematic plan view showing one of the segment areas depicted in FIG. 7 and one emission pixel included in the one segment area.

FIG. 9 is a schematic plan view showing one segment area 120*b* among the segment areas 120 depicted in FIG. 7 and one emission pixel 121*b* included in the one segment area 120*b*. The exemplary segment area 120*b* including one emission pixel 121*b* is described with reference to FIG. 9.

As shown in FIG. 9, each of the segment areas 120*b* includes one emission pixel 121*b* in the row direction (m=1) and in the column direction (n=1). When each of the segment areas 120*b* includes one emission element 121*b*, there is a small temperature rise of the luminescent area 110 resulting from heat generation in the emission element. Accordingly, both of the temperature rise range and the temperature distribution range of each of the segment areas 120*b* are significantly narrowed during the aging process. Therefore, a life variation among the emission elements is very small.

(Method for Selecting First and Second Areas in Step S120)

Figure 10:
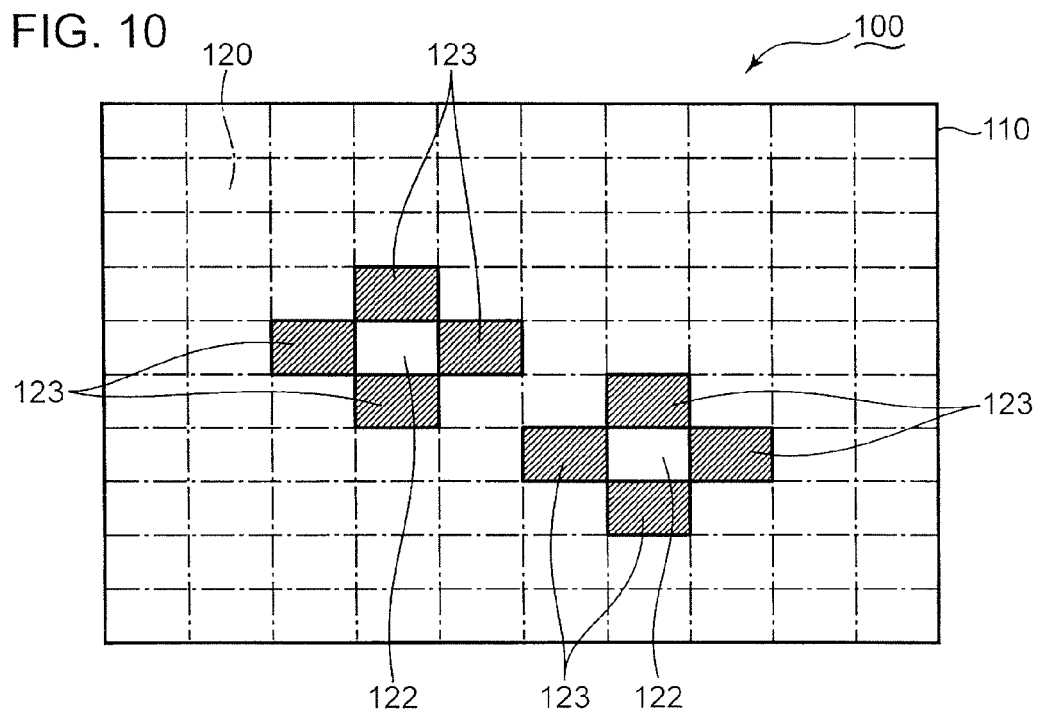
FIG. 10 is a schematic plan view of the luminescent panel provided with a luminescent area, in which first and second areas are selected.

FIG. 10 is a schematic plan view of the luminescent panel 100 provided with the luminescent area 110, in which the first and second areas 122, 123 are selected. The exemplary luminescent panel 100 provided with the luminescent area 110, in which the first and second areas 122, 123 are selected, is described with reference to FIG. 10.

As shown in FIG. 10, a part of the segment areas 120 is selected as the first area 122. In FIG. 10, two first segment areas 122 are selected. Alternatively, one first area 122 may be selected. Further alternatively, no less than two of the first areas 122 may be selected. When no less than two of the first areas 122 are selected, the first areas 122 are concurrently subjected to the aging process. Accordingly the aging process becomes efficient.

The segment areas 120 adjacent to the first area 122 in the row and column directions within the luminescent area 110 are selected as the second areas 123. A plurality of the second areas 123 may be selected for one first area 122. In short, all the segment areas 120 adjacent to the first area 122 in the row and column directions within the luminescent area 110 may be selected as the second areas 123. For example, as shown in FIG. 10, if the number of the segment areas 120 adjacent to the first area 122 in the row and column directions are four, the four segment areas 120 may be selected as the second areas 123. For example, if the first area 122 is adjacent to one of the sides of the luminescent area 110, the number of the segment areas 120 adjacent to the first area 122 in the row and column directions may be three. In this case, the three segment areas 120 may be selected as the second areas 123. For example, when the first area 122 is adjacent to one of the corners of the luminescent area 110, there may be two segment areas 120 adjacent to the first area 122 in the row and column directions. In this case, two of the segment areas 120 may be selected as the second areas 123. In addition to the segment areas 120 adjacent to the first area 122 in the row and column directions, a segment area 120 other than the segment areas 120 adjacent to the first area 122 in the row and column directions may be selected as the second areas 123. In short, all the segment areas 120 other than the first area 122 may be selected as the second areas 123.

In Step S120, the segment areas 120 adjacent to the first area 122 in the row and column directions are selected as the second areas 123. Accordingly, if two or more of the first areas 122 are selected in the row and column directions within the luminescent area 110, the first areas 122 are not adjacent to each other. Instead, each of the first areas 122 is adjacent to the second areas in the row and column directions. Consequently, a temperature rise is less likely to happen to the first areas 122. Therefore, degradation may be less likely to happen to emission elements included in the first areas 122.

In the embodiment, unless the first areas 122 are adjacent to each other in the row and column directions in the luminescent area 110, a plurality of the first areas 122 may be selected at random. Alternatively, unless first areas 122 are adjacent to each other in the row and column directions within the luminescent area 110, a plurality of the first areas 122 may be selected in accordance with a predetermined rule.

(Random Selection of First Areas)

Figure 11:
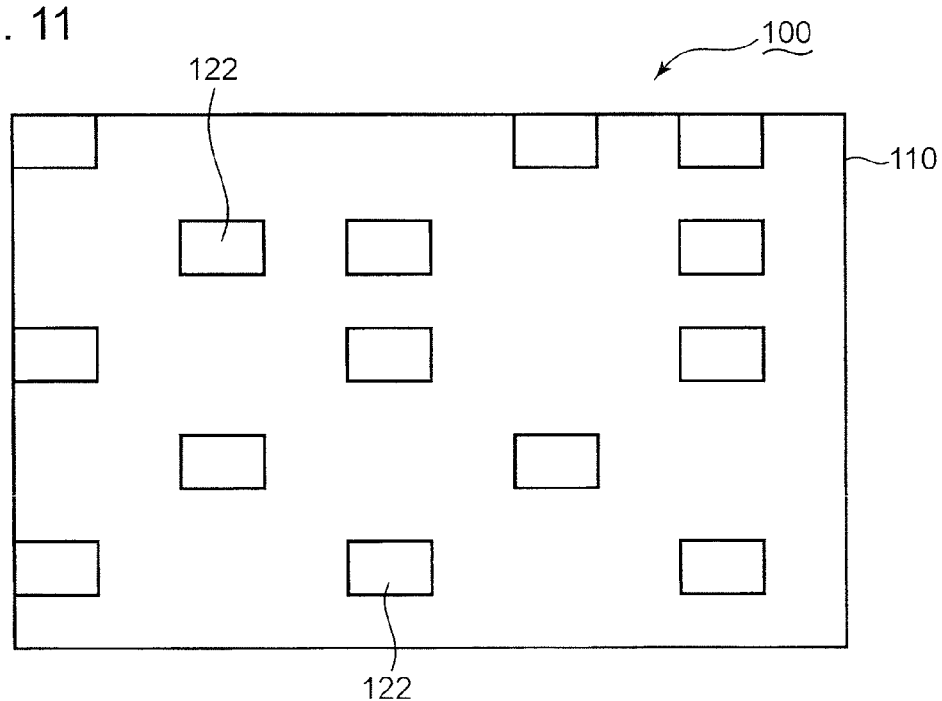
FIG. 11 is a schematic plan view of the luminescent panel provided with the luminescent area, in which first areas are selected at random.

FIG. 11 is a schematic plan view of the luminescent panel 100 provided with the luminescent area 110, in which the first areas 122 are selected at random. The exemplary luminescent panel 100 provided with the luminescent area 110, in which the first areas 122 are selected at random, is described with reference to FIG. 11. To clarify the description, illustration of segment areas that are not selected as the first areas is omitted from FIG. 11.

As shown in FIG. 11, a plurality of the first areas 122 are selected at random under a condition that the first areas 122 are not adjacent to each other in the row and column directions. Each of the first areas 122 shown in FIG. 11 is selected without following a specific rule.

In the embodiment, the phrase of "selected at random" may mean that the first areas 122 are selected without following a specific rule other than the condition that the first areas 122 are not adjacent to each other in the row and column directions within the luminescent area 110, as described with reference to FIG. 11. Alternatively, the phrase of "selected at random" may mean that the first areas 122 are distributed without following one rule. For example, a part of the first areas 122 may be selected in accordance with a specific rule whereas others of the first areas 122 may be selected in accordance with another rule. Further alternatively, a part of the first areas 122 may be selected in accordance with a specific rule whereas others of the first areas 122 may be selected at random.

Figure 12:
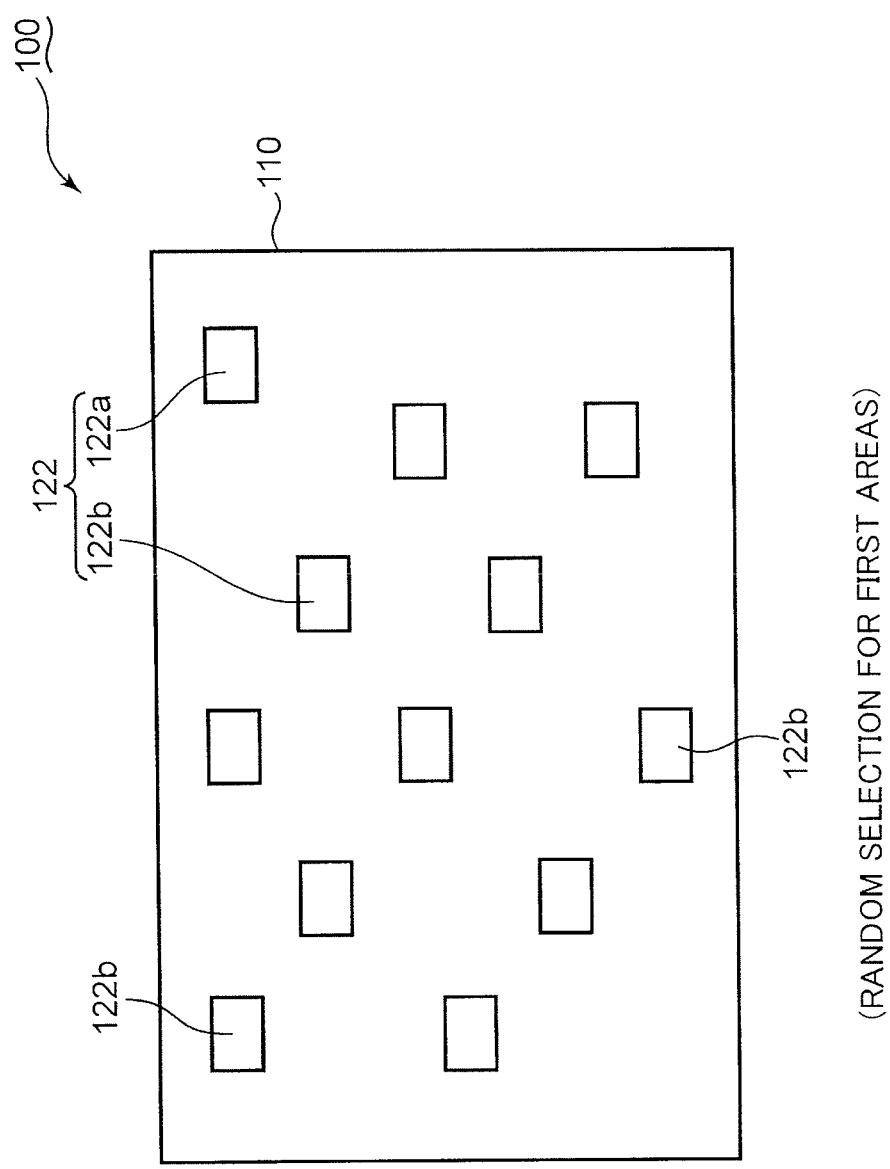
FIG. 12 is a schematic plan view of the luminescent panel provided with a luminescent area, in which first areas are selected at random.

FIG. 12 is a schematic plan view of the luminescent panel 100 provided with the luminescent area 110, in which first areas 122 are selected at random. The exemplary luminescent panel 100 provided with the luminescent area 110, in which first areas 122 are selected at random, is described with reference to FIG. 12. To clarify the description, illustration of segment areas that are not selected as the first areas is omitted from FIG. 12.

As shown in FIG. 12, a plurality of the first areas 122 are selected at random in the condition that the first areas 122 are not adjacent to each other in the row and column directions. First areas 122*b* of the first areas 122 except for the first areas 122*a* is selected at a relatively upper right position of the luminescent area 110 are aligned in the row and diagonal directions at regular intervals in the luminescent area 110. Accordingly, the first areas 122 are selected in the luminescent area 110 without following a specific rule.

In the embodiment, selecting first areas 122 at random may result in simplification of a design of the aging pattern.
(First Areas Selected in Accordance with Specific Rule)

Figure 13:
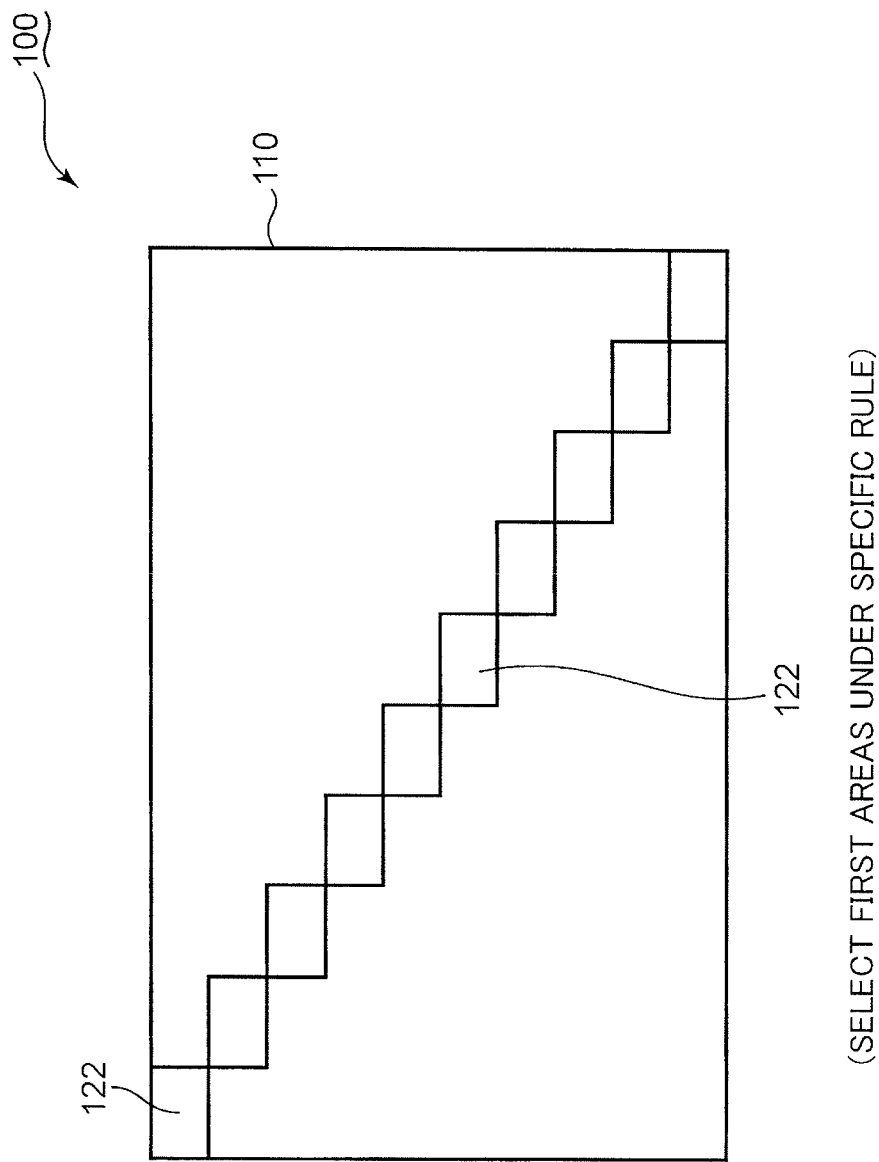
FIG. 13 is a schematic plan view of the luminescent panel provided with a luminescent area, in which first areas are selected in accordance with a rule.

FIG. 13 is a schematic plan view of the luminescent panel 100 provided with the luminescent area 110, in which the first areas 122 are selected in accordance with a rule. The exemplary luminescent panel 100 provided with the luminescent area 110, in which the first areas 122 are selected in accordance with a specific rule, is described with reference to FIG. 13. To clarify the description, illustration of segment areas that are not selected as the first areas is omitted from FIG. 13.

As shown in FIG. 13, the first areas 122 are adjacent to each other in the row and column directions in the luminescent area 110. The first areas 122 are selected under a condition that segment areas continuously aligned in the diagonal direction are selected as the first areas 122. In the embodiment, the phrase "continuously aligned in the diagonal direction" may mean that a corner of one of the first areas 122 is adjacent to a corner of another of the first areas 122, so that the first areas 122 are aligned in the diagonal direction in the luminescent area 110. As shown in FIG. 13, a segment area at the upper left corner of the luminescent area 110 and lower right segment areas diagonally and continuously aligning from the segment area at the upper left corner are selected as the first areas 122. Alternatively, a segment area at the lower left corner of the luminescent area 110 and upper right segment areas diagonally and continuously aligning from the segment area at the lower left corner may be selected as the first areas 122.

Selecting segment areas continuously aligned in the diagonal direction as the first areas 122 may result in easy identification of segment areas subjected to the aging process from segment areas which has not been subjected to the aging process. Accordingly, progress of the aging process may be easily monitored.

Figure 14:
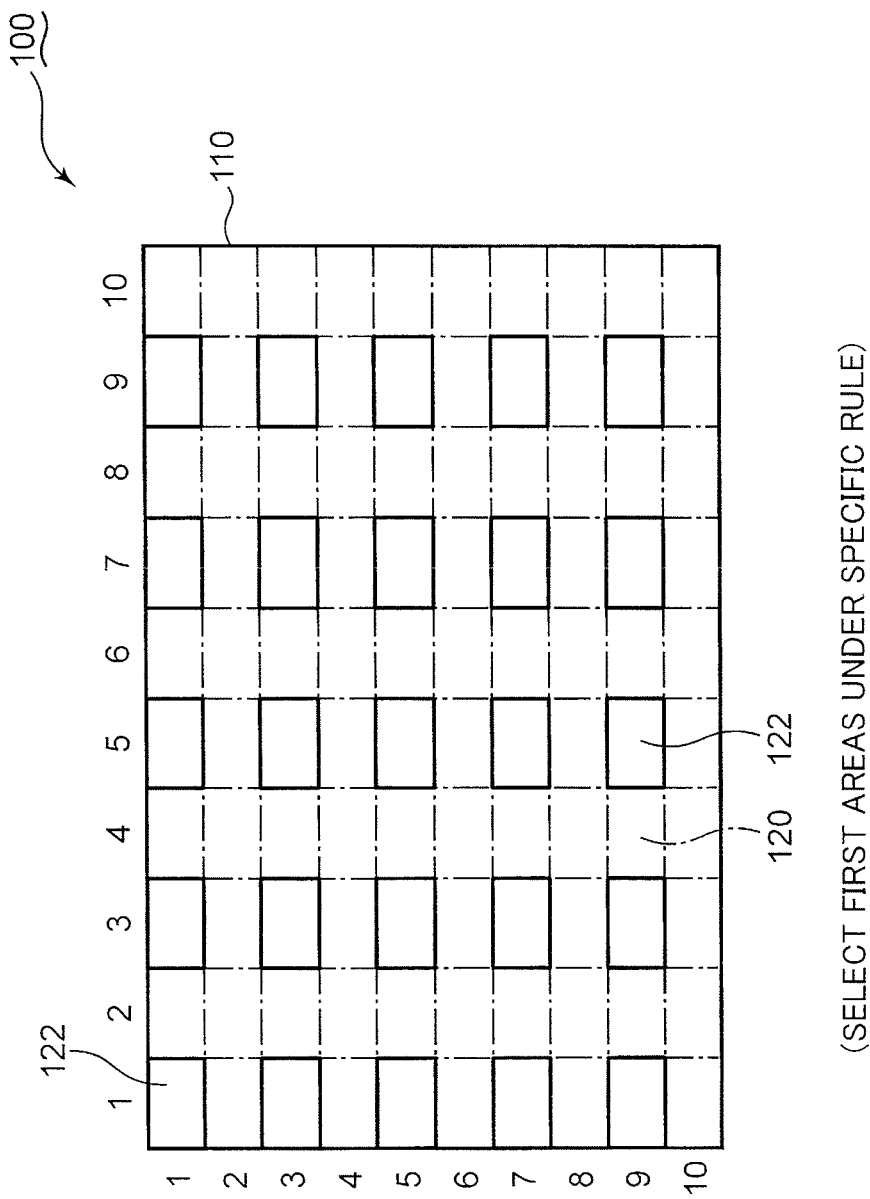
FIG. 14 is a schematic plan view of the luminescent panel provided with a luminescent area in which first areas are selected in accordance with a rule.

FIG. 14 is a schematic plan view of the luminescent panel 100 provided with the luminescent area 110, in which first areas 122 are selected in accordance with a specific rule. The exemplary luminescent panel 100 provided with a luminescent area 110, in which first areas 122 are selected in accordance with a specific rule, is described with reference to FIG. 14. To clarify the description, illustration of second areas is omitted in FIG. 14.

As shown in FIG. 14, the first areas 122 are not adjacent to each other in the row and columns directions in the luminescent area 110. The first areas 122 are selected under a condition that the first areas are not continuously aligned in the row and column directions. There may be regular intervals between the first areas 122. Alternatively, there may be irregular intervals between the first areas 122.

To clarify the description, FIG. 14 shows the luminescent area 110 segmented so that there are ten segment areas 120 in the row direction and ten segment areas 120 in the column direction. The number 1 is assigned to the uppermost and leftmost segment area within the luminescent area in the row and column directions. The row number is incremented by one downwardly from the uppermost and leftmost segment area. The column number is incremented by one rightwardly from the uppermost and leftmost segment area. Therefore, positions of the segment areas shown in FIG. 14 are specified by the row numbers 1 to 10 and the column numbers 1 to 10. In FIG. 14, the segment areas 120 assigned with the odd-numbered row numbers and the odd-numbered column numbers are selected as the first areas 122. Alternatively, the segment areas 120 assigned with the even-numbered row numbers and the odd-numbered column numbers may be selected as the first areas 122. Or the segment areas 120 assigned with the odd-numbered row numbers and the even-numbered column numbers may be selected as the first areas 122. Or the segment areas 120 assigned with the even-numbered row numbers and the even-numbered column numbers may be selected as the first areas 122.

Selecting the first areas 122 so that the first areas 122 are aligned in the row and column directions with intervals makes it easy to distinguish a segment area 120 subjected to the aging process from another segment area 120 that has not been subjected to the aging process. Accordingly, progress of the aging process may be easily monitored. If the first areas 122 are arranged at regular intervals, a segment area 120 subjected to the aging process may be easily distinguished from another segment area 120 that has not been subjected to the aging process. Accordingly, progress of the aging process may be easily monitored.

To clarify the effects of the embodiment, an exemplary luminescent panel, in which segment areas adjacent to each other in the row and column directions within a luminescent area are defined as target areas to be subjected to the aging process, is compared with the luminescent panel 100 in the embodiment.

Figure 15:
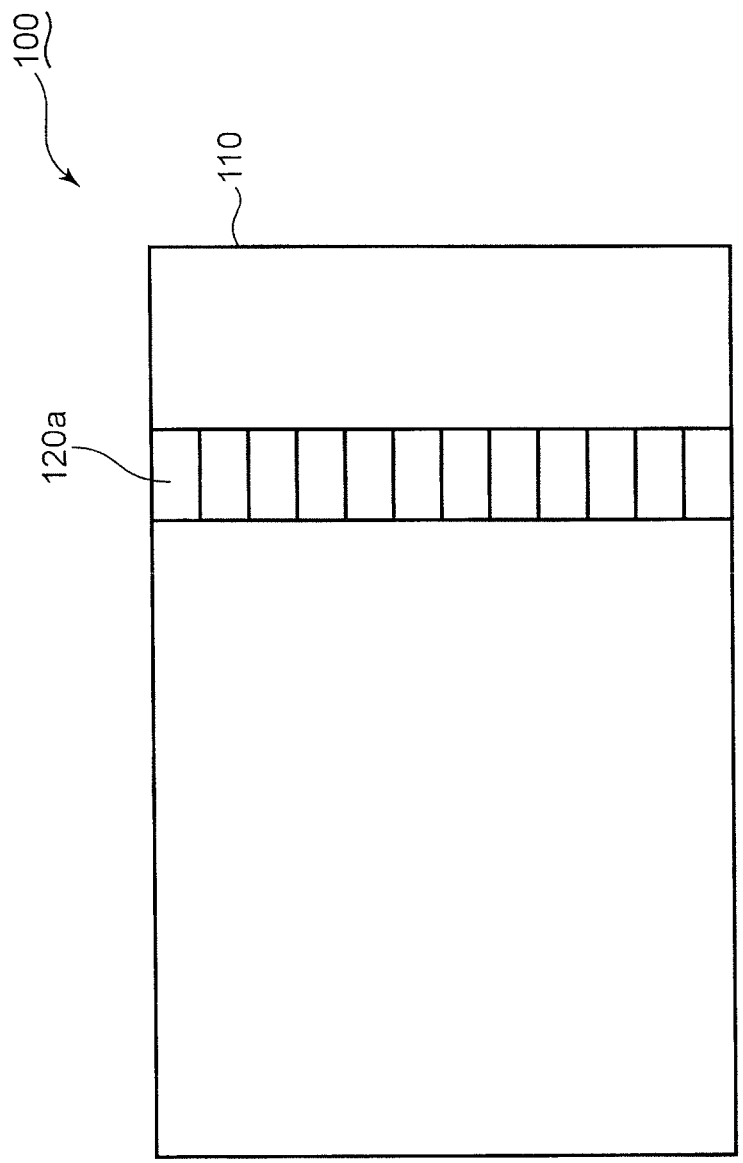
FIG. 15 is a schematic plan view of the luminescent panel provided with a luminescent area, in which segment areas adjacent to each other in the column direction of the luminescent area are selected.

FIG. 15 is a schematic plan view of the luminescent panel 100 provided with the luminescent area 110, in which segment areas adjacent to each other in the column direction within the luminescent area 110 are selected as target areas to be subjected to the aging process. The exemplary luminescent panel 100 provided with the luminescent area 110, in which segment areas 120 adjacent to each other in the column direction within the luminescent area 110 are selected as target areas to be subjected to the aging process, is described with reference to FIG. 15. To clarify the description, segment areas selected as target areas to be subjected to the aging process are indicated with the reference sign 120*a* in FIG. 15. In FIG. 15, illustration of segment areas that are not selected is omitted.

As shown in FIG. 15, the segment areas 120*a* are selected to be adjacent to each other in the row direction. Alternatively, the segment areas 120*a* may be selected to be adjacent to each other in the column direction. The selected segment areas 120*a* are subjected to the aging process corresponding to Step S130, which is described later. A temperature distribution of the luminescent area 110 during the aging process is described later. In order to make consistency between comparison conditions, the selected segment areas 120*a* shown in FIG. 15 are selected so that the total area of the selected segment areas 120*a* is substantially equal to the total area of the first areas 122 described with reference to FIG. 12.

(Aging Process)

The aging process is performed for the first area 122 in accordance with a predetermined aging condition. The first area 122 subjected to the appropriate aging process is handled as the aging area. In the embodiment, the term "aging area" means the first area 122 appropriately subjected to the aging process. The aging condition may be contained in drive signals, which are generated by the circuit board 200 described with reference to FIG. 1. For example, the aging condition may be emission from an emission element with predetermined luminance and extinction a predetermined time after the emission. Alternatively, the aging condition may be emission from an emission element with predetermined luminance and extinction after the emission element reaches a predetermined temperature.

Figure 16:
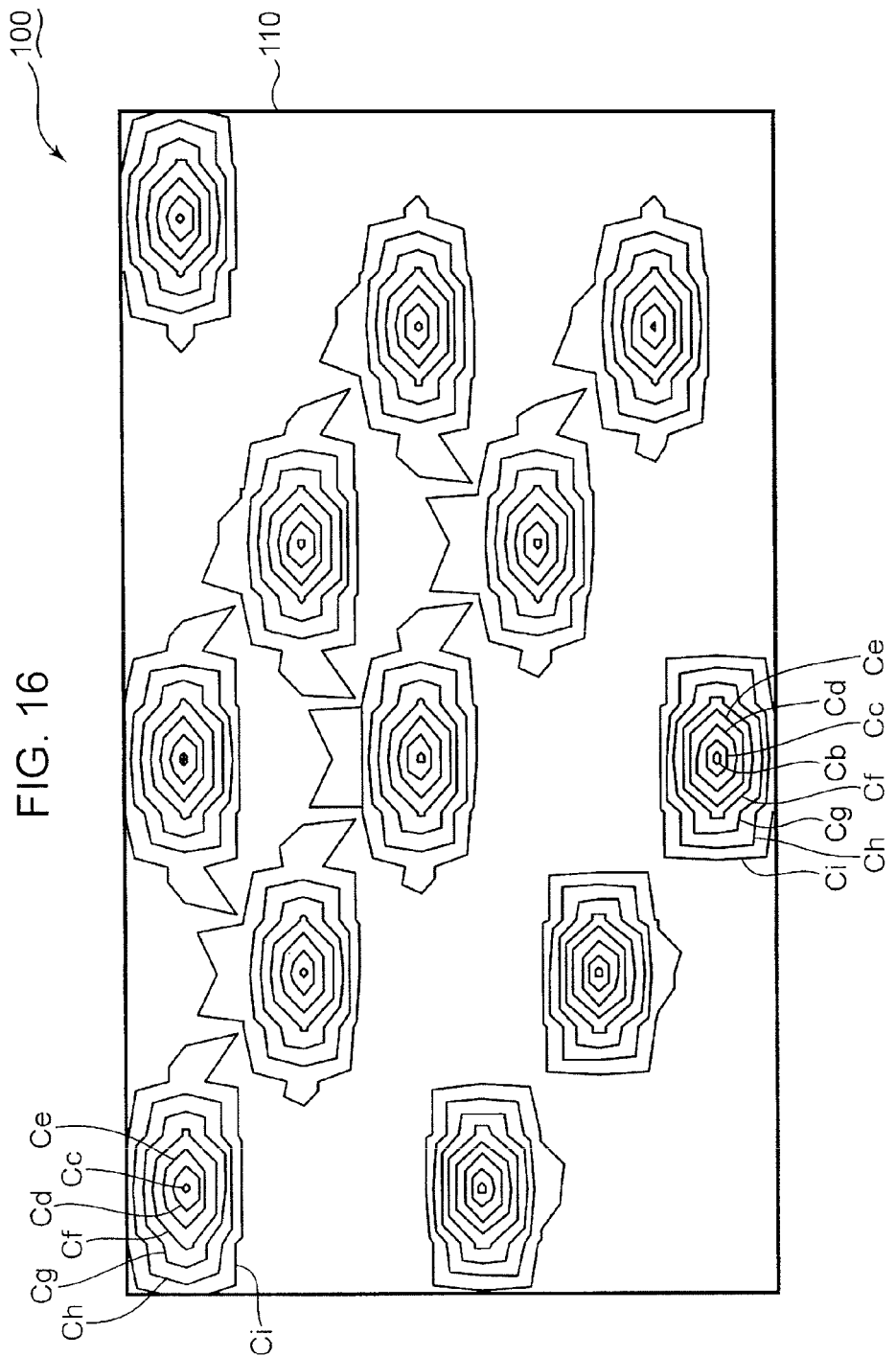
FIG. 16 is a schematic isothermal diagram showing a temperature distribution when first areas in the luminescent area described with reference to FIG. 12 are aged.

FIG. 16 is a schematic isothermal diagram showing a temperature distribution when the first areas 122 in the luminescent area 110 described with reference to FIG. 12 are subjected to the aging process. An exemplary temperature distribution of the luminescent area 110 subjected to the aging process is described with reference to FIG. 16.

As shown in FIG. 16, if there is uniform emission from the first areas 122 with predetermined luminance (e.g. 450 cd/m$^2$), the emission elements generate heat, which causes different regions in temperature within the luminescent area 110. The regions in the luminescent area 110 shown in FIG. 16 are distinguished from each other by isothermal lines Cb to Ci. The region surrounded by the isothermal line Cb has the highest temperature in the luminescent area 110 shown in FIG. 16. The region outside the isothermal line Ci has the lowest temperature in the luminescent area 110. Accordingly, the emission elements in the region outside the isothermal line Ci are less likely to degrade.

To clarify the effects of the embodiment, an exemplary temperature distribution of a luminescent area when the aging process is performed for a luminescent panel provided with the luminescent area including segment areas 120 adjacent to each other in the column direction in the luminescent area as target areas to be subjected to the aging process unlike Step S120 is compared with a temperature distribution which is obtained under the principle of the embodiment.

Figure 17:
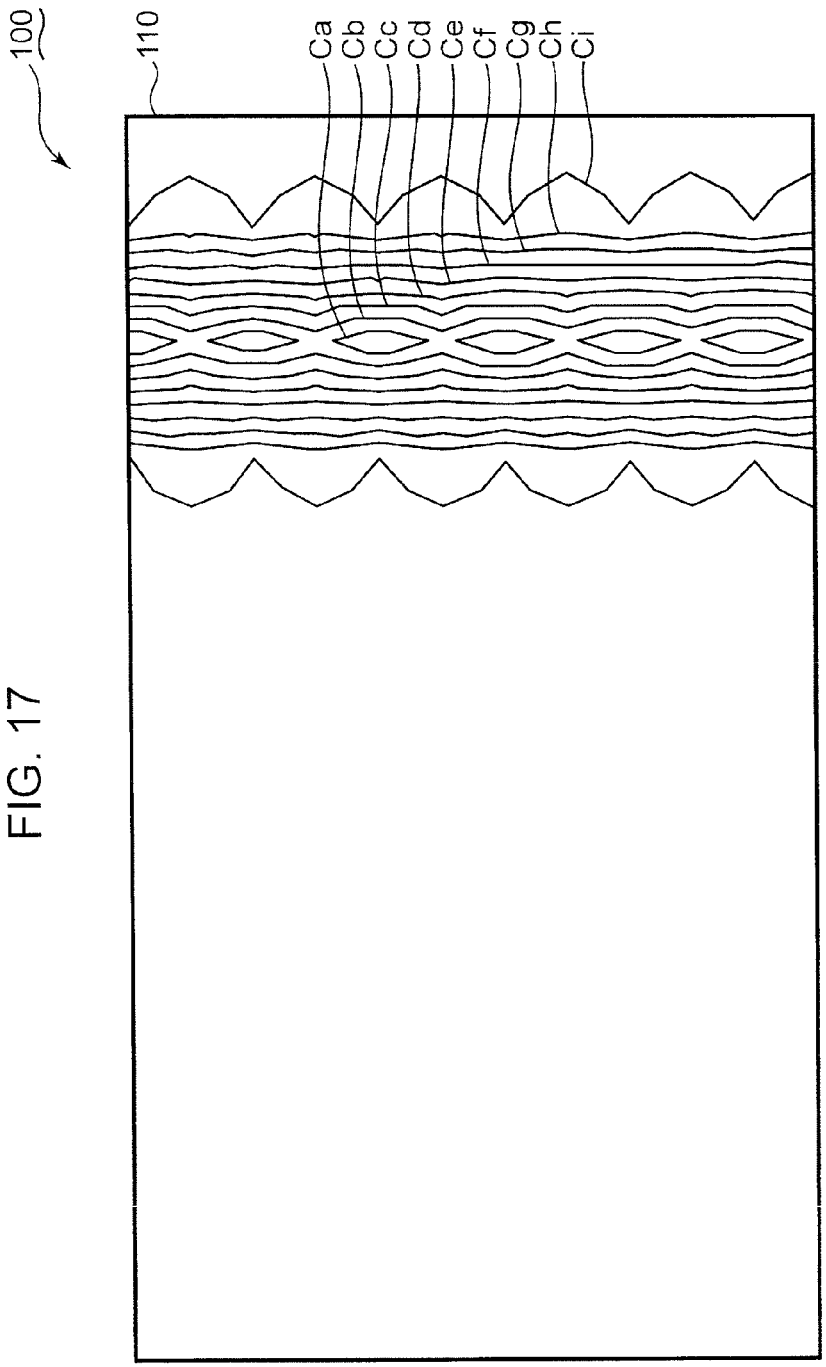
FIG. 17 is a schematic isothermal diagram showing a temperature distribution when segment areas selected in the luminescent area described with reference to FIG. 15 are aged.

FIG. 17 is a schematic isothermal diagram showing a temperature distribution when the selected segment areas 120a are aged in the luminescent area 110 described with reference to FIG. 15. An exemplary temperature distribution of the luminescent area 110 subjected to the aging process is described with reference to FIG. 17.

If there is uniform emission with predetermined luminance (e.g. 450 cd/m$^2$) from the selected segment areas 120a described with reference to FIG. 15 and the first areas 122 described with reference to FIG. 16, the emission elements generate heat, which causes different regions in temperature in the luminescent area 110, as shown in FIG. 17.

The different regions in temperature within the luminescent area 110 shown in FIG. 17 are distinguished by the isothermal lines Cb to Ci and the isothermal line Ca described with reference to FIG. 16. The region surrounded by the isothermal line Ca has the highest temperature in the luminescent area 110 shown in FIG. 17. Accordingly, the emission elements in the region surrounded by the isothermal line Ca are likely to degrade, as compared with the emission elements in the region surrounded by the isothermal line Cb. In FIG. 17, the region defined by the isothermal lines Ca, Cb is larger than the region surrounded by the isothermal line Cb in the luminescent area 110 described with reference to FIG. 16. Accordingly, a temperature variation in the plane of the luminescent area 110 becomes large, as compared with the luminescent area 110 described with reference to FIG. 16. Therefore, there may be a large life variation among the emission elements.

If the first areas 122 are appropriately aged as described with reference to FIG. 16, the maximum temperature in the plane of the luminescent area under the aging process goes down. Accordingly, there may be a small temperature variation in the plane of the luminescent area. Therefore, there may be a small life variation among the emission elements. The luminescent panel under the aging process in accordance with the principle of the embodiment is less likely to cause a luminance variation, so that uniform image quality is maintained for a long period of time. Consequently, the luminescent panel becomes very reliable.

(Method for Selecting First and Second Areas in Step S140)

Figure 18:
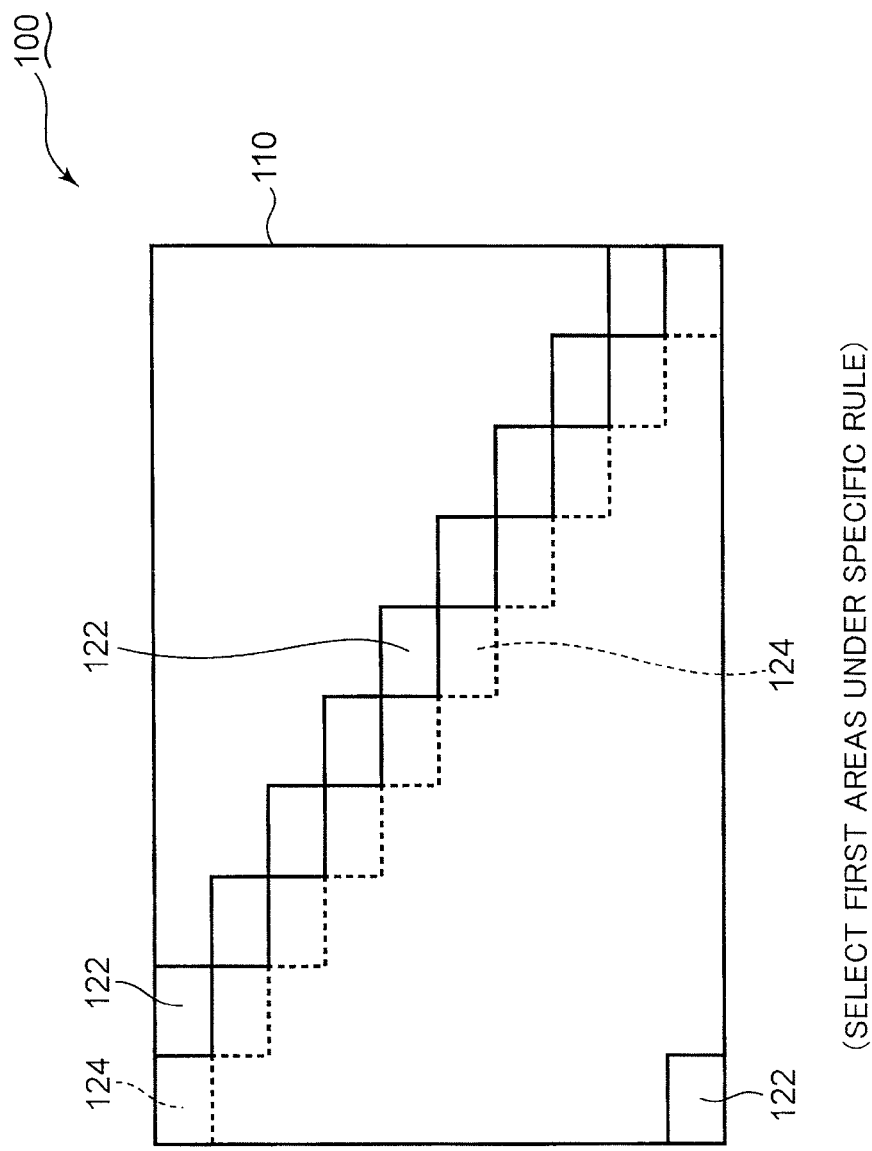
FIG. 18 is a schematic plan view of the luminescent panel provided with the luminescent area described with reference to FIG. 13, first areas being selected in the luminescent area.

FIG. 18 is a schematic plan view of the luminescent panel 100 provided with the luminescent area 110, in which first areas 122 are selected in accordance with the pattern described with reference to FIG. 13. In FIG. 18, the first areas 122 subjected to the aging process in Step S130 are indicated as the aging areas 124. The exemplary luminescent panel 100 provided with the luminescent area 110, in which first areas 122 are selected, is described with reference to FIG. 18.

As shown in FIG. 18, at least a part of the segment areas other than the aging areas 124 is selected as the first area 122. The segment areas adjacent to the first area 122 in the row and column directions are selected as the second areas. To clarify the description, FIG. 18 shows the first areas 122 and aging, areas 124, but omits illustration of other segment areas.

Each of the first areas 122 in FIG. 18 is selected as each of the segment areas 120 on the right of the corresponding first area 122 described with reference to FIG. 13. Ten first areas 122 are selected. Alternatively, less than ten segment areas or more than ten segment areas may be selected as the first areas 122. Since there is no segment area 120 on the right of the first area 122 adjacent to the right edge of the luminescent area 110 shown in FIG. 13, a segment area 120 adjacent to the left edge of the luminescent area 110 is selected as the first area 122 among the other segment areas in the row to which the segment area 120 belongs.

Alternatively, unless the first areas 122 are adjacent to each other in the row and column directions within the luminescent area 110, the first areas 122 may be selected at random. Further alternatively, the first areas 122 may be selected in accordance with a specific rule.

The selected first areas 122 are appropriately aged due to the selection of the first areas 122 and the subsequent aging process. The appropriately aged first areas 122 are handled as the aging areas 124.

(Method for Selecting New First and Second Areas in Step S140)

Figure 19:
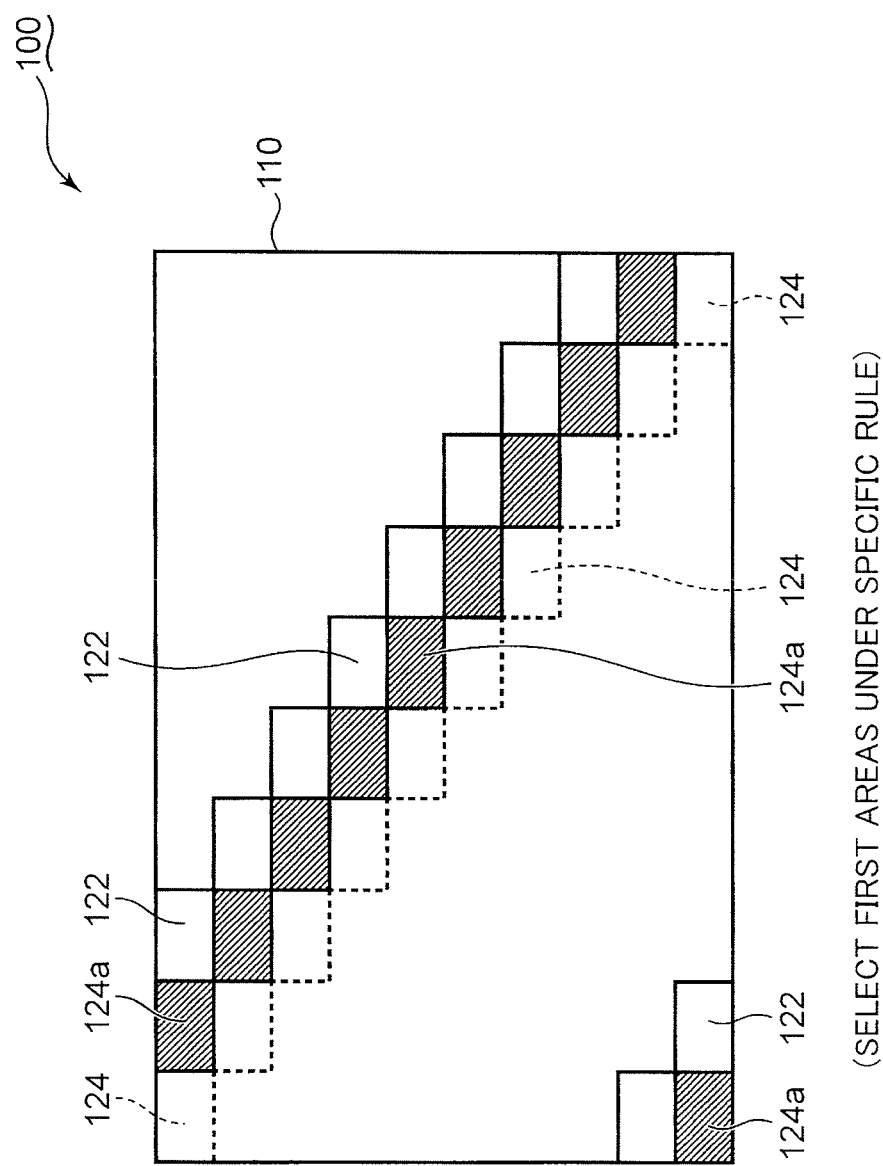
FIG. 19 is a schematic plan view of the luminescent panel provided with a luminescent area described with reference to FIG. 18, first areas being newly selected in the luminescent area.

FIG. 19 is a schematic plan view of the luminescent panel 100 provided with the luminescent area 110, in which the first areas 122 are newly selected in the luminescent area 100 described with reference to FIG. 18. In FIG. 19, the first areas subjected to the aging process by execution of Step S150 are shown as the aging areas 124a. The exemplary luminescent panel 100 provided with the luminescent area 110, in which the first areas 122 are newly selected by re-execution of Step S140, is described with reference to FIG. 19.

As shown in FIG. 19, a part of the segment areas other than the aging areas 124, 124a are selected as the new first areas 122. The segment areas adjacent to the newly selected first areas 122 in the row and column directions are selected as the new second areas. To clarify the description, FIG. 19 shows the new first areas 122 and the aging areas 124, 124a but omits illustration of the other segment areas.

In FIG. 19, each of the newly selected first areas 122 is selected as the segment area 120 on the right of the aging areas 124a subjected to the aging process in Step S150. There are ten segment areas selected as the first areas 122. Alternatively, less than ten segment areas or more than ten segment areas may be selected as the first areas 122. The aging areas 124 include a first area 122 adjacent to the right edge of the luminescent area 110, so that there is no segment area 120 on the right of the first area 122. In this case, the segment area 120 adjacent to the left edge of the luminescent area 110 is selected as the new first area 122 from the other segment areas 120 in the row, to which the segment area 120 belongs.

The newly selected first areas 122 are appropriately aged due to the selection of the new first areas 122 and the aging process. The appropriately aged first areas 122 are handled as the aging areas 124.

Alternatively, unless the first areas 122 are adjacent to each other in the row and column directions within the luminescent area 110, the new first areas 122 may be selected at random. Further alternatively, the new first areas 122 may be selected in accordance with a specific rule.
(Aging Process)

Figure 20:
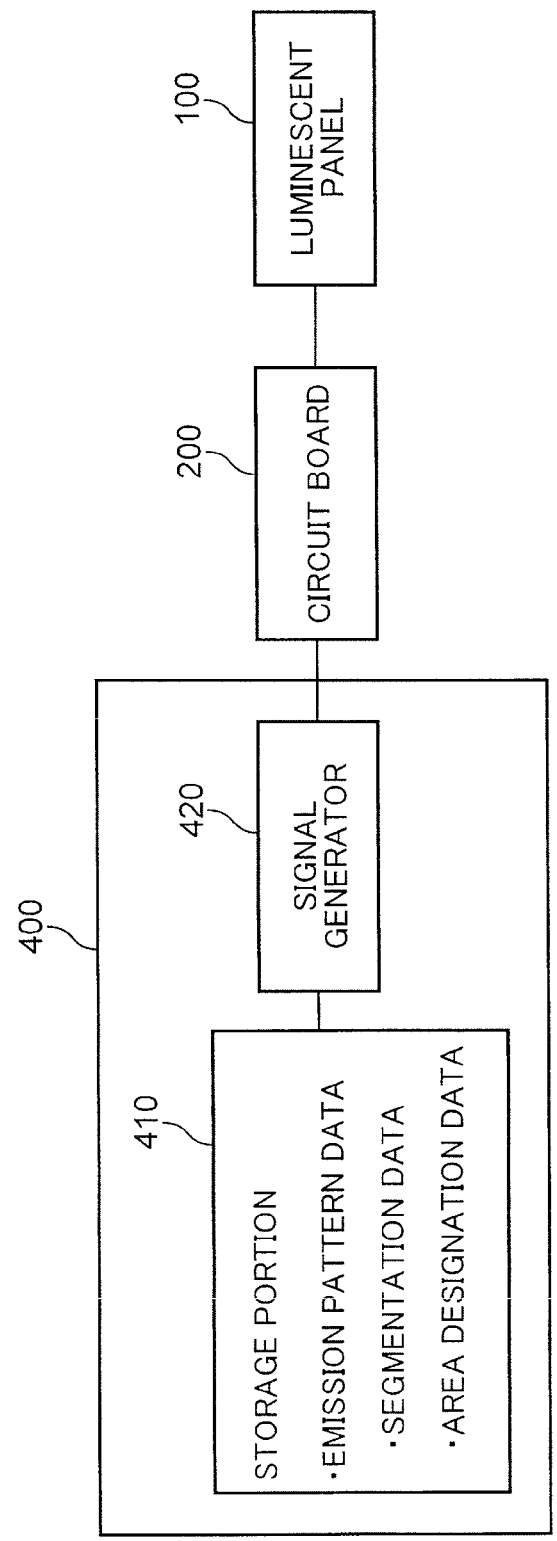
FIG. 20 is a schematic view for describing a connection between an aging device and the luminescent panel.

FIG. 20 is a schematic view showing a connection between the aging device 400 and the luminescent panel 100. The aging device 400 is described with reference to FIG. 20.

As shown in FIG. 20, the aging device 400 is connected to the luminescent panel 100 via the circuit boards 200. As described with reference to FIGS. 7 and 8, the luminescent panel 100 includes the luminescent area 110 constituted of the emission pixels arranged in a matrix pattern.

The aging device 400 includes a storage portion 410 and a signal generator 420.

The storage portion 410 stores emission pattern data. The emission pattern data includes segmentation data and area designation data. The storage portion 410 is exemplified by an information storage medium such as a hard disk.

Figure 21:
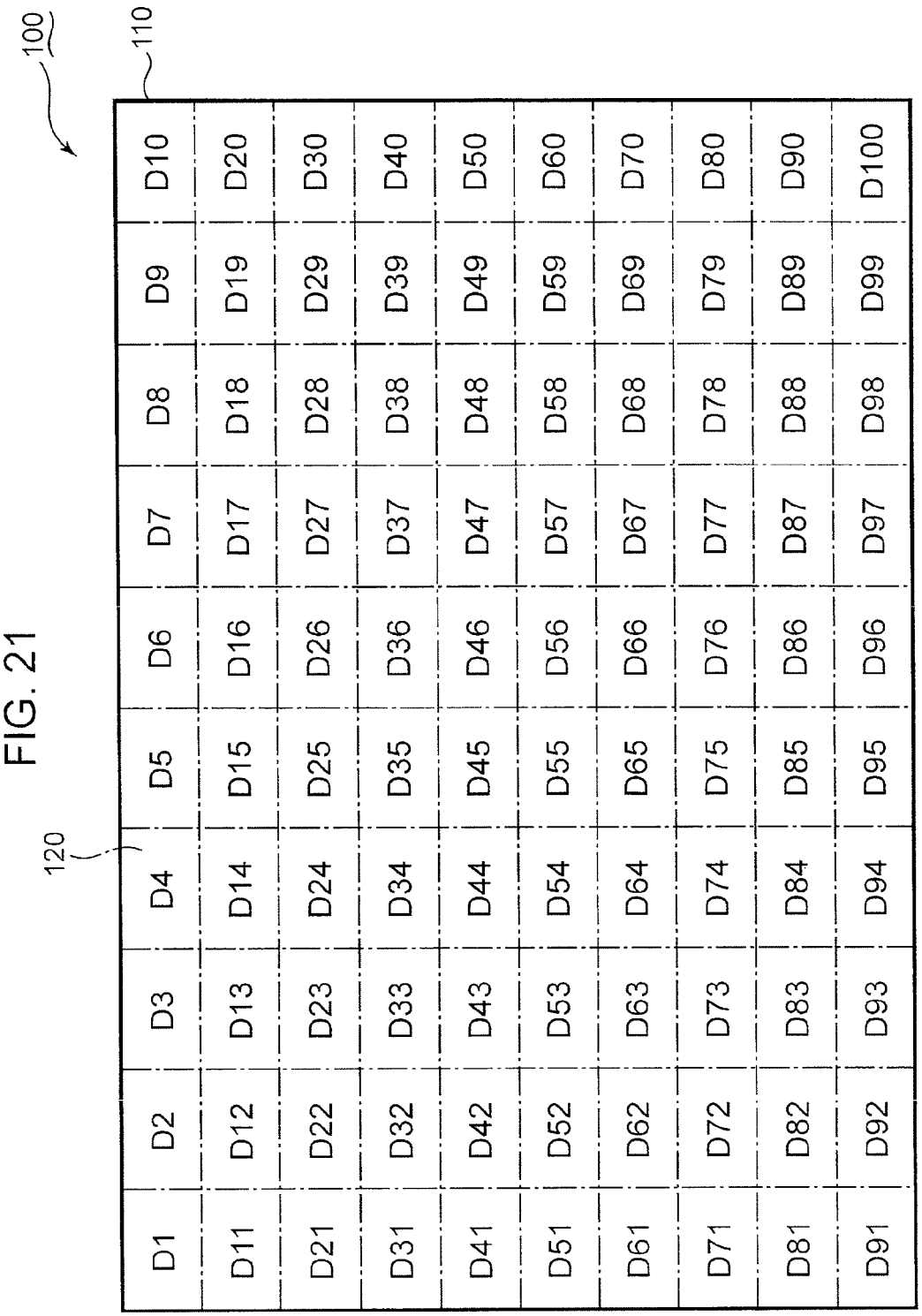
FIG. 21 is a schematic plan view of a luminescent area divided into segment areas defined by segmentation data.

The segmentation data is used for dividing the luminescent area 110 of the luminescent panel 100 in order to define the segment areas 120. FIG. 21 is a schematic plan view of the luminescent area 110 which is divided into the segment areas 120 defined by the segmentation data. The segmentation data is described with reference to FIG. 21.

As shown in FIG. 21, the segmentation data defines the number by which the luminescent area 110 is divided in the row and column directions. In addition, the segmentation data designates positions of the individual segment areas 120 obtained on the basis of the defined number. In FIG. 21, the number of the segment areas to be defined by the segmentation data in the row direction is "ten". The number of the segment areas to be defined by the segmentation data in the column direction is "ten". The positions of the segment areas are defined as D1 to D100. Alternatively, the number of the segment areas to be defined by the segmentation data in the row direction may be not smaller than two but smaller than ten, or may be larger than ten. Likewise, the number of the segment areas to be defined by the segmentation data in the column direction may be not smaller than two but smaller than ten, or may be larger than ten.

The area designation data is used for designating a part of the segment areas 120 as the first area 122, the segment areas 120 themselves and their positions being defined by the segmentation data. In addition, the area designation data is used for designating the segment area 120 as the second area 123 if the segment area 120 is adjacent to the first area 122 in the row and column directions within the luminescent area 110. FIG. 22 is a schematic plan view of the luminescent area 110 including the first and second areas 122, 123 designated by the area designation data. The area designation data is described with reference to FIG. 22.

As shown in FIG. 22, the area designation data designates a part of the segment areas 120 as the first area 122 (in FIG. 22, indicated as "FIRST AREA"). In addition, the area designation data designates the segment area 120 as the second area 123 (in FIG. 22, indicated as "SECOND AREA") if the segment area 120 is adjacent to the first area 122 in the row and column directions within the luminescent area 110. The segment areas continuously aligned in the diagonal direction in accordance with the selection method described with reference to FIG. 13 are designated as the first areas 122. Alternatively, unless the first areas 122 are adjacent to each other in the row and column directions within the luminescent area 110, the first areas 122 may be designated at random. Further alternatively, unless the first areas 122 are adjacent to each other in the row and column directions within the luminescent area 110, the first areas 122 may be designated in accordance with a specific rule. Alternatively, the segment areas 120 other than the segment areas 120 adjacent to the first areas 122 in the row and column directions may be designated as the second areas 123, in addition to the segment areas 120 adjacent to the first areas 122 in the row and column directions. In short, all the segment areas 120 other than the first areas 122 may be designated as the second areas 123.

The signal generator 420 is electrically connected to the storage portion 410. The signal generator 420 generates control signals for emission pixels on the basis of the emission pattern data stored in the storage portion 410. For example, the signal generator 420 may be a non-volatile ROM (Read Only Memory) in which a predetermined control program is stored, or may be an RAM (Random Access Memory) for temporarily storing data.

The storage portion 410 and the signal generator 420 may be stored in a housing of a personal computer (PC). Alternatively, the storage portion 410 and the signal generator 420 may be stored in individual housings, and are electrically connected to each other.

The circuit boards 200 are connected to the luminescent panel 100, as described with reference to FIG. 1. Each of the circuit boards 200 generates drive signals for causing light emission from the luminescent panel 100 in response to the control signals generated by the signal generator 420. The drive signals are output from the circuit board 200 to the luminescent panel 100. The luminescent panel 100 energizes emission elements in emission pixels in response to the drive signals from the circuit board 200. Consequently, there is light emission from the luminescent panel 100. The emission elements are aged by the light emission. Alternatively, the circuit boards 200 may be incorporated in the aging device 400 as a part of the aging device 400, or may be incorporated in the luminescent panel 100 as a part of the luminescent panel 100. When the circuit boards 200 are incorporated as a part of the luminescent panel 100, the circuit boards 200 may drive the luminescent panel 100 in response to image signals for display images.

The aging process is performed in accordance with the method described with reference to FIG. 6. Accordingly, the aging device 400 may suppress a temperature variation in the luminescent panel 100 during the aging process. Consequently, the emission elements included in the luminescent panel 100 are less likely to cause performance degradation. Since a luminance variation is less likely to happen to the luminescent panel 100, the luminescent panel may maintain uniform image quality for a long period of time. Accordingly, the luminescent panel becomes very reliable.

<Second Embodiment>

In the second embodiment, a display device 1 provided with the luminescent panel 100, which is subjected to the aging process on the basis of the techniques in the first embodiment, is described. The display device 1 utilizes organic EL elements as the emission elements. The display device 1 executes an aging mode for performing the aging process and an image display mode for displaying an image.

The display device 1 in the embodiment may perform the aging process without an external aging device. The techniques about the regional division described in the context of the first embodiment are applied to the aging process to be performed by the display device 1. In order to avoid redundant description, description about the area division is excluded from the embodiment. On the other hand, control for outputting signals in the aging mode is mainly described in the embodiment.

Figure 23:
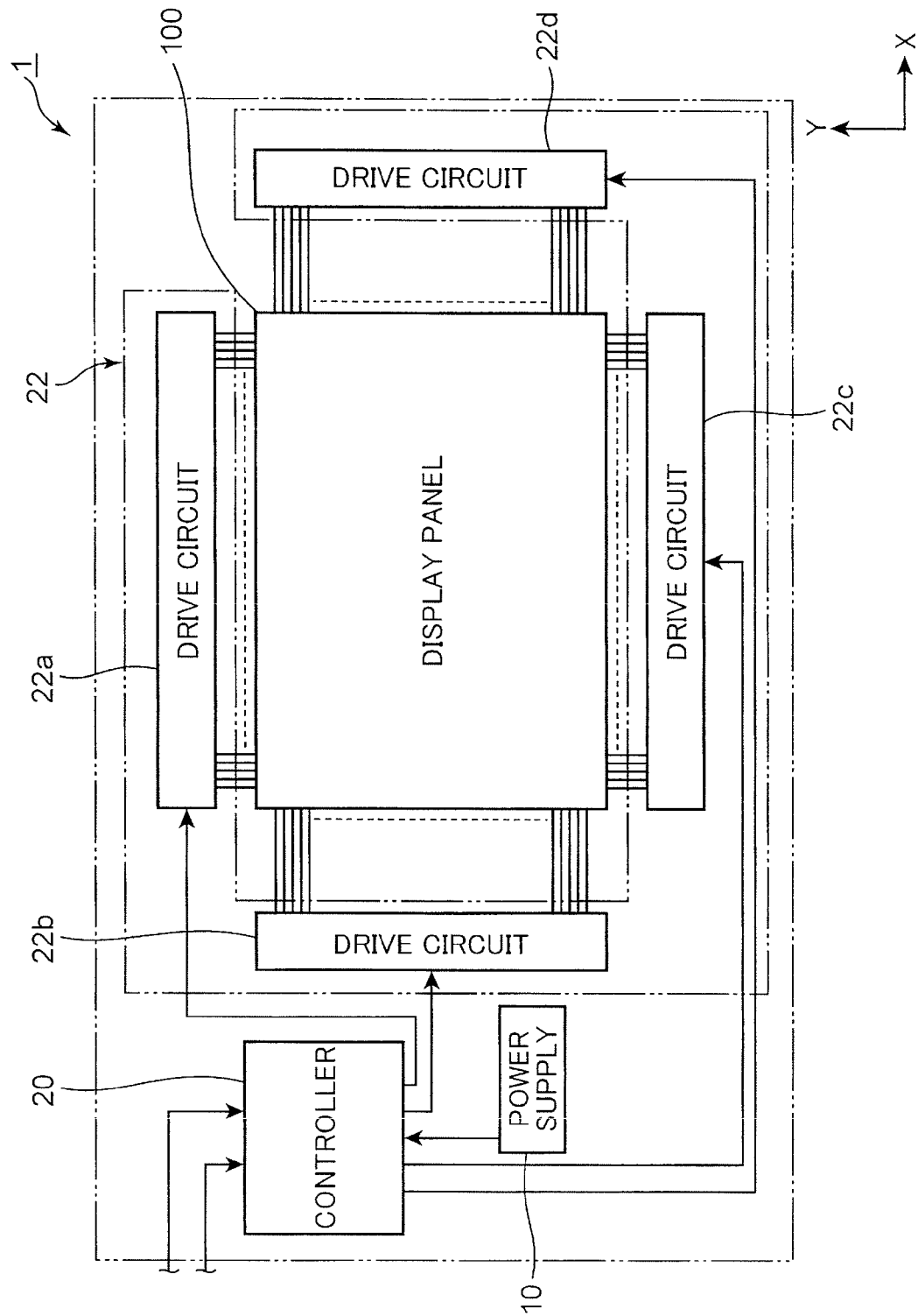
FIG. 23 is a schematic block diagram of a display device according to the second embodiment.

FIG. 23 is a schematic view of the display device 1. The display device 1 is described with reference to FIG. 23.

As shown in FIG. 23, the display device 1 is provided with the luminescent panel 100, a power supply 10 for supplying electric power to circuits, a controller 20 for controlling the circuits, and a drive circuit 22. The luminescent panel 100 utilizes electroluminescent phenomena of organic materials. As described in the context of the first embodiment, pixels are arranged in a matrix pattern. A structure of the pixels may be the same as the structure shown in FIG. 2. An organic EL material is used for emission layers 140R, 140G, 140B. The drive circuit 22 includes four drive circuits 22a, 22b, 22c, 22d. Other structures may be applied as arrangement of the drive circuit 22 on the luminescent panel 100.

Figure 24:
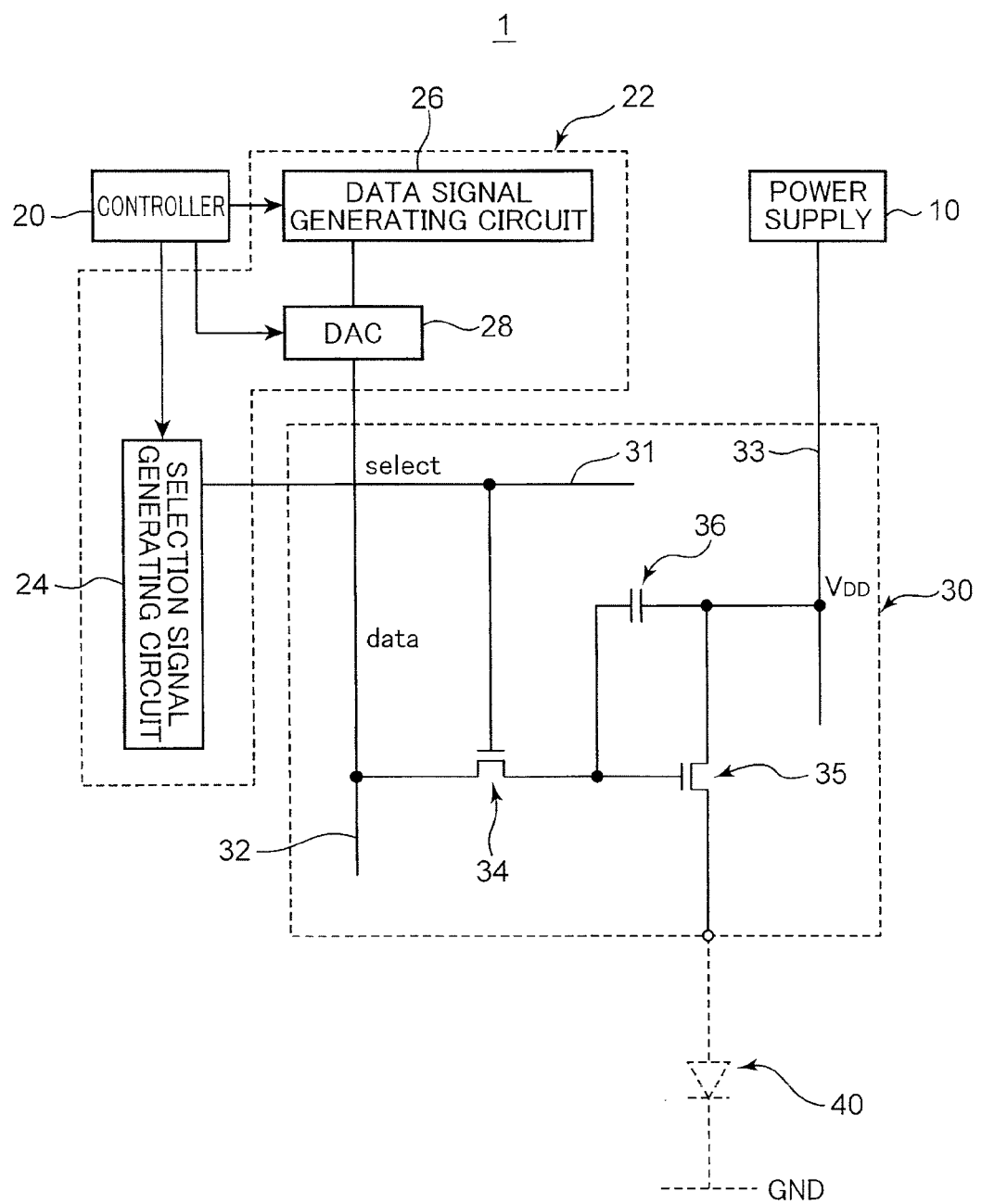
FIG. 24 is a circuit diagram corresponding to one pixel in the display device depicted in FIG. 23.

FIG. 24 is a circuit diagram of one pixel in the display device 1 shown in FIG. 23. The display device 1 is further described with reference to FIGS. 23 and 24.

As shown in FIG. 24, the display device 1 is provided with the power supply 10, the controller 20, the drive circuit 22, a pixel circuit 30, and an organic EL element 40. The drive circuit 22 shown in FIGS. 23 and 24 includes a selection signal generating circuit 24, a data signal generating circuit 26, and a DAC (Digital to Analog Converter) 28. The pixel circuit 30 includes a selecting line 31, a data line 32, a power line 33, a switching transistor 34, a drive transistor 35 and a storage capacity 36. The switching transistor 34 and the drive transistor 35 may be a thin film transistor element.

The power supply 10 is connected to the organic EL element 40 via the power line 33. The power supply 10 supplies electric power for driving the organic EL element 40. As described above, the display device 1 executes the aging mode for aging the organic EL element 40, and the image display mode for displaying images with use of the organic EL element 40. The power supply 10 outputs the same power supply voltage VDD to the power line 33 in both of the aging mode and the image display mode.

The controller 20 selectively operates in the aging mode or the image display mode. The controller 20 executes a determination operation for selecting the aging mode or the image display mode in response to input of operation signals on the basis of an operator's operation. The controller 20 outputs selection signals to the selection signal generating circuit 24 in accordance with the selected mode in response to a determination result. In addition, the controller 20 outputs digital luminance signals to the data signal generating circuit 26 in accordance with the selected mode. The controller 20 further outputs switching signals to the DAC 28 in accordance with the selected mode.

The selection signal generating circuit 24 may be a shift register. The controller 20 outputs a start pulse to the selection signal generating circuit 24 one time for each frame. Since the start pulse is sequentially shifted to the shift register, a row of the organic EL elements 40 which emit light is selected. The controller 20 generates digital luminance signals for controlling emission gradation of the organic EL elements 40. The digital luminance signals are output from the controller 20 to the data signal generating circuit 26. For example, a component signal, which indicates luminance Y and chrominance Cb and Cr, may be utilized as the digital luminance signal.

The bit number of a digital component signal to be output from the controller 20 is 10 bit in the aging mode and 8 bit in the image display mode. If the bit number of a digital component signal to be used is 10 bit, the controller 20 generates a switching signal indicating 10 bit. If the bit number of a digital component signal to be used is 8 bit, the controller 20 generates a switching signal indicating 8 bit. The switching signal is output from the controller 20 to the DAC 28.

The selection signal generating circuit 24 applies a voltage via the selecting line 31 to the gate electrode of the switching transistor 34 in correspondence to the row of the organic EL elements 40 which emit light, in order to set an ON-state. On the other hand, the selection signal generating circuit 24 applies a voltage via the selecting line 31 to the gate electrode of the switching transistor 34 in correspondence to the row of organic EL elements 40 which do not emit light in order to set an OFF-state.

The data signal generating circuit 26 converts a digital luminance signal, which indicates luminance Y and chrominance Cb, Cr, into a digital luminance signal in the form of R, G, B. The data signal generating circuit 26 uses a conversion map between R, G, B digital luminance signal and R, G, B digital voltage signal to further convert the R, G, B digital luminance signal into a R, G, B digital voltage signal. Thereafter, the R, G, B digital voltage signal is output from the data signal generating circuit 26 to the DAC 28.

The display device 1 is provided with the DACs 28 as many as the pixel columns. The DAC 28 is provided on a signal transmission path for transmitting a digital luminance signal from the controller 20 to the pixel circuit 30. The DAC 28 converts a digital voltage signal output from the data signal generating circuit 26 into an analog data voltage. The obtained analog data voltage is applied from the DAC 28 to the source electrode of the switching transistor 34 via the data line 32.

The DAC 28 switches the bit number of a digital voltage signal to be processed in response to a switching signal from the controller 20. Consequently, the bit number of the digital voltage signal to be processed in the aging mode is larger than the bit number of the digital voltage signal to be processed in the image display mode.

If the bit number of the digital voltage signal set in the DAC 28 is larger than the bit number required for the image display mode, the DAC 28 masks the high-order bit by the difference between the bit number of the digital voltage signal set in the DAC 28 and the bit number required for the image display mode. In the aging mode, the DAC 28 does not mask the high-order bit.

For example, the bit number of the digital voltage signal to be processed by the DAC 28 may be designed as 10 bit. In this case, the bit number of the digital voltage signal to be utilized in the aging mode may be set to 10 bit. The digital signal to be processed in the image display mode may be set to 8 bit. If the high-order 2 bit is masked, there may be an appropriate operation in the image display mode.

The DAC 28 is provided with a register portion, a converter and a masking portion. The register portion includes registers connected to the data signal generating circuit 26. The converter receives parallel inputs from the registers. In addition, the converter converts a digital voltage signal into an analog voltage signal. The masking portion masks the high-order 2 bit of the digital voltage signal. DAC of ladder resistor type, resistor string type, pulse width modulation type, and delta-sigma type may be used as the converter.

The exemplary DAC 28 is described below. The register portion in the DAC 28 is a shift register. A digital voltage signal is serially input to the register portion. An AND circuit in correspondence to each bit is provided between the high-order 2 bit of the register portion and the converter. The AND circuits function as the masking portion.

In this case, a digital voltage signal stored in the register is input to one of the input terminals of each AND circuit. A switching signal output from the controller 20 is input to another of the input terminals of each AND circuit. The bit number of the switching signal is 1 bit. The bit of the switching signal is set to be 1 in the aging mode. The bit of the switching signal is set to be 0 in the image display mode.

In the aging mode, a 10-bit digital voltage signal output from the data signal generating circuit 26 is stored in the register portion. Thereafter, the 10-bit digital voltage signal is output from the register portion to the converter. The bit value of a signal, which is output from the high-order 2 bit in the register portion and passes through the AND circuit, is the same as the bit value of a signal, which is output from the high-order 2 bit in the register portion before passing through the AND circuit. This is because the bit value does not change between before and after passing through the AND circuit regardless of the bit value (0 or 1) to be input to the AND circuit if the bit value of a switching signal input to an AND circuit is 1. Accordingly, the 10-bit digital voltage signal in the register portion is output to the converter as it is. Thereafter, the converter converts the 10-bit digital voltage signal into an analog data voltage. The obtained analog data voltage is output to the data line.

In the image display mode, the 8-bit digital voltage signal output from the data signal generating circuit 26 is stored in the register portion. Thereafter, a 10-bit digital voltage signal is output from the register portion to the converter. The high-order 2 bit of the digital voltage signal is 0. This is because the bit value is 0 after the signal passes through the AND circuit regardless of the bit value (0 or 1) to be input to the AND circuit if the bit value of a switching signal input from the high-order 2 bit in the register portion to an AND circuit is 0. Accordingly, the high-order 2 bit of the 10-bit digital voltage signal to be input to the converter is always 0 in the image display mode. Thereafter, the converter converts the digital voltage signal into an analog data voltage. The obtained analog data voltage is output to the data line.

When the selection signal generating circuit 24 applies a voltage for setting an ON-state to the gate electrode of the switching transistor 34, an analog data voltage is applied to the gate electrode of the drive transistor 35. Consequently, drain current of a magnitude corresponding to the analog data voltage flows to the drive transistor 35. Thereafter, the drain current flows to the organic EL element 40 to cause light emission from the organic EL element 40.

Figure 25:
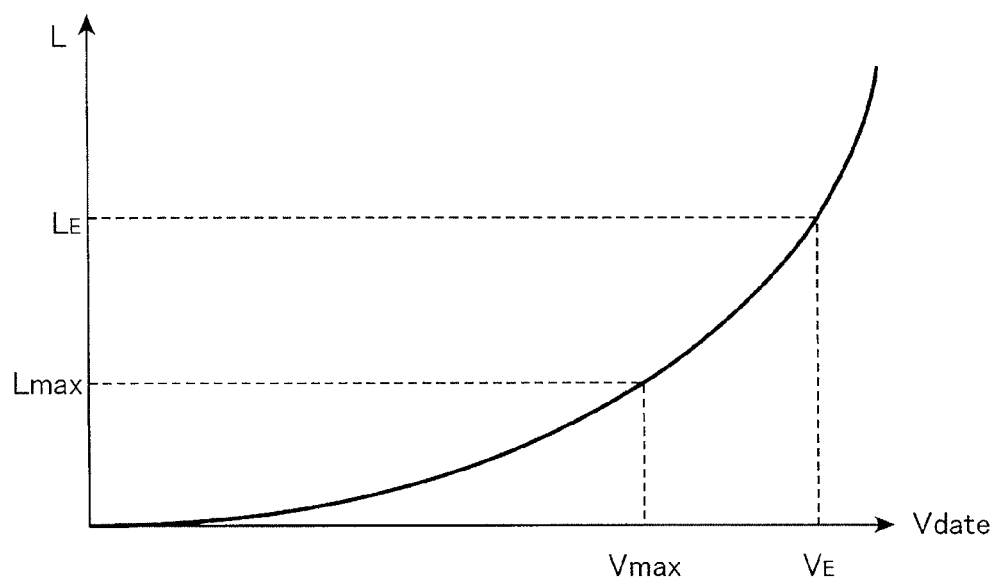
FIG. 25 is a graph showing an operation to be performed by the display device depicted in FIG. 23.

FIG. 25 is a graph showing an operation to be performed by the display device 1 depicted in FIG. 23. The operation of the display device 1 is described with reference to FIG. 25.

The horizontal axis of the graph in FIG. 25 indicates a magnitude of an analog data voltage Vdata to be applied to the gate electrode of the drive transistor 35. The vertical axis of the graph in FIG. 25 indicates luminance L of the organic EL element 40 under application of the analog data voltage Vdata. Vmax indicated on the horizontal axis of the graph in FIG. 25 means the maximum voltage required for light emission with the maximum luminance in the image display mode. VE indicated on the horizontal axis of the graph in FIG. 25 means a voltage required for the aging process.

As shown in FIG. 25, the luminance L of the organic EL element 40 tends to increase as the voltage Vdata to be applied to the organic EL element 40 increases. In the image display mode, the controller 20 in the display device 1 applies a voltage required for image display. Likewise, the controller 20 in the display device 1 applies the voltage VE required for the aging process in the aging mode. The luminance LE of the organic EL element 40 subjected to the aging process is larger than Lmax because VE is larger than Vmax. Accordingly, the aging time is shortened.

As described above, the controller 20 applies the high voltage VE for the aging process to the organic EL element 40 in the aging mode. Since the emission element emits light with luminance larger in the aging mode than the maximum luminance in the image display mode, the aging time is shortened. The power supply 10 and the circuits of the pixel circuit 30 in the display device 1 are designed to withstand a voltage higher than the voltage to be applied in the image display mode. For example, the power supply 10 is designed to withstand a power supply voltage larger than the maximum power supply voltage required for image display. The switching transistor 34 and the drive transistor 35 are designed to have voltage resistance characteristics against the high voltage VE for the aging process. VE is 1.5 to 2 times as large as Vmax. LE is two to three times as large as Lmax. The aging time is 2 to 3 hours under the aforementioned condition.

Figure 26:
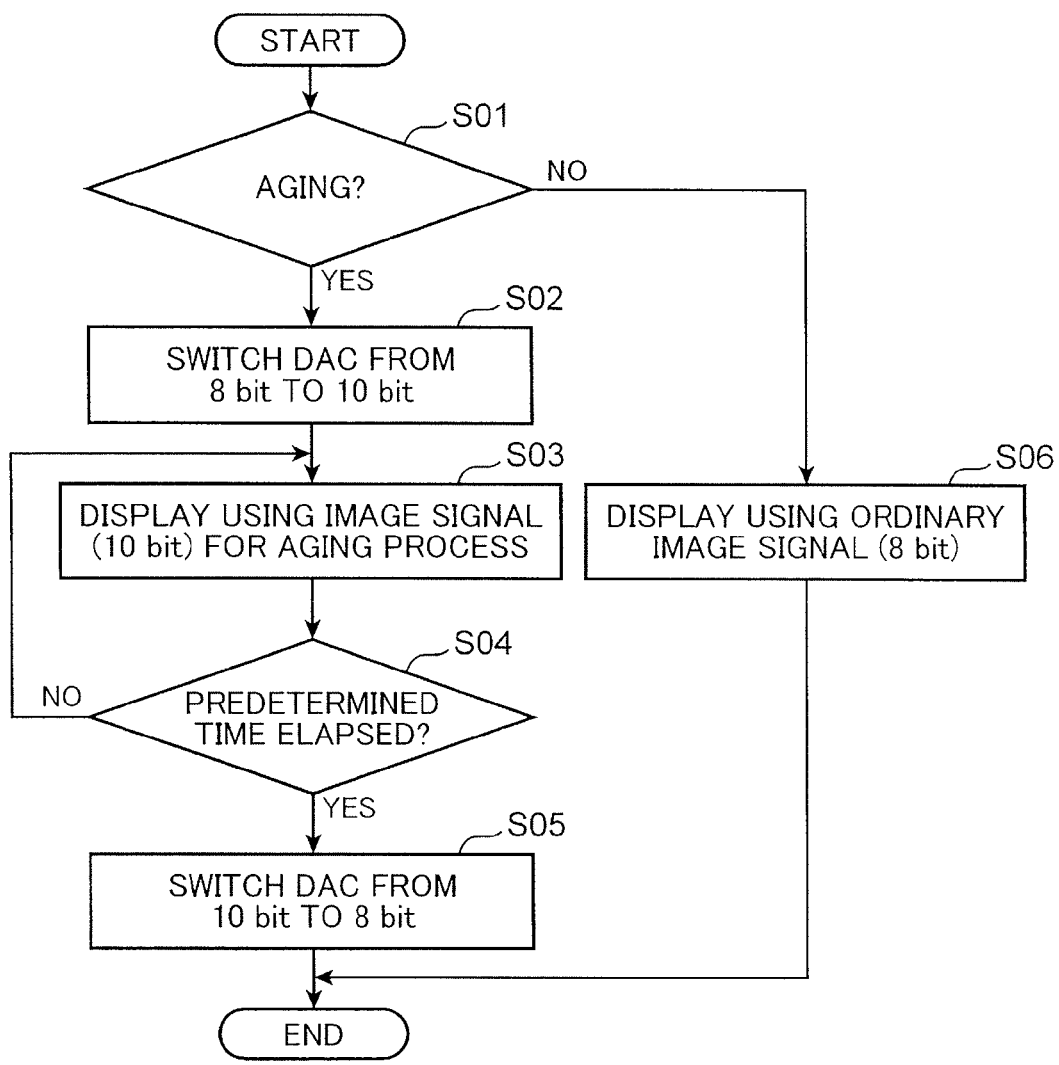
FIG. 26 is a flowchart showing an operation to be performed by the display device in the aging mode and the image display mode.

FIG. 26 is a flowchart of an operation to be performed by the display device 1 in the aging mode and the image display mode. The operation of the display device 1 is described with reference to FIG. 26.

The controller 20 determines whether the aging process is to be performed (in Step S01). For example, an operator may operate the display device 1 and input an operation signal to the controller 20 if the operator decides to perform the aging process. The controller 20 performs the aging process in response to the input of the operation signal instructing execution of the aging process. Otherwise, the controller 20 does not perform the aging process.

If it is determined that the aging process is performed (YES in Step S01), the controller 20 switches the bit number of a signal to be processed by the DAC 28 from 8 to 10 bit (in Step S02). For example, the controller 20 outputs a switching signal 1 to the AND circuit provided in the DAC 28.

Thereafter, the display device 1 uses a 10-bit image signal for the aging mode to perform a display operation (in Step S03). For example, the controller 20 outputs a selection voltage to the selecting line 31 corresponding to the first row via the selection signal generating circuit 24. In addition, the controller 20 outputs a 10-bit digital component signal to the data signal generating circuit 26 for allowing the DAC 28 to output the analog data voltage VE for the aging process. Thereafter, the data signal generating circuit 26 converts the 10-bit digital component signal into a 10-bit R, G, B digital luminance signal. Thereafter, the data signal generating circuit 26 converts the R, G, B digital luminance signal into a 10-bit digital voltage signal. Accordingly, the DAC 28 acquires the 10-bit digital voltage signal. The DAC 28 converts the 10-bit digital voltage signal into the analog data voltage VE. The analog data voltage VE is applied to the gate electrode of the drive transistor 35 via the data line 32 and the switching transistor 34. Consequently, current in correspondence to the analog data voltage VE flows from the drive transistor 35 to the organic EL elements 40 to cause light emission from the organic EL elements 40. The aforementioned emission operation for one row is repeated from the second row to the last row of the luminescent panel 100, so that one-frame display is completed.

When the one-frame display is completed, the controller 20 determines whether a predetermined time passes (in Step S04). When the controller 20 determines that a predetermined time does not pass (NO in Step S04), the process of Step S03 is performed again. When the controller 20 determines that a predetermined time passes (YES in Step S04), the process of Step S05 is performed. Consequently, the aging process for causing light emission from the organic EL elements 40 with high luminance is appropriately performed for a predetermined time. The predetermined time as a reference for determining the aging completion may be set in advance on the basis of a relationship between an accumulated emission time of luminance and maximum luminance. For example, the predetermined time as a reference for determining the aging completion may be set in advance in accordance with a target maximum luminance of the emission element immediately after the aging process.

When the aging process is completed, the controller 20 switches the bit number of a signal to be processed by the DAC 28 from 10 to 8 bit (in Step S05). For example, the controller 20 outputs a switching signal 0 to the AND circuit provided in the DAC 28.

Unless the aging process is performed (NO in Step S01), the display device 1 uses ordinary luminance signals to display images (in Step S06). For example, the controller 20 outputs an 8-bit digital component signal to the data signal generating circuit 26 for allowing the DAC 28 to output an analog data voltage Vmax for the image display mode. The data signal generating circuit 26 converts the 8-bit digital component signal into an 8-bit R, G, B digital luminance signal. The data signal generating circuit 26 further converts the R, G, B digital luminance signal into an 8-bit digital voltage signal. Accordingly, the DAC 28 acquires the 8-bit digital voltage signal. Thereafter, the DAC 28 converts the 8-bit digital voltage signal into an analog data voltage Vmax. When the DAC 28 outputs the analog data voltage Vmax to the switching transistor 34 via the data line 32, the analog data voltage Vmax is applied to the gate electrode of the drive transistor 35 via the data line 32 and the switching transistor 34. Consequently, current in correspondence to the analog data voltage Vmax flows to the organic EL elements 40 to cause light emission from the organic EL elements 40. One-frame display is completed by repetition of the aforementioned process from the second row to the last row.

As described above, the emission elements emit light with larger luminance in the aging mode than the maximum luminance in the image display mode. Accordingly, the aging process techniques in the embodiment shortens the aging time, as compared with conventional aging processes of emitting light with luminance in the image display mode. In addition, the aging process techniques in the embodiment do not require an external aging device for the aging process. Therefore, the aging process techniques in the embodiment may suppress lowering of throughput. In short, the aging process techniques in the embodiment may shorten the aging time and enhance the throughput.

It is necessary to prepare external aging devices as many as display devices, in order to perform concurrent aging processes with use of the external aging devices for the display devices before shipment. Operating the aging devices in a factory requires a complicated factory facility. In addition, use of the external aging devices may damage circuits because of intrusion of external static electricity through connection terminals for applying a voltage to the emission elements. Since the aging process techniques in the embodiment allow the aging process without an external aging device, a factory facility may not be complicated and there is a low risk of short-circuiting.

According to the aging process techniques in the embodiment, a user decides whether the aging process is performed. Thereafter, the controller 20 switches the bit number of a digital voltage signal to be processed by the DAC 28 in accordance with the user's decision (the aging mode or the image display mode). Accordingly, the high-order 2-bit is masked to 0 in the image display mode even if noise data from other home appliances such as a refrigerator is stored in the high-order 2-bit. Accordingly, the organic EL elements 40 are less likely to emit light with a luminance level in the image display mode as high as the luminance in the aging mode.

In the aforementioned description, the aging process is applied to the display device before shipment. Alternatively, the aging process in the embodiment may be applied to the display device after shipment. A user may select one of the aging mode and the image display mode after the shipment, and operate the display device in the selected mode, which results in a simplified aging process. For example, the aging process techniques in the embodiment do not require an external aging device for troubleshooting the display device after the shipment. Accordingly, the user may perform the aging process on-site without returning the display device to the factory. The on-site aging process is very useful if the maximum luminance of emission elements varies after the shipment.

In Step S04 in the flowchart of FIG. 26, it is determined that the aging process is completed if a predetermined time passes after the start of the aging process. Alternatively, luminance of emission elements may be directly detected with use of sensors. Completion of the aging process may be decided on the basis of a determination whether a value of luminance detected by the sensor exceeds a predetermined luminance.

In the embodiment, the controller outputs a switching signal to the DAC for changing the bit number of a digital signal to be processed by the DAC. Alternatively, a switching signal for controlling the bit number may be added to data to be output from the data generating circuit. In this case, control for switching the bit number is executed without a switching signal to be output from the controller to the DAC.

In the embodiment, the bit number of a digital signal to be processed by the DAC is switched between 8 bit and 10 bit. Alternatively, the bit number of a digital signal may be decided in accordance with a ratio of the analog data voltage VE in the aging mode to the voltage Vmax in correspondence to the maximum luminance in the image display mode. For example, if VE is two times or less as large as Vmax, the bit number of a digital signal to be processed by the DAC may be switched between 8 bit and 9 bit. If VE is more than two times and less than four times as large as Vmax, the bit number of a digital signal to be processed by the DAC may be switched between 8 bit and 10 bit.

<Third Embodiment>

The aging process techniques utilizing regional division different from the regional division in the first embodiment is described in the third embodiment.

(Method for Manufacturing Display Device)

Figure 27:
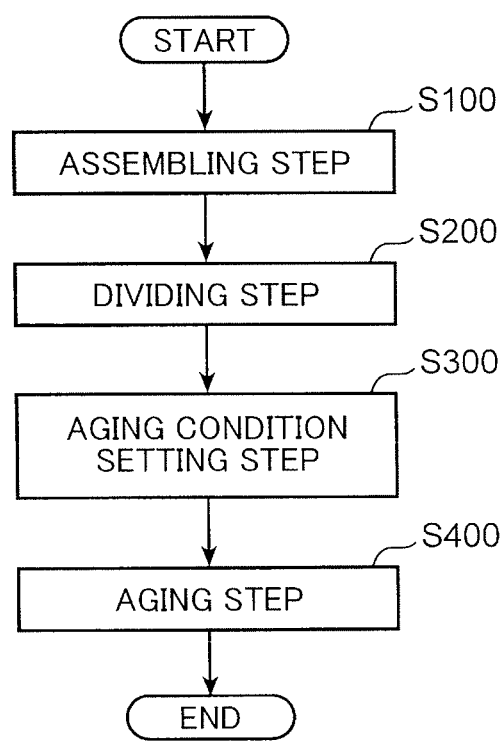
FIG. 27 is a schematic flowchart of a method for manufacturing the display device configured to display images.

FIG. 27 is a schematic flowchart of a method for manufacturing a display device for displaying images. The method for manufacturing a display device is schematically described with reference to FIG. 27.

(Step S100)

In the method for manufacturing a display device, the assembling step (Step S100) is performed at first. A luminescent panel including a luminescent area for displaying images and a circuit board for driving the luminescent panel are prepared in the assembling step. Thereafter, the circuit board is mounted on the luminescent panel. An assembly of the luminescent panel and the circuit board and a temperature distribution of the luminescent panel when the luminescent panel is driven by the circuit board are described later. Step S200 is performed after the circuit board is mounted on the luminescent panel.

(Step S200)

In Step S200, the dividing step is performed to divide the luminescent area into segment areas. In the embodiment, the luminescent area is divided into the segment areas on the basis of a temperature distribution of the luminescent panel when the luminescent panel is driven by the circuit board. The method for dividing the luminescent area into the segment areas is described later. Step S300 is performed after the luminescent area is divided into the segment areas.

(Step S300)

In Step S300, an aging condition is set for each of the segment areas (an aging condition setting step). As described above, the luminescent area is divided into the segment areas on the basis of a temperature distribution of the luminescent panel when the luminescent panel is driven by the circuit board. Accordingly, if the aging condition is appropriately set for each of the segment areas, the aging condition is adjusted in accordance with a temperature distribution in the luminescent area caused by heat which is generated from the luminescent panel driven for displaying images. Step S400 is performed after the aging condition is set for each of the segment areas defined in the luminescent area.

(Step S400)

In Step S400, the aging process is performed for each of the segment areas under the aging condition set in the aging condition setting step (an aging step). The aging process for each of the segment areas is described later.

(Assembly Obtained in Assembling Step)

Figure 28:
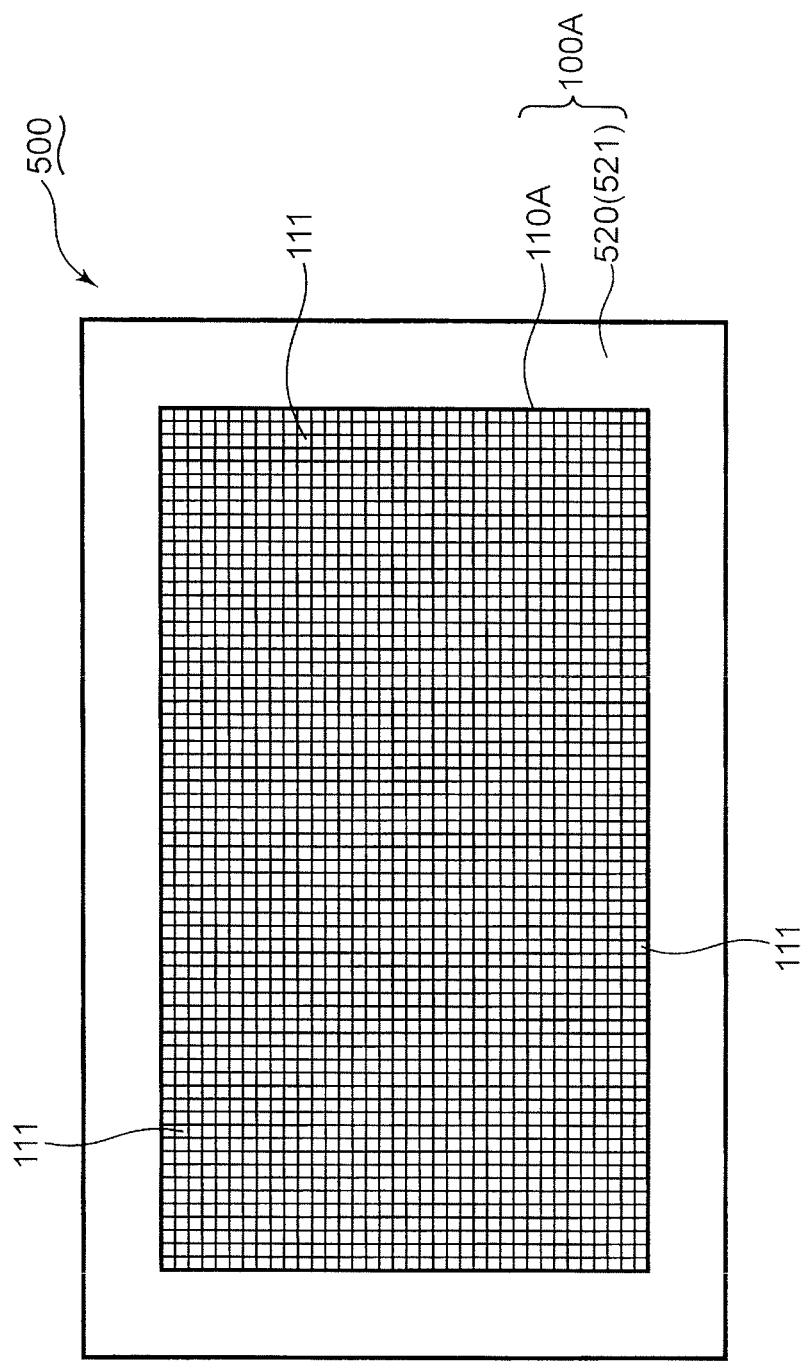
FIG. 28 is a schematic front view of an assembly obtained by assembling in an assembling step of the manufacturing method shown in FIG. 27.
Figure 29:
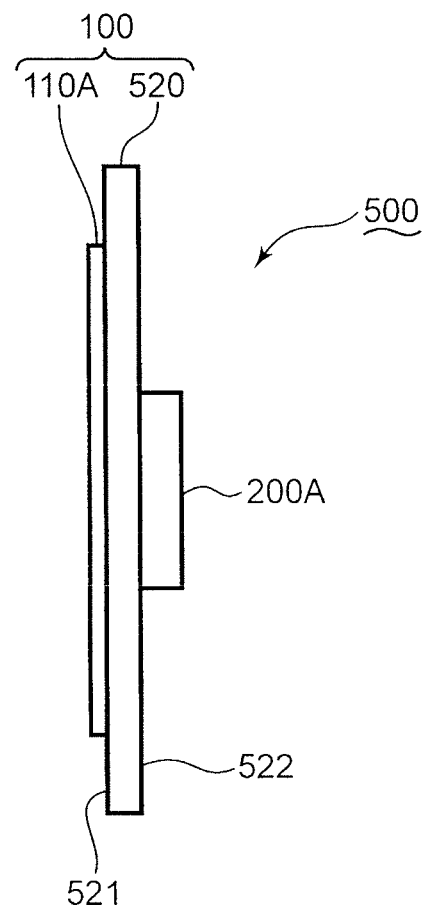
FIG. 29 is a schematic side view of the assembly shown in FIG. 28.
Figure 30:
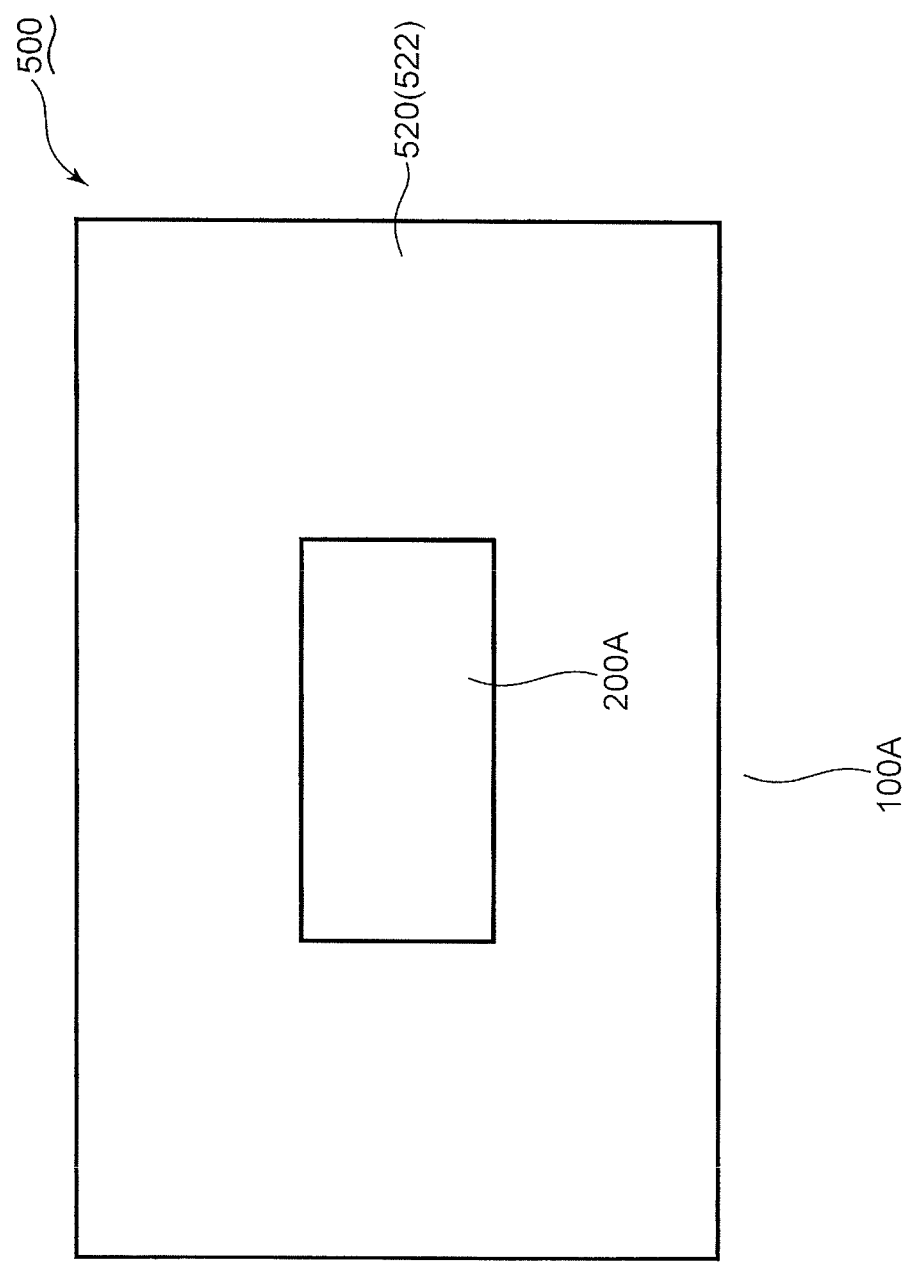
FIG. 30 is a schematic rear view of the assembly shown in FIG. 28.

FIG. 28 is a schematic front view of an assembly 500 obtained in the assembling step. FIG. 29 is a schematic side view of the assembly 500 shown in FIG. 28. FIG. 30 is a schematic rear view of the assembly 500 shown in FIG. 28. The assembly 500 is described with reference to FIGS. 28 to 30.

As described above, the assembly 500 includes a luminescent panel 100A and a circuit board 200A. As shown in FIG. 28, the luminescent panel 100A includes emission pixels 111, which are arranged in a matrix pattern so that a rectangular luminescent area 110A is defined, and a substrate 520 for supporting each of the emission pixels Ill. As shown in FIG. 29, the substrate 520 includes a first surface 521, on which the luminescent area 110A is formed, and a second surface 522 opposite to the first surface 521.

As shown in FIGS. 29 and 30, the circuit board 200A is mounted on the second surface 522 of the substrate 520 in the assembling step. The circuit board 200A is electrically connected to each of the emission pixels 111 for driving each of the emission pixels 111. In the embodiment, the circuit board 200A functions as a heat source which generates a non-uniform temperature distribution in the luminescent area 110A. The display device may include another heat source which generates heat in the luminescent panel for displaying images to cause a non-uniform temperature distribution in the luminescent area.

(Temperature Distribution in Luminescent Area)

Figure 31:
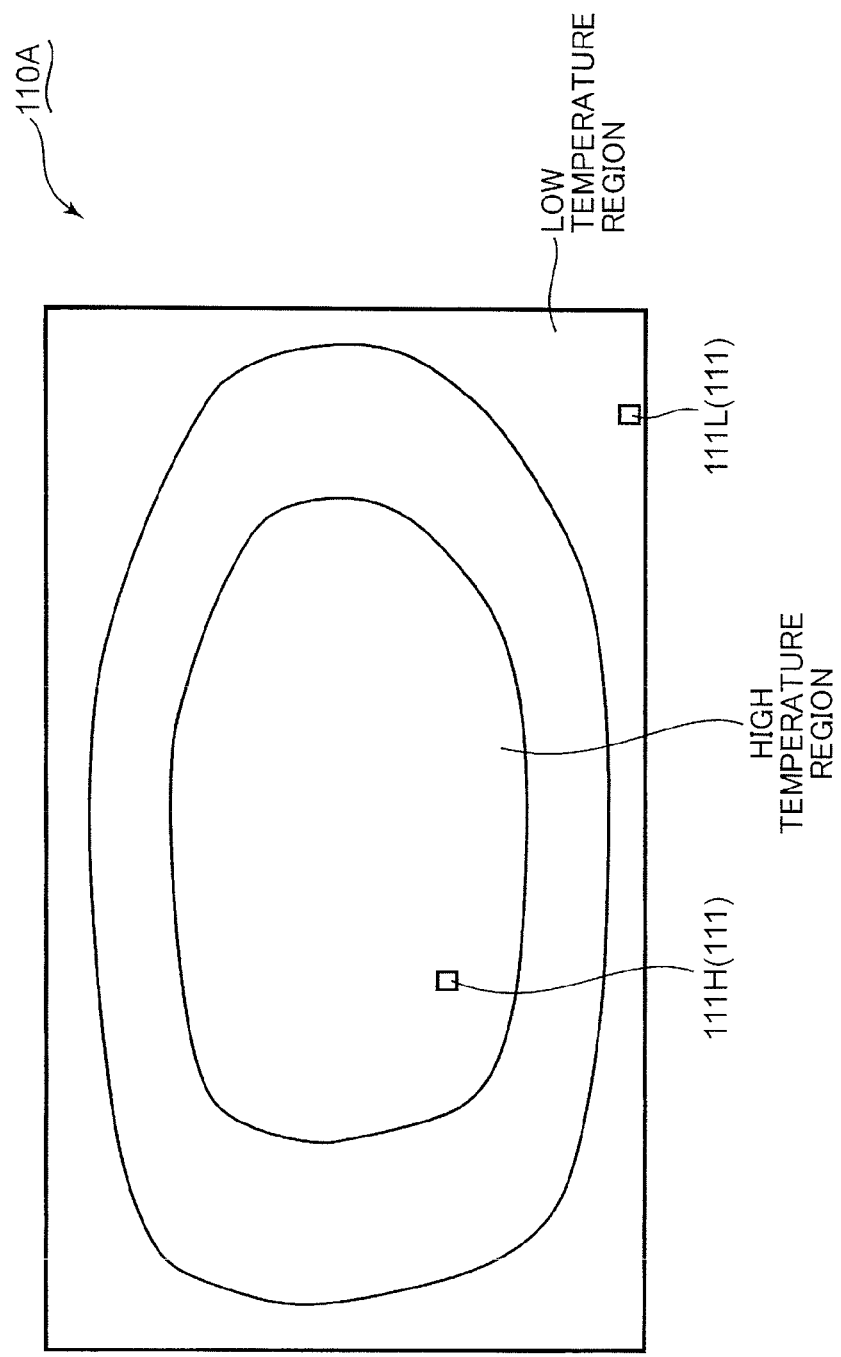
FIG. 31 is a schematic isothermal diagram showing a temperature distribution generated in a luminescent area of the assembly depicted in FIG. 28.

FIG. 31 is a schematic isothermal diagram showing a temperature distribution generated in the luminescent area 110A. The temperature distribution generated in the luminescent area 110A is described with reference to FIGS. 27, 30 and 31.

As shown in FIG. 30, the circuit board 200A in the embodiment is mounted substantially at the center of the substrate 520 (i.e. on the second surface 522 substantially in correspondence to the center of the luminescent area 110A). Accordingly, the middle region in the luminescent area 110A is heated to a high temperature as compared with other regions under uniform light emission from the luminescent area 110A with predetermined luminance (e.g. 60 cd/m$^2$). If the circuit board is mounted near a lower region in the luminescent area, the lower region in the luminescent area is heated to a high temperature, as compared with other regions. If the circuit board is mounted near an upper region in the luminescent area, the upper region in the luminescent area is heated to a high temperature, as compared with other regions. In the embodiment, the circuit board 200A may not be fixed to the second surface 522.

The isothermal diagram shown in FIG. 31 is exemplified as distribution data about a temperature distribution in the luminescent area 110A to be used as a reference in the dividing step or the aging condition setting step. The distribution data may be acquired in advance before the assembling step. In the aging condition setting step as described above, the aging condition is set on the basis of distribution data.

The distribution data may be preferably acquired from another display device manufactured under the same manufacturing condition as the manufacturing condition in which the display device in the embodiment is manufactured. For example, distribution data includes few errors resulting from mounting errors between the luminescent panel 100A and the circuit board 200A if another display device used for acquiring the distribution data is assembled in the same assembling line used in the assembling step of the luminescent panel 100A and the circuit board 200A of the display device in the embodiment. Alternatively, distribution data includes few errors resulting from exothermic characteristics of the circuit board if another display device used for acquiring distribution data is provided with a circuit board manufactured in the same manufacturing line as the circuit board 200A of the display device in the embodiment.

Further preferably, several display devices manufactured under a common manufacturing condition are prepared in order to acquire the temperature distribution data. If average data obtained by averaging temperature distribution data of the display devices in the dividing step or the aging condition setting step is used as a reference, the segment areas and the aging condition are appropriately set.

(Setting of Segment Areas)

Figure 32:
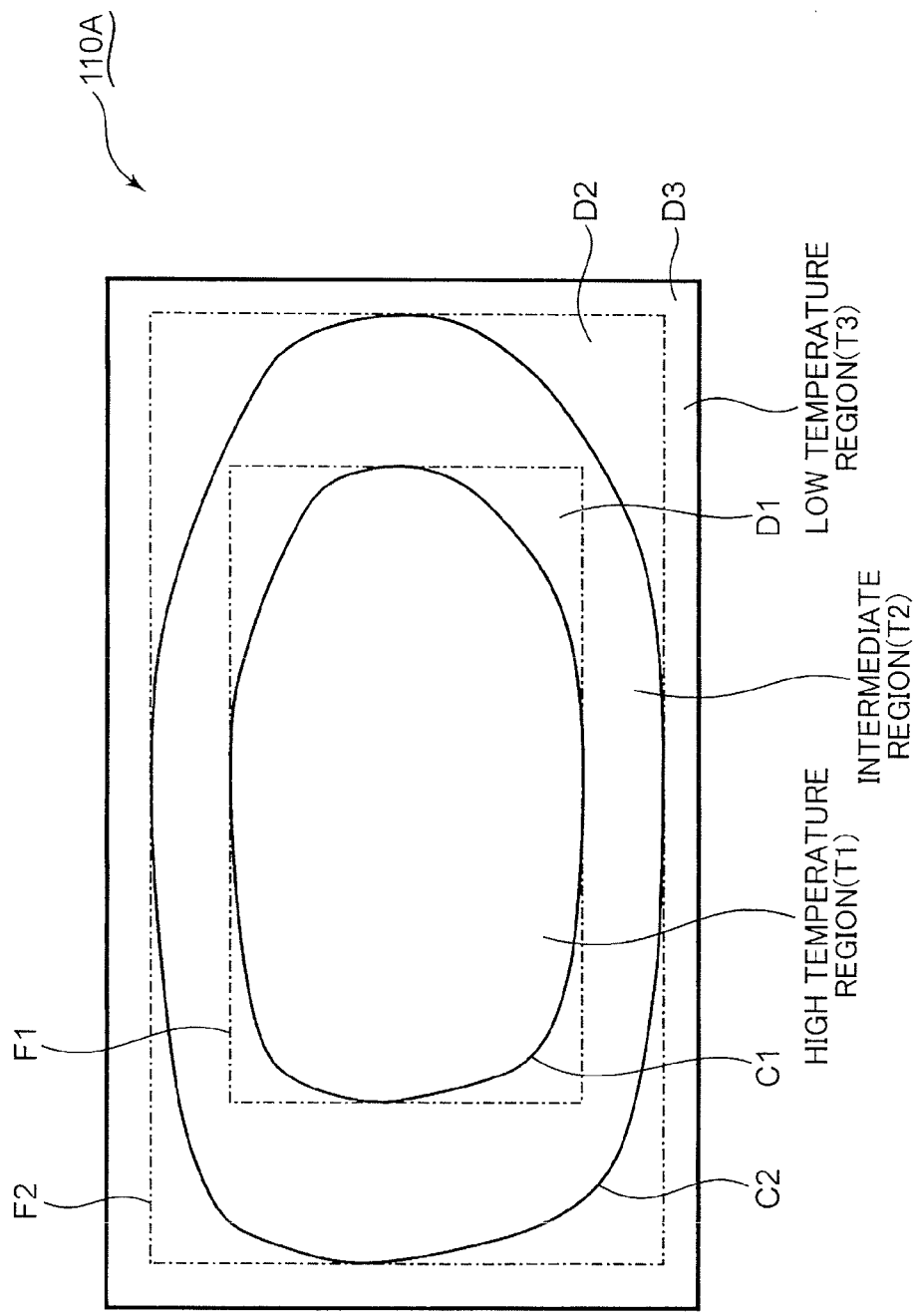
FIG. 32 is a schematic view of segment areas to be set in the luminescent area shown in FIG. 31.

FIG. 32 is a schematic view of segment areas set in the luminescent area 110A. The segment areas set in the luminescent area 110A are described with reference to FIGS. 27 and 32.

The isothermal line C1, which surrounds the smallest region, and the isothermal line C2, which surrounds the isothermal line C1, are illustrated in the luminescent area 110A shown in FIG. 32. The region surrounded by the isothermal line C1 has the highest temperature in the luminescent area 110A. In the following description, the region surrounded by the isothermal line C1 is called as "high temperature region". The region outside the isothermal line C2 has a relatively low temperature in the luminescent area 110A. In the following description, the region outside the isothermal line C2 is called as "low temperature region". The region defined by the isothermal lines C1. C2 has a temperature between the temperatures of the low and high temperature regions. In the following description, the region defined by the isothermal lines C1, C2 is called as "intermediate region".

A rectangular frame F1, which circumscribes the isothermal line C1, and a rectangular frame F2, which circumscribes the isothermal line C2, are illustrated in the luminescent area 110A shown in FIG. 32, in addition to the isothermal lines C1, C2. In the following description, the region in the rectangular frame F1 is called as "segment area D1", the region between the rectangular frames F1, F2 is called as "segment area D2", and the region outside the rectangular frame F2 is called as "segment area D3".

As shown in FIG. 32, if the segment areas D1 to D3 are defined by the rectangular frames F1, F2 which circumscribe the isothermal lines C1, C2, respectively, the segment areas D1 to D3 correspond to the temperature regions of a temperature distribution in the luminescent area 110A, respectively. In short, the segment area D1 corresponds to a temperature zone in the high temperature region. The segment area D2 corresponds to a temperature zone in the intermediate region. The segment area D3 corresponds to a temperature zone in the low temperature region.

If the temperature of the high temperature region is expressed by "T1", the temperature of the segment area D1 may be set to "T1" in the aging condition setting step. Alternatively, a correction value based on a geometric difference (a difference in area size and/or shape) between the high temperature region and the segment area D1 and the temperature "T1" of the high temperature region may be used to set the temperature of the segment area D1 in the aging condition setting step.

If the temperature of the intermediate region is expressed by "T2", the temperature of the segment area D2 may be set to "T2" in the aging condition setting step. Alternatively, a correction value based on a geometric difference (a difference in area size and/or shape) between the intermediate region and the segment area D2 and the temperature "T2" of the intermediate region may be used to set the temperature of the segment area D2 in the aging condition setting step.

If the temperature of the low temperature region is expressed by "T3", the temperature of the segment area D3 may be set to "T3" in the aging condition setting step. Alternatively, a correction value based on a geometric difference (a difference in area size and/or shape) between the low temperature region and the segment area D3 and the temperature "T3" of the low temperature region may be used to set the temperature of the segment area D3 in the aging condition setting step.

The rectangular frames F1, F2, which circumscribes the isothermal lines C1, C2, respectively, are used in setting the segment areas D1 to D3 shown in FIG. 32. Alternatively or additionally, a rectangular frame inscribing an isothermal line may be used for dividing the luminescent area. The number of isothermal lines as a reference for setting the segment areas may be "1", or may be larger than "2". An increase in the number of isothermal lines as a reference for setting the segment areas may result in fine reflection of the temperature distribution in the luminescent area to the aging condition to be set in the aging condition setting step. On the other hand, an increase in the number of isothermal lines as a reference for setting the segment areas may complicate the aging condition setting step and the aging step. Therefore, the segment areas may be set in light of the degree of adaptation for a temperature distribution and cumbersomeness in the aging condition setting step and the aging step.

Figure 33:
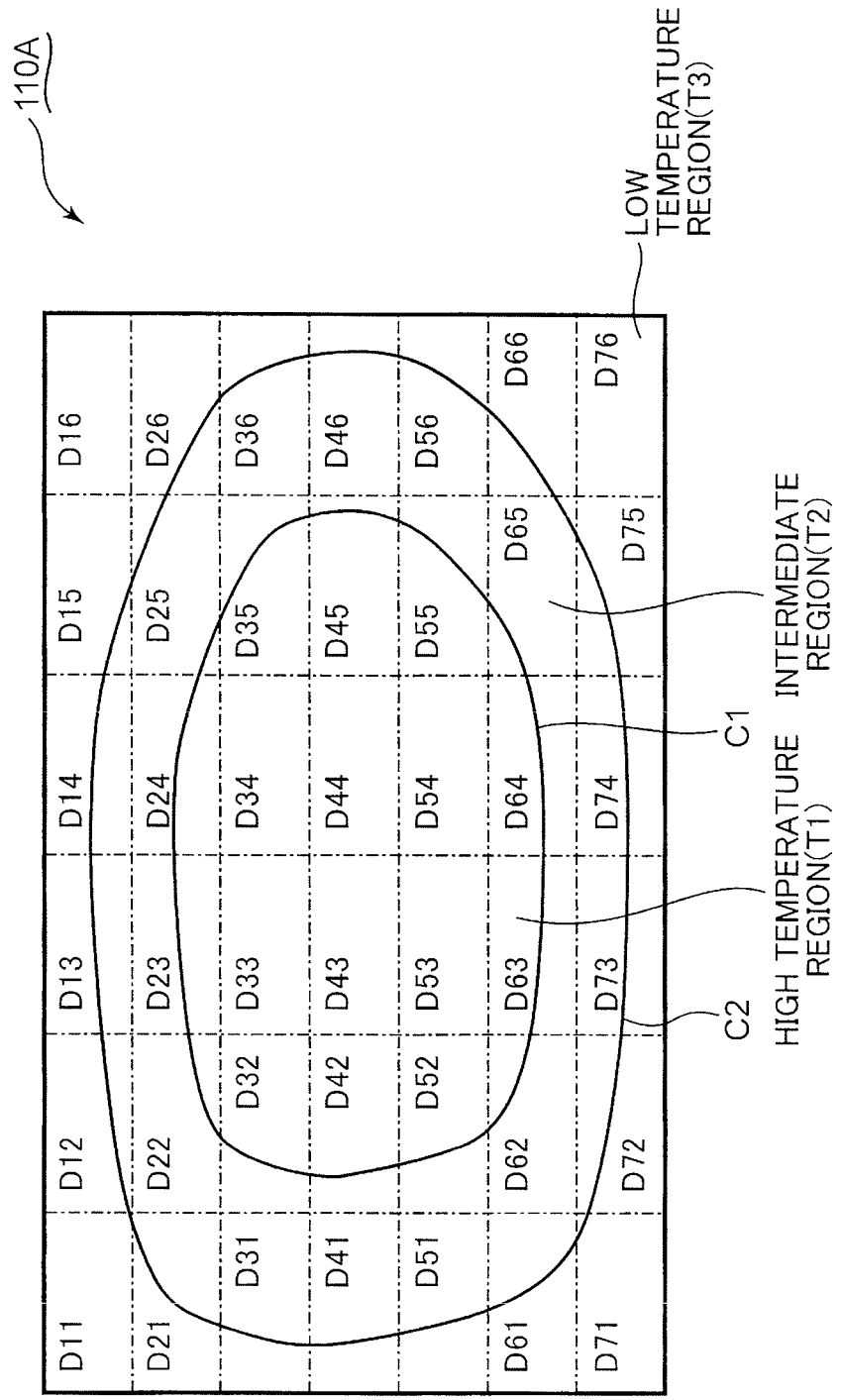
FIG. 33 is a schematic view of other segment areas to be set in the luminescent area shown in FIG. 31.

FIG. 33 is a schematic view of other segment areas set in the luminescent area 110A. The segment areas set in the luminescent area 110A are described with reference to FIGS. 27, 32 and 33.

Rectangular segment areas D11 to D76 arranged in a matrix pattern are depicted in the luminescent area 110A shown in FIG. 33. As shown in FIG. 33, the segment areas D11 to D76 may be set in the dividing step, independently of a temperature distribution generated in the luminescent area 110A. If temperatures corresponding to a temperature distribution are allocated to the segment areas D11 to D76 in the aging condition setting step after the dividing step to set the aging condition, the temperature distribution in the luminescent area 110A is finely reflected to the aging condition.

For example, the segment area D44 shown in FIG. 33 is included in the high temperature region. Accordingly, if the temperature of the high temperature region is expressed by "T1", the temperature of the segment area D11 may be set to "T1" in the aging condition setting step.

The segment area D22 shown in FIG. 33 includes the high temperature region and the intermediate region. Accordingly, if the temperature of the high temperature region is expressed by "T1" and the temperature of the intermediate region is expressed by "T2", the temperature of the segment area D22 may be set to a temperature between "T1" and "T2" in the aging condition setting step.

The segment area D11 shown in FIG. 33 is substantially included in the low temperature region. Accordingly, if the temperature of the low temperature region is expressed by "T3", the temperature of the segment area D11 may be set to "T3" in the aging condition setting step.

In FIG. 33, the luminescent area 110A is divided into a matrix pattern constituted of seven rows by six columns. The division pattern for dividing the luminescent area may be roughly or finely set, as compared with the pattern shown in FIG. 33. If a fine division pattern is set, the temperature distribution in the luminescent area is well reflected to the aging condition to be set in the aging condition setting step. On the other hand, fineness of the division pattern may complicate the aging condition setting step and the aging step. Therefore, the dividing pattern may be set in light of the degree of adaptation for a temperature distribution, and cumbersomeness in the aging condition setting step and the aging step.

In FIGS. 32 and 33, the segment areas are indicated by rectangular areas. Alternatively, the segment areas may be defined by areas of other shapes (other geometric shapes such as triangle or circle).

(Aging Condition Setting Step and Aging Step)

Figure 34:
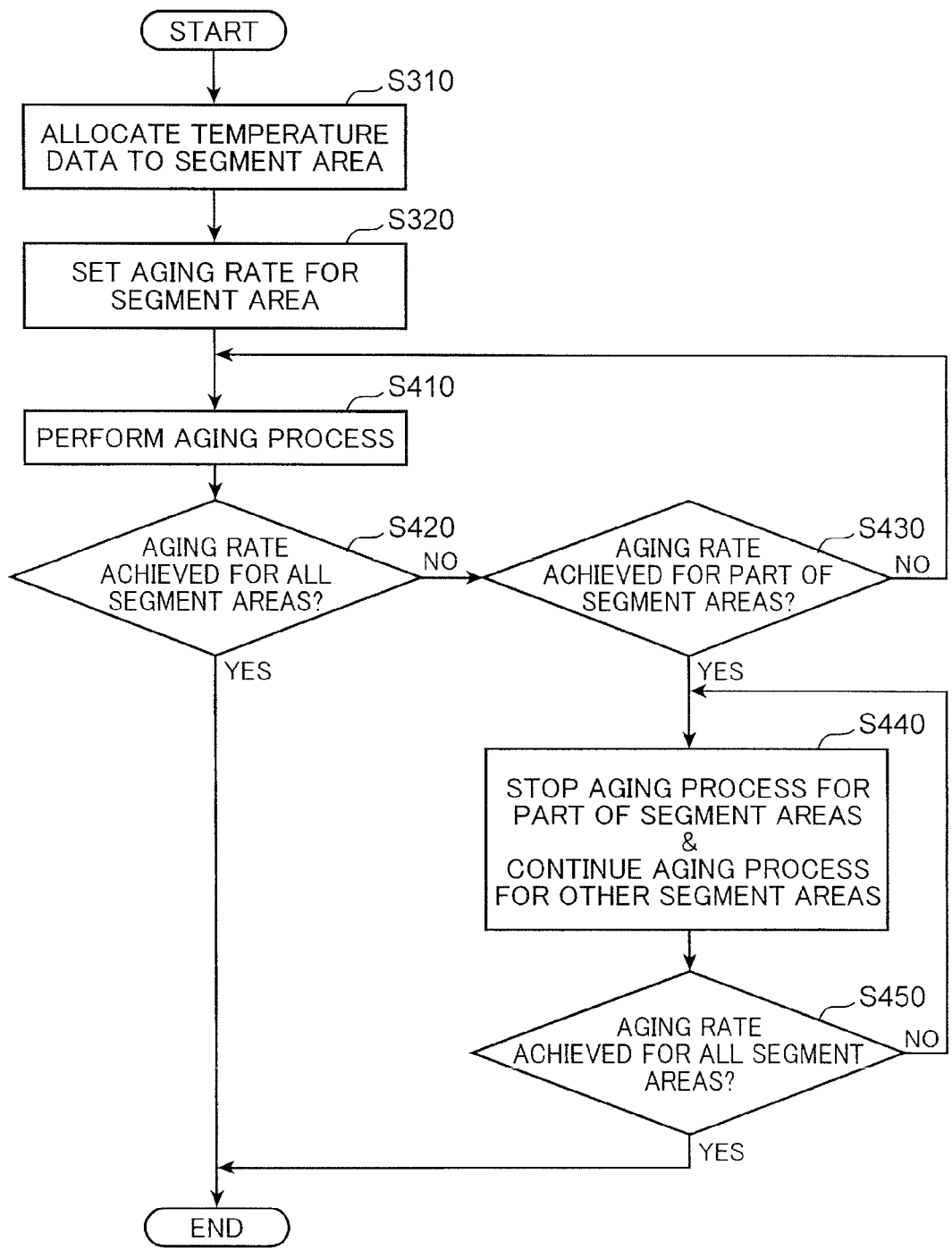
FIG. 34 is a flowchart schematically showing a sequence of an aging condition setting step and an aging step in the manufacturing method depicted in FIG. 27.

FIG. 34 is a flowchart schematically showing a sequence of the aging condition setting step and the aging step. FIG. 35 is a schematic view of the luminescent area 110A constituted of the segment areas D11 to D76 like FIG. 33. FIG. 36 is a schematic table showing the aging condition. The aging condition setting step and the aging step are described with reference to FIGS. 27 to 29 and FIGS. 33 to 36.

(Step S310)

Step S310 is performed after the luminescent area 110A is divided into the segment areas D11 to D76 in the dividing step described with reference to FIG. 27. As described with reference to FIG. 33, temperature data indicating a temperature distribution to be obtained under light emission from the whole of the luminescent area 110A with predetermined luminance is assigned to each of the segment areas D11 to D76 in Step S310.

FIG. 35 shows temperature data TD11 to TD76 assigned to each of the segment areas D11 to D76. As described with reference to FIG. 33, for example, the temperature data TD 44 assigned to the segment area D44 included in the high temperature region is set to be higher than the temperature data in other segment areas. The temperature data TD11 assigned to the segment area D11 substantially included in the low temperature region is set to be lower than the temperature of other segment areas. The temperature data TD22 assigned to the segment area D22 including the high temperature region and the intermediate region is set to be a temperature between the temperature data TD44 and the temperature data TD11. The relationship between these of the temperature data is expressed by the following formula. Step S320 is performed after the temperature data TD11 to TD76 are assigned to the segment areas D11 to D76, respectively.

$$TD44 > TD22 > TD11 \quad\quad \text{[Formula 4]}$$

(Step S320)

In Step S320, an aging rate is set for each of the segment areas D11 to D76, on the basis of the assigned temperature data TD11 to TD76. The aging rate may be defined by the following formula.

$$\text{aging rate [\%]} = (\text{pre-processing luminance} - \text{post-processing luminance})/\text{pre-processing luminance} \times 100\ [\%] \quad\quad \text{[Formula 5]}$$

In the aforementioned formula about the aging rate, "pre-processing luminance" means luminance of the emission pixel 111 before the aging process. For example, the pre-processing luminance means actual luminance of each of the segment areas D11 to D76 when a luminance signal instructing emission from each of the emission pixels 111 with predetermined luminance is output to the luminescent panel 100A by the circuit board 200A immediately after the "assembling step". "Post-processing luminance" means actual luminance obtained from each of the segment areas D11 to D76 by the same luminance signal after the aging process.

The aging condition is set so that the luminance of the emission pixel 111 after the aging step is lower than the luminance of the emission pixel 111 before the aging process. Accordingly, the aging rate is set to be in the range from 0% to 100%. The aforementioned definition of the aging rate is merely exemplary. Other appropriate definition indicating a degree of aging may be used as the aging rate.

FIG. 35 shows aging rates AR11 to AR76, which are set for the segment areas D11 to D76, respectively. A high aging rate is set for the segment areas assigned with temperature data indicating a high temperature. As described above, the temperature data TD44 assigned to the segment area D44 indicates a temperature higher than temperatures of other segment areas (e.g. the segment area D22 or D1). Accordingly, the aging rate AR44 set for the segment area D44 is higher than aging rates set for other areas (e.g. the aging rate AR22 set for the segment area D22 or the aging area AR11 set for the segment area D11). The temperature data TD1 assigned for the segment area D11 indicates a temperature lower than temperatures of other segment areas (e.g. the segment area D22 or D44). Accordingly, the aging rate AR11 set for the segment area D11 is lower than aging rates set for other areas (e.g. the aging rate AR22 set for the segment area D22 or the aging rate AR44 set for the segment area D44). As described above, the temperature data TD22 assigned to the segment area D22 indicates a temperature between the temperature data TD11 assigned to the segment area D11 and the temperature data TD44 assigned to the segment area D44. Accordingly, the aging rate AR22, which is between the aging rate AR11 set for the segment area D11 and the aging rate AR44 set for the segment area D44, is set for the segment area D22.

As shown in FIG. 36, for example, if a temperature rise by more than 10° C. from a reference temperature (e.g. 25° C.) is observed in the segment area D11 on the basis of a temperature distribution (c.f. FIG. 33) generated by heat of the circuit board 200A under light emission from the whole of the luminescent area 110A with predetermined pre-processing luminance (e.g. "60 cd/m$^2$"), the aging rate AR11 of "5%" is set for the segment area D11 (in short, the aging rate AR 11 is set so that the post-processing luminance goes down by 5% from the pre-processing luminance). For example, if a temperature rise by more than 25° C. from the reference temperature is observed in the segment area D22, the aging rate AR22 of "14%" is set for the segment area D22 (in other words, the aging rate AR22 is set so that the post-processing luminance goes down by 14% from the pre-processing luminance). For example, if a temperature rise by more than 50° C. is observed in the segment area D44, the aging rate AR44 of "32%" is set for the segment area D44 (in other words, the aging rate AR44 is set so that the post-processing luminance goes down by 32% from the pre-processing luminance). As described above, when a temperature rise by more than 10° C. from the reference temperature is observed in the segment area D11, the segment area D11 is exemplified as the first segment area. When a temperature rise by more than 25° C. from the reference temperature is observed in the segment area D22, the segment area D22 is exemplified as the second segment area. When a temperature rise by more than 50° C. from the reference temperature is observed in the segment area D33, the segment area D33 is exemplified as the third segment area. The relationship between these aging rates is expressed by the following formula.

$$AR44 > AR22 > AR11 \quad\quad \text{[Formula 6]}$$

In the aforementioned description, a temperature which is increased from the reference temperature (room temperature) is used for setting the aging rate. Alternatively, a temperature difference of the segment areas D11 to D76 from an average temperature of the whole of the luminescent area 110A under light emission from the whole of the luminescent area 110A with predetermined pre-processing luminance (e.g. "60 cd/m$^2$") may be used for setting the aging rate.

Step S410 is performed after the aging rates AR11 to AR76 are set for the segment areas D11 to D76, respectively. Steps S310, S320 are included in the aging condition setting step described with reference to FIG. 27. The steps after Step S410 are included in the aging step.

(Step S410)

In Step S410, the aging process is performed for each of the segment areas D11 to D76. In the embodiment, there is continuous light emission from the segment areas D11 to D76 with predetermined luminance (e.g. "60 cd/m$^2$"). Alternatively, the segment areas D11 to D76 may be uniformly heated to a predetermined temperature (a heating process). Further alternatively, the segment areas D11 to D76 may be driven with a high frequency such as 120 Hz or 180 Hz (a high frequency driving process). Further alternatively, the continuous emission process, the heating process, and the high frequency driving process may be combined with each other for the aging process. Step S420 is performed after the continuous light emission from the segment areas D11 to D76 for a predetermined period of time.
(Step S420)

In Step S420, it is determined whether the aging rate set in Step S320 is achieved for all the segment areas D11 to D76. When the aging rates set for all the segment areas D11 to D76 are achieved, the aging step is finished. Unless a part or all of the segment areas D11 to D76 achieves the aging rate, Step S430 is performed.
(Step S430)

In Step S430, it is determined whether a part of the segment areas D11 to D76 achieves the set aging rate, or none of the segment areas D11 to D76 achieves the set aging rate. When a part of the segment areas D11 to D76 achieves the set aging rate, Step S440 is performed. Otherwise, Step S410 is performed again.
(Step S440)

In Step S440, the aging process for the part of the segment areas which achieves the set aging rate is stopped. On the other hand, the aging process for other segment areas which does not achieve the set aging rate is continued. When the aging process is continued for the other segment areas for a predetermined period of time, Step S450 is performed.
(Step S450)

In Step S450, it is determined whether all the segment areas D11 to D76 achieve the aging rate set in Step S320. When all of the segment areas D11 to D76 achieve the set aging rate, the aging step is finished. Unless a part of the segment areas D11 to D76 achieves the aging rate, Step S440 is performed again.

Figure 37:
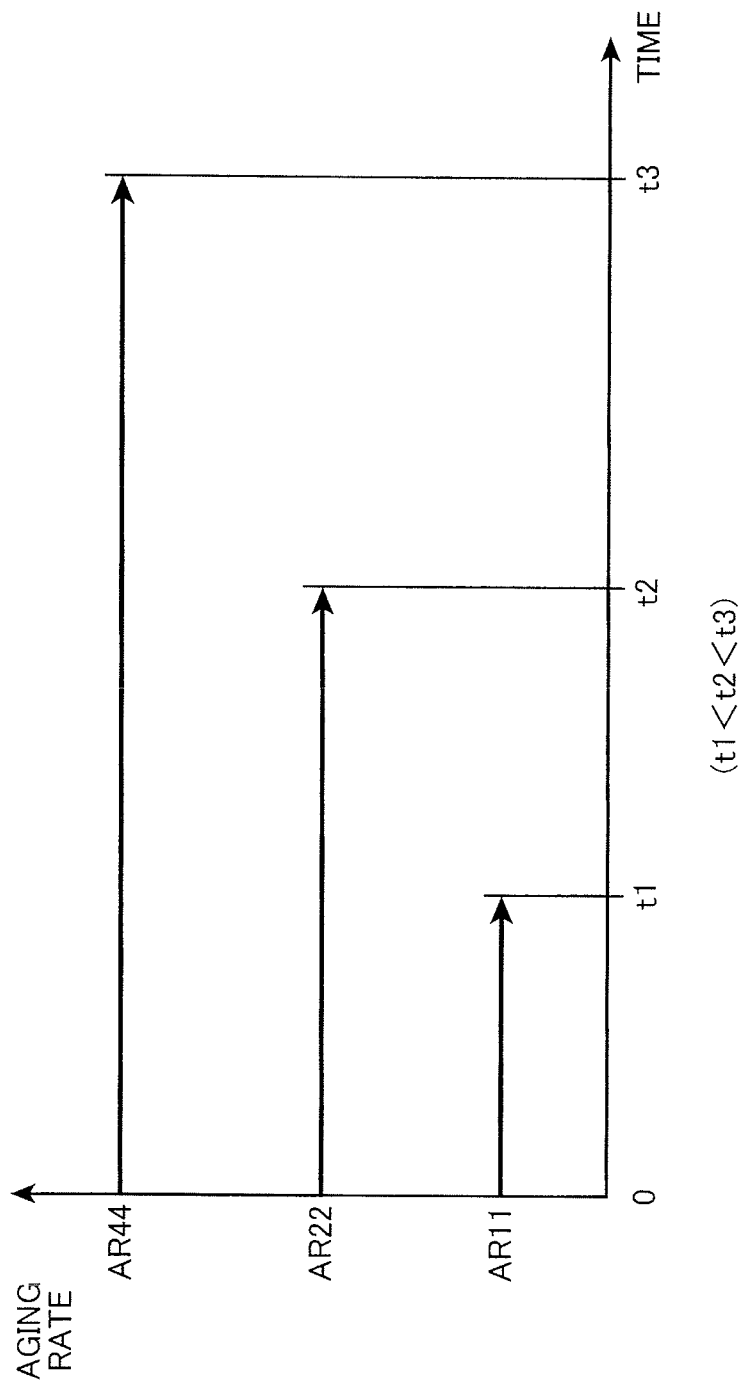
FIG. 37 is a schematic chart showing a period of time required for the aging process depicted in FIG. 34.

FIG. 37 is a schematic chart showing a period of time required for the aging process. A period of time required for the aging process is described with reference to FIGS. 27 to 29, 34, 35 and 37.

The horizontal axis in the chart of FIG. 37 indicates an elapsed time from the point of time when the aging process is started. The vertical axis in the chart of FIG. 37 indicates a magnitude of the aging rate described with reference to FIG. 34.

With the sequence from Steps S410 to S450 described with reference to FIG. 34, an aging process for a relatively long period of time (i.e. an emission process with predetermined luminance, a heating process at a predetermined temperature and/or a high frequency driving process with a predetermined frequency) is performed for a segment area (e.g. the segment area D44), in which a high aging rate is set. An aging process for a relatively short period of time is performed for a segment area (e.g. the segment area D11), in which a low aging rate is set. Consequently, the aging process under the condition set in the aging condition setting step is achieved.

For example, if it takes time "t3" for the aging process of the segment area D44 in which the aging rate AR44 of a relatively large value is set, the aging process of the segment area D11, in which the aging rate AR11 smaller than the aging rate AR44 is set, takes time "t1" which is shorter than the time "t3". The time "t2" required for the aging process of the segment area D22, in which the aging rate AR22 between the aging rate AR44 and the aging rate AR11 is set, is longer than the time "t1" but shorter than the time "t3".

In the embodiment, different aging processing times are set for each of the segment areas D11 to D76. Alternatively, different aging processing conditions may be set for each of the segment areas D11 to D76. In Step S410 described with reference to FIG. 34, there may be light emission with higher luminance from the segment area D44, in which the aging rate AR44 of a relatively large value is set, than other segment areas (e.g. the segment area D11 or D22). There may be light emission with lower luminance from the segment area D11, in which the aging rate AR11 of a relatively small value is set, than other segment areas (e.g. the segment area D44 or D22). In Step S410, there may be light emission from the segment area D22, in which the aging rate AR22 between the aging rate AR44 and the aging rate AR11 is set, with higher luminance than from the segment area D11 but lower luminance than from the segment area D44.

Further alternatively, in Step S410 described with reference to FIG. 34, the segment area D44, in which the aging rate AR44 of a relatively large value is set, may be exposed to a temperature condition higher than temperature conditions of other areas (e.g. the segment area D11 or D22). A lower temperature condition may be applied to the segment area D11, in which the aging rate AR11 of a relatively small value is set, than temperature conditions applied to other areas (e.g. the segment area D44 or D22). In Step S410, the segment area D22, in which the aging rate AR22 between the aging rate AR44 and the aging rate AR11 is set, may be exposed to a temperature condition higher than the temperature condition of the segment area D11 but lower than the temperature condition of the segment area D44.

Further alternatively, in Step S410 described with reference to FIG. 34, a high frequency driving process with a frequency higher than frequencies for other areas (e.g. the segment area D11 or D22) may be performed for the segment area D44, in which the aging rate AR44 of a relatively large value is set. Further alternatively, a high frequency driving process with a frequency lower than frequencies for other areas (e.g. the segment area D44 or D22) may be performed for the segment area D11, in which the aging rate AR11 of a relatively small value is set. In Step S410, a high frequency driving process with a frequency higher than the frequency for the segment area D11 but lower than the frequency for the segment area D44 may be performed for the segment area D22, in which the aging rate AR22 between the aging rate AR44 and the aging rate AR11 is set.

As described above, a difference in time required for the aging process among the segment areas D11 to D76 may be reduced by changing luminance, a temperature and/or a frequency of AC voltage for each of the segment areas D11 to D76. Ideally, as a result of adjustment to luminance, temperature and/or frequency of AC voltage for each of the segment areas D11 to D76, the time required for the aging process becomes consistent over the whole of the segment areas D11 to D76.

After completion of the aging step, setting of the circuit board 200A may be adjusted. After the adjustment to the setting of the circuit board 200A, the circuit board 200A may apply a signal current for driving each of the emission pixels 111 on the basis of the aging condition described with reference to FIG. 34.
(Display Device)

Figure 38:
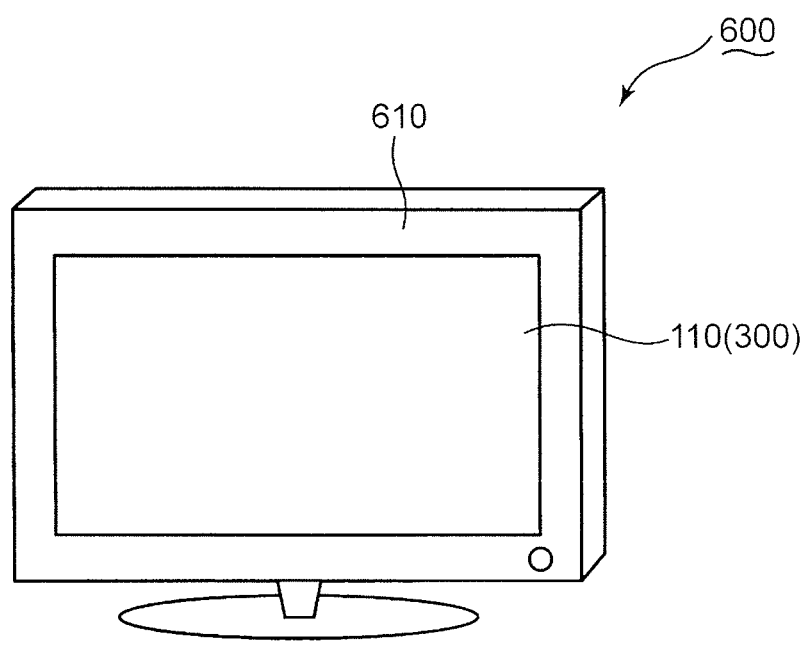
FIG. 38 is a schematic perspective view of a display device manufactured in accordance with the manufacturing method shown in FIG. 27.

FIG. 38 is a schematic perspective view of a display device 600. The display device 600 is described with reference to FIGS. 27 to 31 and 38.

The display device 600 is provided with a housing 610, in addition to the assembly 500 described with reference to FIGS. 28 to 30. After completion of the aging step described with reference to FIG. 27, the assembly 500 is fixed in the housing 610 to complete fabrication of the display device 600. The luminescent area 110A is exposed from the housing 610.

FIG. 31 shows an emission pixel 111H used for displaying images in the high temperature region and an emission pixel 111L used for displaying images in the low temperature region as the emission pixels 111. Luminance characteristics of the display device 600 are described by using the emission pixels 111H, 111L.

Figure 39A:
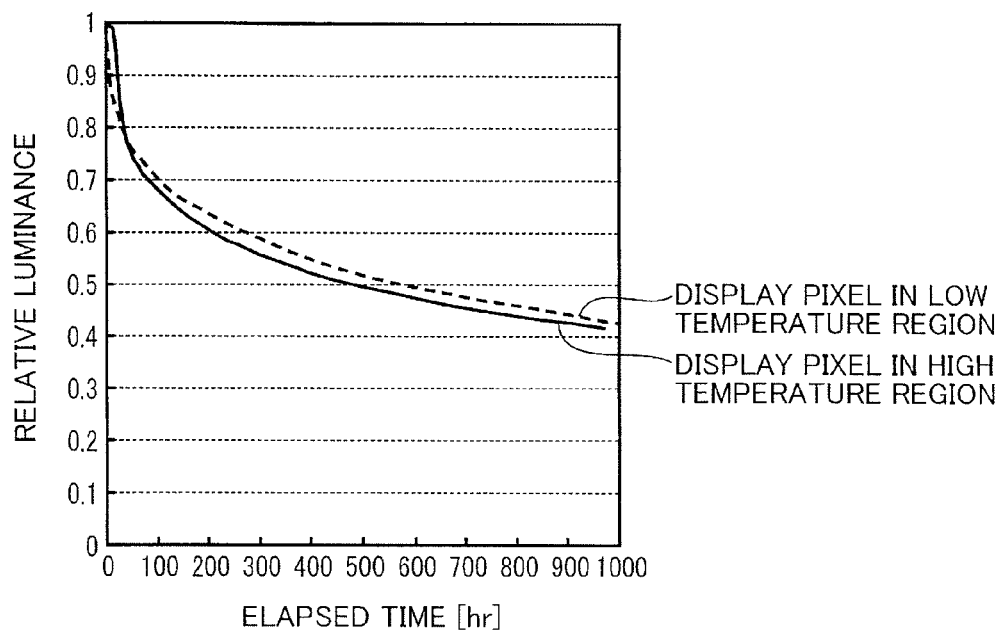
FIG. 39A is a graph schematically showing luminance characteristics of the display device depicted in FIG. 38.
Figure 39B:
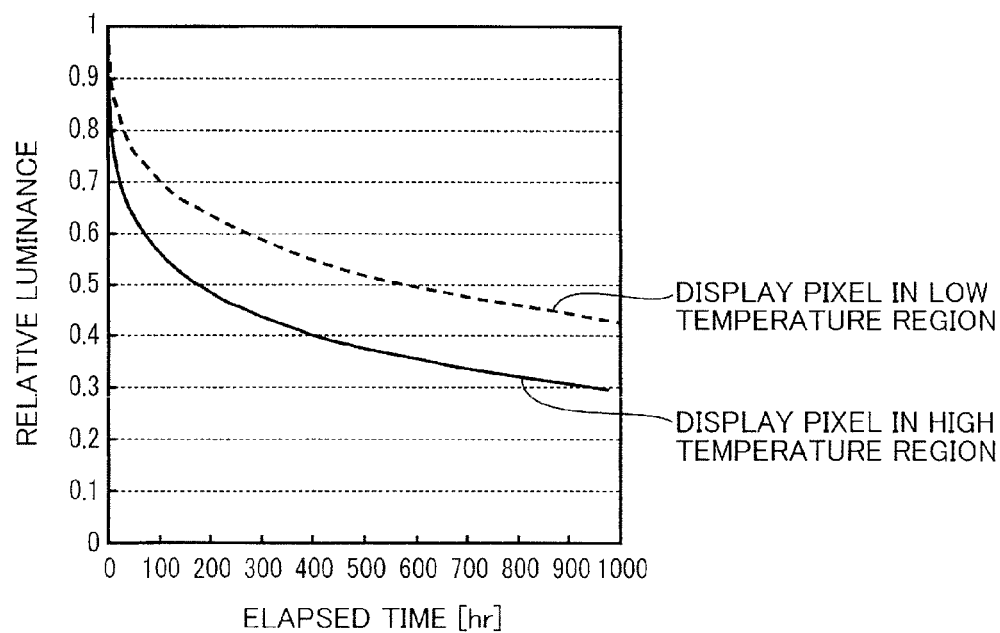
FIG. 39B is a graph schematically showing luminance characteristics of a display device without the aging process.

FIGS. 39A and 39B are graphs schematically showing luminance characteristics of the display device. The luminance characteristics of the display device are described with reference to FIGS. 27, 31, 39A and 39B.

FIG. 39A is a schematic graph showing luminance characteristics of a display device manufactured after the aging step described with reference to FIG. 27. FIG. 39B is a schematic graph showing luminance characteristics of a display device manufactured without the aging step. The horizontal axes in the graphs of FIGS. 39A and 39B indicate emission times of the emission pixels 111H, 111L, respectively. In the graphs of FIGS. 39A and 39B, light is emitted from each of the emission pixels 111H, 111L for 1,000 hours in total. The vertical axes in the graphs of FIGS. 39A and 39B indicate relative luminance of the emission pixels 111H, 111L, respectively, when a predetermined current is applied to each of the emission pixels 111H, 111L for a predetermined time.

The luminance of the emission pixels 111H, 111L goes down with time. Accordingly, the luminance of the emission pixels 111H, 111L, and their relative luminance are expressed as a function of time. In the following formulas, "t" indicates a certain point of time. BH(t) indicates luminance of the emission pixel 111H at the point of time BL(t) indicates luminance of the emission pixel 111L at the point of time "t". RBH(t) indicates relative luminance of the emission pixel 111H at the point of time "t". RBL(t) indicates relative luminance of the emission pixel 111L at the point of time "t". BH(0) indicates luminance of the emission pixel 111H at a start time point of light emission. BL(0) indicates luminance of the emission pixel 111L at the start time point of light emission.

$$RBH(t)[\%] = \frac{BH(t)}{BH(0)} \times 100[\%] \qquad \text{[Formula 7]}$$

$$RBL(t)[\%] = \frac{BL(t)}{BL(0)} \times 100[\%] \qquad \text{[Formula 8]}$$

To clarify the effects of the aging step, the aging step is not performed for the segment area including the emission pixel 111L. Accordingly, FIG. 39A shows the same curve in correspondence to the emission pixel 111L (an emission pixel in the low temperature region) as FIG. 39B does.

Comparison between the curves corresponding to the emission pixel 111H (an emission pixel in the high temperature region) in FIGS. 39A and 39B clearly shows that relative luminance RBH(t) greatly goes down during a period of time from the start time point of light emission until 100 hours passes without the aging step. On the other hand, with the aging step, a decrease in relative luminance RBH(t) during a period of time from the start time point of light emission until 100 hours passes is moderated.

In the following formulas, BDH(t) indicates a drop rate of relative luminance for the emission pixel 111H whereas BDL(t) indicates a drop rate of relative luminance for the emission pixel 111L.

$$BDH(t)[\%] = \frac{BH(0) - BH(t)}{BH(0)} \times 100[\%] \qquad \text{[Formula 9]}$$

$$BDL(t)[\%] = \frac{BL(0) - BL(t)}{BL(0)} \times 100[\%] \qquad \text{[Formula 10]}$$

A difference in the drop rate of relative luminance between the emission pixels 111H, 111L shown in FIG. 39A is less than "2%". If a difference between the drop rates of relative luminance of emission pixels in the high and low temperature regions is not larger than "10%", image degrade resulting from a luminance variation with time in the luminescent area 110A (a luminance variation among the regions defined by a temperature distribution in the luminescent area 110A) is less likely to be observed.

The various techniques described in the context of the aforementioned embodiments mainly include the following features.

A method for manufacturing a luminescent panel according to one aspect of the aforementioned embodiments may be used for manufacturing a luminescent panel including a luminescent area provided with emission pixels arranged in the row and column directions. The method for manufacturing a luminescent panel includes a first step of dividing the luminescent area into segment areas so that each of the segment areas includes at least one of the emission pixels; a second step of selecting a part of the segment areas as a first area, and the segment areas adjacent to the first area in the row and column directions as second areas: and a third step of aging the emission pixel in the first area by energization to generate an aging area.

According to the aforementioned configuration, the first area is heated during an aging process. The first area is adjacent to the second areas in the row and column directions. Therefore, a temperature rise is suppressed so that the emission elements are less likely to degrade. A temperature variation may be suppressed in the plane of the luminescent panel. Accordingly, luminescent variation is less likely to happen to the resultant luminescent panel. Therefore, the luminescent panel may maintain uniform image quality for a long period of time, which results in enhanced reliability.

In the aforementioned configuration, no less than two of the segment areas may be selected as the first areas in the second step.

According to the aforementioned configuration, no less than two of the first areas are aged concurrently. Therefore, the aging process becomes efficient.

In the aforementioned configuration, no less than two of the second areas may be selected per the first area in the second step.

According to the aforementioned configuration, the first area is adjacent to no less than two of the second areas in the row and column directions. Therefore, a temperature rise is suppressed so that the emission elements are less likely to degrade.

In the aforementioned configuration, the emission pixels in the luminescent area may be arranged in a matrix pattern constituted of M rows and N columns (where M, N is a positive integer of 2 or larger). The segment areas obtained in the first step may be geometrically equivalent to each other. The emission pixels in the segment areas may be arranged in m rows and in n columns (where m is a divisor of M, n is a divisor of N).

According to the aforementioned configuration, the segment areas are geometrically equivalent to each other, so that the segment areas include the same number of the emission pixels. Accordingly, all the segment areas are evenly aged under a predetermined aging condition. Therefore, there is a decreased variation in life time among the emission elements.

In the aforementioned configuration, in the first step, m and n may be set such that M/m=N/n.

According to the aforementioned configuration, M/m=N/n. Accordingly, the segment area has a similar shape to the luminescent area. The segment areas in the row direction are as many as the segment areas in the column direction. Accordingly, it is easy to create an emission pattern in the aging process under a given rule. Therefore, the aging process becomes efficient. It is easy to predict a tendency of a temperature variation in the segment areas on the basis of a temperature variation result under light emission over the entire surface of the luminescent area. Therefore, an efficient aging pattern may be created.

In the aforementioned configuration, in the first step, m and n may be set such that m=M/10 and n=N/10.

According to the aforementioned configuration, the segment area has a similar shape to the luminescent area. Since m=M/10 and n=N/10, an area size of each segment area is equal to one-hundredth of the area size of the luminescent area. Therefore, both of a temperature rise range and a temperature distribution range of each segment area are narrowed during the aging process. Accordingly, there is a decreased variation in life time among the emission elements.

In the aforementioned configuration, in the first step, m and n may be such that: m=n=1.

According to the aforementioned configuration, each segment area includes one emission pixel. A temperature rise of an emission element is very small. Accordingly, both of a temperature rise range and a temperature distribution range of each segment area are narrowed during the aging process. Therefore, there is a decreased variation in life time among the emission elements.

In the aforementioned configuration, in the second step, the first area may be selected to align in a diagonal direction in the luminescent area.

According to the aforementioned configuration, it is easy to distinguish a segment area subjected to the aging process from a segment area which is not subjected to the aging process. Therefore, it becomes easy to monitor progress of the aging process.

In the aforementioned configuration, in the second step, the first area may be selected to align in the row and column directions at intervals. The second areas may be selected to surround the first area.

According to the aforementioned configuration, it is easy to distinguish a segment area subjected to the aging process from a segment area which is not subjected to the aging process. Therefore, it becomes easy to monitor progress of the aging process.

In the aforementioned configuration, the first area may be selected to align at regular intervals.

According to the aforementioned configuration, it is easy to distinguish a segment area subjected to the aging process from a segment area which is not subjected to the aging process. Therefore, it becomes easy to monitor progress of the aging process.

In the aforementioned configuration, in the second step, the first area may be selected at random.

According to the aforementioned configuration, it may be simplified to design an aging pattern.

In the aforementioned configuration, a circuit board for causing light emission from the luminescent panel may be connected to the luminescent panel. In the third step, the emission pixel may be energized via the circuit board.

According to the aforementioned configuration, the circuit board may have an image output function and an aging function. Since it is not necessary to prepare a circuit board having an image output function separately, a manufacturing process becomes simplified.

In the aforementioned configuration, the method for manufacturing a luminescent panel may further include a fourth step of selecting at least a part of the segment areas other than the aging area as the first area, and the segment areas adjacent to the first area in the row and column directions as the second areas; and a fifth step of aging the emission pixel included in the first area by energization to generate another aging area.

According to the aforementioned configuration, all the segment areas included in the luminescent area are aged.

An aging device according to another aspect of the aforementioned embodiments may be used for aging a luminescent panel including a luminescent area provided with emission pixels arranged in the row and column directions. The aging device includes a storage portion which stores emission pattern data including segmentation data for dividing the luminescent area into segment areas and area designation data for designating a part of the segment areas as a first area, and the segment areas adjacent to the first area in the row and column directions as second areas; and a signal generator which generates a control signal for the emission pixels based on the emission pattern data.

According to the aforementioned configuration, the first area is heated during the aging process. The first area is adjacent to the second areas in the row and column directions. Therefore, a temperature rise is suppressed in the plane of the luminescent panel so that the emission elements are less likely to degrade. There may be a decreased temperature variation in the plane of the luminescent panel. Accordingly, a luminescent variation is less likely to happen to the resultant luminescent panel. Consequently, the luminescent panel may maintain uniform image quality for a long period of time, which results in enhanced reliability.

A display device according to yet another aspect of the aforementioned embodiments is provided with a luminescent panel obtained by the method for manufacturing a luminescent panel according to the aforementioned configuration. The display device includes an emission element; a power supply which supplies electric power to the emission element; a pixel circuit provided on a power supply path between the emission element and the power supply for flowing current to the emission element in response to a received luminance signal; and a controller which outputs the luminance signal to the pixel circuit to selectively operate the emission element in an aging mode for aging the emission element or in an image display mode for displaying an image with use of the emission element. A power supply voltage to be output from the power supply is identical between the aging mode and the image display mode. The controller sets luminance of the emission element indicated by the luminance signal in the aging mode so that the luminance of the emission element in the aging mode is larger than a maximum luminance in the image display mode.

According to the aforementioned configuration, the luminance of the emission element in the aging mode is large. The maximum luminance of the emission element is very reduced. Accordingly, the aging time is shortened. The controller executes a control so that the luminance of the emission element in the aging mode is larger than the maximum luminance in the image display mode. Consequently, the maximum luminance of the emission element is very reduced as compared with a case of luminance of the emission element under the aging mode in a range of the image display mode. Accordingly, an aging time is shortened. Since the controller controls the luminance of the emission element in the aging mode and the image display mode, it is not necessary to prepare an external aging device. Since the power supply voltage to be output from the power supply is consistent between the aging mode and the image display mode, it is not necessary to apply a power supply voltage from an external aging device in the aging mode. In the manufacturing process of the display device, it is not necessary to secure a time for preparing an external aging device. Therefore, the aging time is shortened to enhance the throughput.

In the aforementioned configuration, the display device may further include a converter provided on a signal transmission path for transmitting the luminance signal from the controller to the pixel circuit so as to convert a digital signal into an analog signal. The controller may change the bit number of the digital signal to be processed by the converter in each of the aging mode and the image display mode so that the bit number of the digital signal to be processed in the aging mode is larger than the bit number of the digital signal to be processed in the image display mode.

In the aforementioned configuration, the controller may determine whether the display device is in the aging mode or the image display mode by an operation signal based on an operator's operation. The controller may change the bit number of the digital signal to be processed by the converter in each of the aging mode and the image display mode, based on the determination.
(Rider)

The various techniques described in the context of the aforementioned embodiments may include the following features.
(Rider 1)

A method for manufacturing a display device for displaying an image, including:

a first step of preparing a luminescent panel including emission pixels which define a luminescent area for displaying the image;

a second step of dividing the luminescent area into segment areas;

a third step of setting an aging condition for each of the segment areas in correspondence to a temperature distribution in the luminescent area resulting from heat generated in driving the luminescent panel for displaying the image; and a fourth step of aging the emission pixels for each of the segment areas in the aging condition.

According to the aforementioned configuration, a luminescent panel including emission pixels, which define a luminescent area for displaying an image, is prepared in the first step. In the second step, the luminescent area is divided into segment areas. In the third step, an aging condition is set for each of the segment areas. In the fourth step, the emission pixels are aged segment area by segment area. The aging condition for each of the segment areas is adjusted in accordance with a temperature distribution in the luminescent area resulting from heat generated in driving the luminescent panel for displaying the image. Accordingly, the display device may maintain uniform luminance characteristics for a long period of time.
(Rider 2)

The method for manufacturing a display device according to Rider 1, wherein in the second step, the luminescent area is divided into the segment areas based on a temperature band of the temperature distribution.

According to the aforementioned configuration, in the second step, the luminescent area is divided into the segment areas, based on the temperature band of the temperature distribution. The aging condition may be appropriately set in accordance with the temperature distribution in the luminescent area.
(Rider 3)

The method for manufacturing a display device according to Rider 1 or 2, further including:

a step of acquiring distribution data about the temperature distribution from another luminescent panel manufactured in a common manufacturing condition with the luminescent panel, wherein the aging condition is set based on the distribution data.

According to the aforementioned configuration, the aging condition is set based on the distribution data. Accordingly, the segment areas are set without measurement for a temperature distribution of the luminescent panel to be subjected to an aging process.
(Rider 4)

The method for manufacturing a display device according to Rider 3, wherein the distribution data is average data of temperature distributions obtained from luminescent panels manufactured in the common manufacturing condition with the luminescent panel.

According to the aforementioned configuration, the distribution data is the average data of temperature distributions obtained from luminescent panels manufactured in the common manufacturing condition with the luminescent panel. Accordingly, luminescent area is appropriately divided.
(Rider 5)

The method for manufacturing a display device according to any one of Riders 1 to 4, wherein the aging condition is set so that post-processing luminance from the emission panel after the fourth step is lower than pre-processing luminance from the emission panel which is prepared in the first step under a luminance signal indicating a predetermined luminance.

According to the aforementioned configuration, the aging condition is set so that post-processing luminance from the emission panel after the fourth step is lower than pre-processing luminance from the emission panel which is prepared in the first step under a luminance signal indicating a predetermined luminance. Accordingly, the display device may maintain uniform luminance characteristics for a long period of time.
(Rider 6)

The method for manufacturing a display device according to Rider 5, wherein the segment areas include a first segment area, in which there is a temperature rise of 10° C. or more due to the heat, and the aging condition is set to decrease the post-processing luminance of the first segment area by 5% or more from the pre-processing luminance of the first segment area.

According to the aforementioned configuration, since the aging condition is set to decrease the post-processing luminance of the first segment area by 5% or more from the pre-processing luminance of the first segment area, a drastic decline in luminance is less likely to happen during light emission after the fourth step.

(Rider 7)

The method for manufacturing a display device according to Rider 6, wherein the segment areas include a second segment area, in which there is a temperature rise of 25° C. or more due to the heat, and the aging condition is set to lower the post-processing luminance of the second segment area by 14% or more from the pre-processing luminance of the second segment area.

According to the aforementioned configuration, since the aging condition is set to decrease the post-processing luminance of the second segment area by 14% or more from the pre-processing luminance of the second segment area, a drastic decline in luminance is less likely to happen during light emission after the fourth step.

(Rider 8)

The method for manufacturing a display device according to Rider 7, wherein the segment areas include a third segment area, in which there is a temperature rise of 50° C. or more due to the heat, and the aging condition is set to decrease the post-processing luminance of the third segment area by 32% or more from the pre-processing luminance of the third segment area.

According to the aforementioned configuration, since the aging condition is set to decrease the post-processing luminance of the second segment area by 32% or more from the pre-processing luminance of the second segment area, a drastic decline in luminance is less likely to happen during light emission after the fourth step.

(Rider 9)

The method for manufacturing a display device according to any one of Riders 1 to 8, wherein in the first step, a driver for driving the emission pixel is mounted on the luminescent panel, and the driver applies a signal current for driving the emission pixel, based on the aging condition after the fourth step.

According to the aforementioned configuration, since the driver applies a signal current for driving the emission pixel on the basis of the aging condition after the fourth step, the display device may appropriately display images.

(Rider 10)

The method for manufacturing a display device according to Rider 8, wherein in the fourth step, the emission pixel is subjected to at least one aging process selected from an emission process of causing light emission from the emission pixel, a heating process of heating the emission pixel, and a driving process of driving the emission pixel with a predetermined frequency.

According to the aforementioned configuration, since the emission pixel is subjected in the fourth step to at least one aging process selected from the emission process of causing light emission from the emission pixel, the heating process of heating the emission pixel, and the driving process of driving the emission pixel with a predetermined frequency, a drastic decline in luminance is less likely to happen during light emission after the fourth step.

(Rider 11)

The method for manufacturing a display device according to Rider 8, wherein in the fourth step, the emission pixel in the second segment area is subjected to the at least one aging process for a period of time longer than a period of time for the emission pixel in the first segment area, and the emission pixel in the third segment area is subjected to the at least one aging process for a period of time longer than the period of time for the emission pixel in the second segment area.

According to the aforementioned configuration, the first to third segment areas may maintain uniform luminance characteristics for a long period of time.

(Rider 12)

The method for manufacturing a display device according to Rider 8, wherein in the fourth step, the emission pixel in the second segment area emits light at higher luminance in the second segment area than the first segment area, and the emission pixel emits light at higher luminance in the third segment area than the second segment area.

According to the aforementioned configuration, the first to third segment areas may maintain uniform luminance characteristics for a long period of time.

(Rider 13)

The method for manufacturing a display device according to Rider 8, wherein in the fourth step, the emission pixel is exposed to a higher temperature condition in the second segment area than the first segment area, and the emission pixel is exposed to a higher temperature condition in the third segment area than the second segment area.

According to the aforementioned configuration, the first to third segment areas may maintain uniform luminance characteristics for a long period of time.

(Rider 14)

The method for manufacturing a display device according to Rider 8, wherein in the fourth step, the emission pixel is driven at a higher frequency in the second segment area than the first segment area, and the emission pixel is driven at a higher frequency in the third segment area than the second segment area.

According to the aforementioned configuration, the first to third segment areas may maintain uniform luminance characteristics for a long period of time.

(Rider 15)

A display device provided with a luminescent panel including emission pixels which define a luminescent area for displaying an image, wherein the luminescent area includes:

a first area, and a second area heated to a temperature higher than a temperature of the first area while the luminescent panel is driven for displaying the image, the emission pixels include a first emission pixel configured to display the image in the first area, and a second emission pixel configured to display the image in the second area, and a difference between a drop rate of luminance in the first emission pixel when a predetermined current is applied to all the emission pixels for a predetermined period of time and a drop rate of luminance in the second emission pixel when the predetermined current is applied to all the emission pixels for the predetermined period of time is not larger than 10%.

According to the aforementioned configuration, since a difference is set between the drop rate of the luminance in the first emission pixel when a predetermined current is applied to all the emission pixels for a predetermined period of time and the drop rate of the luminance in the second emission pixel when the predetermined current is applied to all the emission pixels for the predetermined period of time to be not larger than 10%, the display device may display images with uniform luminance characteristics.

Industrial Applicability

The principle of the aforementioned embodiments is appropriately applied to a device for displaying images.

The invention claimed is:

1. A method for manufacturing a luminescent panel including a luminescent area provided with emission pixels arranged in a row direction and in a column direction, the method comprising:
    dividing the luminescent area into segment areas so that each of the segment areas includes at least one emission pixel;
    selecting a plurality of first areas from among the segment areas and, for each of the first areas, a plurality of second areas from among the segment areas, the second areas for each one of the first areas being adjacent to the one of the first areas in the row and column directions; and
    concurrently aging the emission pixel in each of the first areas by energization to generate aging areas,
    wherein each of the first areas is not adjacent another one of the first areas and is adjacent the second areas.

2. The method according to claim 1, wherein each of the first areas is aligned in a diagonal direction with at least another one of the first areas.

3. The method according to claim 1, wherein no less than two of the second areas are selected per each of the first areas.

4. The method according to claim 1, wherein the emission pixels in the luminescent area are arranged in a matrix pattern constituted of M rows and N columns, with M and N being positive integers of at least 2,
    the segment areas into which the luminescent area is divided are geometrically equivalent to each other, and
    the emission pixels in the segment areas are arranged in m rows and in n columns, with m being a divisor of M and n being a divisor of N.

5. The method according to claim 4, wherein m and n are set such that M/m=N/n.

6. The method according to claim 5, wherein m and n are set such that m=M/10 and n=N/10.

7. The method according to claim 4, wherein m and n are set such that m=n=1.

8. The method according to claim 1, wherein the first areas are selected to align in a diagonal direction in the luminescent area.

9. The method according to claim 1, wherein the first areas are selected to align in the row and column directions at intervals, and the second areas are selected to surround the first areas.

10. The method according to claim 9, wherein the first areas are selected to align at regular intervals.

11. The method according to claim 1, wherein the first areas are selected at random.

12. The method according to claim 1, wherein a circuit board for causing light emission from the luminescent panel is connected to the luminescent panel, and
    the emission pixel in each of the first areas is energized via the circuit board.

13. The method according to claim 1, wherein the selecting and the aging include:
    selecting the first areas, and the second areas adjacent to each of the first areas in the row and column directions;
    concurrently aging the emission pixel included in the first areas by the energization to generate first aging areas;
    selecting a plurality of third areas from among the segment areas other than the first aging areas, and, for each of the third areas, a plurality of fourth areas from among the segment areas, the fourth areas for each one of the third areas being adjacent to the one of the third areas in the row and column directions; and
    concurrently aging the emission pixel included in each of the third areas by the energization to generate second aging areas.

14. A display device provided with a luminescent panel obtained by the method according to claim 1, comprising:
    an emission element;
    a power supply which supplies electric power to the emission element;
    a pixel circuit provided on a power supply path between the emission element and the power supply for flowing current to the emission element in response to a luminance signal; and
    a controller which outputs the luminance signal to the pixel circuit to selectively operate the emission element in an aging mode for aging the emission element or in an image display mode for displaying an image with use of the emission element, wherein
    a power supply voltage to be output from the power supply is identical between the aging mode and the image display mode, and
    the controller sets luminance of the emission element indicated by the luminance signal in the aging mode so that the luminance of the emission element in the aging mode is larger than a maximum luminance in the image display mode.

15. The display device according to claim 14, further comprising:
    a converter provided on a signal transmission path for transmitting the luminance signal from the controller to the pixel circuit so as to convert a digital signal into an analog signal, wherein
    the controller changes a bit number of the digital signal to be processed by the converter in each of the aging mode and the image display mode so that the bit number of the digital signal to be processed in the aging mode is larger than a bit number of the digital signal to be processed in the image display mode.

16. The display device according to claim 15, wherein the controller determines whether the display device is in the aging mode or the image display mode by an operation signal based on an operation of an operator, and changes the bit number of the digital signal to be processed by the converter in each of the aging mode and the image display mode, based on the determination.

17. An aging device for a luminescent panel including a luminescent area provided with emission pixels arranged in a row direction and in a column direction, the aging device comprising:
    a memory which stores emission pattern data including segmentation data for dividing the luminescent area into segment areas and area designation data for designating a plurality of first areas from among the segment areas and, for each of the first areas, a plurality of second areas from among the segment areas, the second areas for each one of the first areas being adjacent to the one of the first areas in the row and column directions; and a signal generator which generates a control signal to concurrently cause light emission for the emission pixel in each of the first areas based on the emission pattern data, wherein the area designation data designates each of the first areas to not be adjacent another one of the first areas and to be adjacent the second areas.

18. A method for manufacturing a luminescent panel including a luminescent area provided with emission pixels arranged in a row direction and in a column direction, the luminescent panel including:

an emission element;

a power supply which supplies electric power to the emission element;

a pixel circuit provided on a power supply path between the emission element and the power supply for flowing current to the emission element in response to a luminance signal;

a controller which outputs the luminance signal to the pixel circuit to selectively operate the emission element in an aging mode for aging the emission element or in an image display mode for displaying an image with use of the emission element; and a converter provided on a signal transmission path for transmitting the luminance signal from the controller to the pixel circuit so as to convert a digital signal into an analog signal, wherein a power supply voltage to be output from the power supply is identical between the aging mode and the image display mode, the controller sets luminance of the emission element indicated by the luminance signal in the aging mode so that the luminance of the emission element in the aging mode is larger than a maximum luminance in the image display mode, the controller changes a bit number of the digital signal to be processed by the converter in each of the aging mode and the image display mode so that the bit number of the digital signal to be processed in the aging mode is larger than a bit number of the digital signal to be processed in the image display mode, and the method comprises:

dividing the luminescent area into segment areas so that each of the segment areas includes at least one of the emission pixels;

selecting a part of the segment areas as a first area and the segment areas adjacent to the first area in the row and column directions as second areas; and aging the emission pixel in the first area by energization to generate an aging area.

* * * * *